United States Patent
Yonehara et al.

(10) Patent No.: US 9,929,054 B2
(45) Date of Patent: Mar. 27, 2018

(54) SYSTEMS AND METHODS FOR LASER SPLITTING AND DEVICE LAYER TRANSFER

(71) Applicant: Solexel, Inc., Milpitas, CA (US)

(72) Inventors: Takao Yonehara, Sunnyvale, CA (US); Virendra V. Rana, Los Gatos, CA (US); Sean M. Seutter, San Jose, CA (US); Mehrdad M. Moslehi, Los Altos, CA (US); Subramanian Tamilmani, Fremont, CA (US)

(*) Notice: Subject to any disclaimer, the term of this patent is extended or adjusted under 35 U.S.C. 154(b) by 0 days.

(21) Appl. No.: 14/968,685

(22) Filed: Dec. 14, 2015

(65) Prior Publication Data
US 2016/0336233 A1  Nov. 17, 2016

Related U.S. Application Data

(63) Continuation of application No. 13/778,047, filed on Feb. 26, 2013, now Pat. No. 9,214,353.
(Continued)

(51) Int. Cl.
| H01L 21/762 | (2006.01) |
| H01L 21/78 | (2006.01) |
| H01L 21/268 | (2006.01) |
| H01L 21/304 | (2006.01) |
| H01L 31/18 | (2006.01) |
| B23K 26/00 | (2014.01) |
| B23K 26/08 | (2014.01) |
| H01L 31/0224 | (2006.01) |

(Continued)

(52) U.S. Cl.
CPC ...... *H01L 21/7813* (2013.01); *B23K 26/0006* (2013.01); *B23K 26/0054* (2013.01); *B23K 26/0057* (2013.01); *B23K 26/0093* (2013.01); *B23K 26/0622* (2015.10); *B23K 26/082* (2015.10); *B23K 26/0869* (2013.01); *B23K 26/244* (2015.10); *B23K 26/702* (2015.10); *B42D 25/00* (2014.10); *B81C 1/0038* (2013.01); *B81C 1/0088* (2013.01); *H01L 21/268* (2013.01); *H01L 21/304* (2013.01); *H01L 21/76254* (2013.01); *H01L 21/76259* (2013.01); *H01L 31/022441* (2013.01); *H01L 31/0682* (2013.01); *H01L 31/1892* (2013.01); *H01L 33/0079* (2013.01); *B23K 2201/40* (2013.01); *B23K 2203/52* (2015.10); *B81C 2201/0192* (2013.01); *B81C 2201/0194* (2013.01); *H01L 25/0657* (2013.01); *H01L 33/0095* (2013.01); *H01L 2224/32145* (2013.01); *H01L 2224/32245* (2013.01); *H01L 2224/48091* (2013.01); *H01L 2224/48145* (2013.01); *H01L 2224/48247* (2013.01); *H01L 2224/49107* (2013.01); *H01L 2224/73265* (2013.01); *H01L 2924/13091* (2013.01); *H01L 2924/1461* (2013.01); *Y02E 10/547* (2013.01)

(58) Field of Classification Search
None
See application file for complete search history.

(56) References Cited

U.S. PATENT DOCUMENTS

2004/0161695 A1* 8/2004 Boroson .............. H01L 51/50
430/200

* cited by examiner

*Primary Examiner* — Cheung Lee
(74) *Attorney, Agent, or Firm* — Howard IP Law Group PC

(57) ABSTRACT

Methods and systems are provided for the split and separation of a layer of desired thickness of crystalline semiconductor material containing optical, photovoltaic, electronic, micro-electro-mechanical system (MEMS), or optoelectronic devices, from a thicker donor wafer using laser irradiation.

15 Claims, 59 Drawing Sheets

Related U.S. Application Data

(60) Provisional application No. 61/603,370, filed on Feb. 26, 2012, provisional application No. 61/603,894, filed on Feb. 27, 2012, provisional application No. 61/609,347, filed on Mar. 11, 2012, provisional application No. 61/708,477, filed on Oct. 1, 2012.

(51) Int. Cl.
| | |
|---|---|
| *H01L 31/068* | (2012.01) |
| *B23K 26/70* | (2014.01) |
| *B23K 26/082* | (2014.01) |
| *B23K 26/0622* | (2014.01) |
| *B81C 1/00* | (2006.01) |
| *B42D 25/00* | (2014.01) |
| *B23K 26/244* | (2014.01) |
| *H01L 33/00* | (2010.01) |
| *B23K 101/40* | (2006.01) |
| *H01L 25/065* | (2006.01) |
| *B23K 103/00* | (2006.01) |

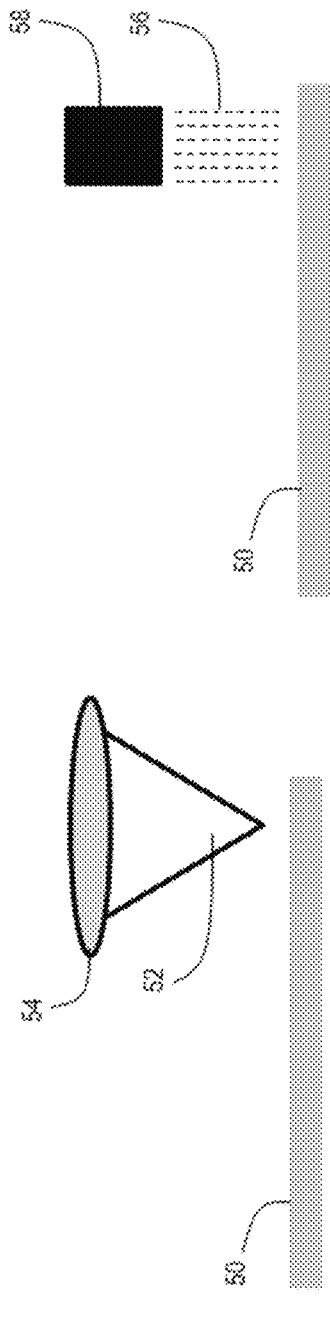
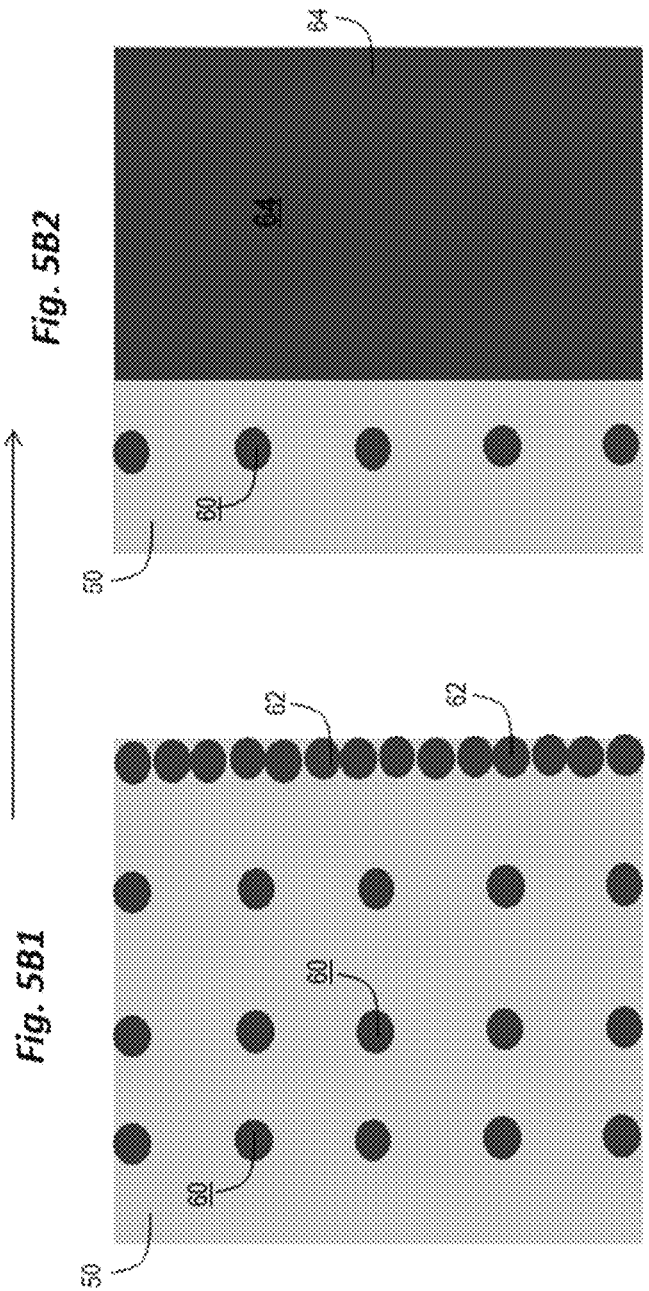

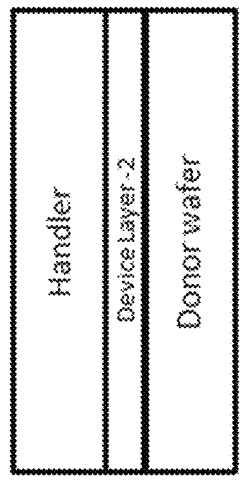
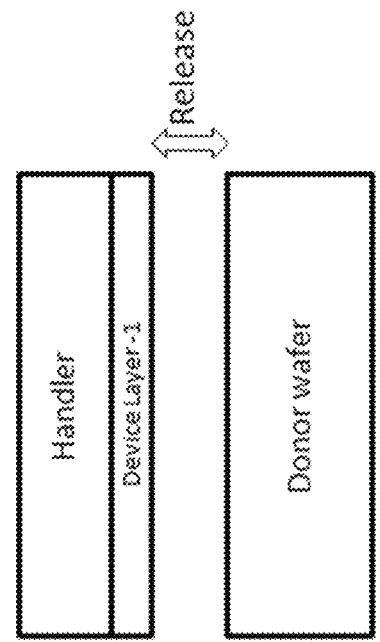
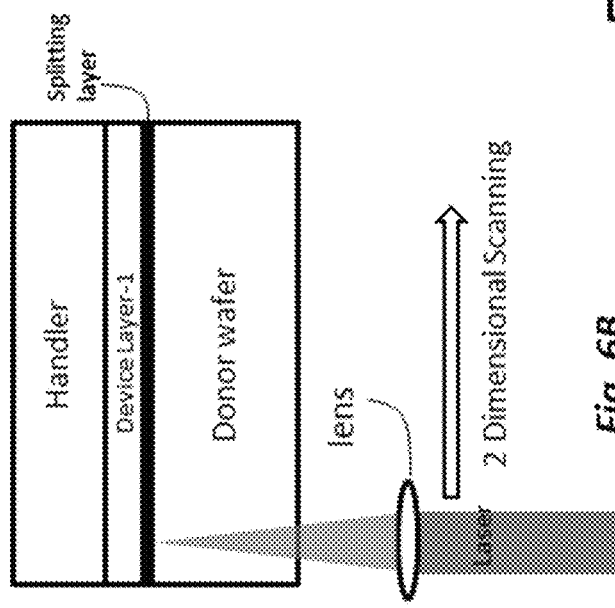

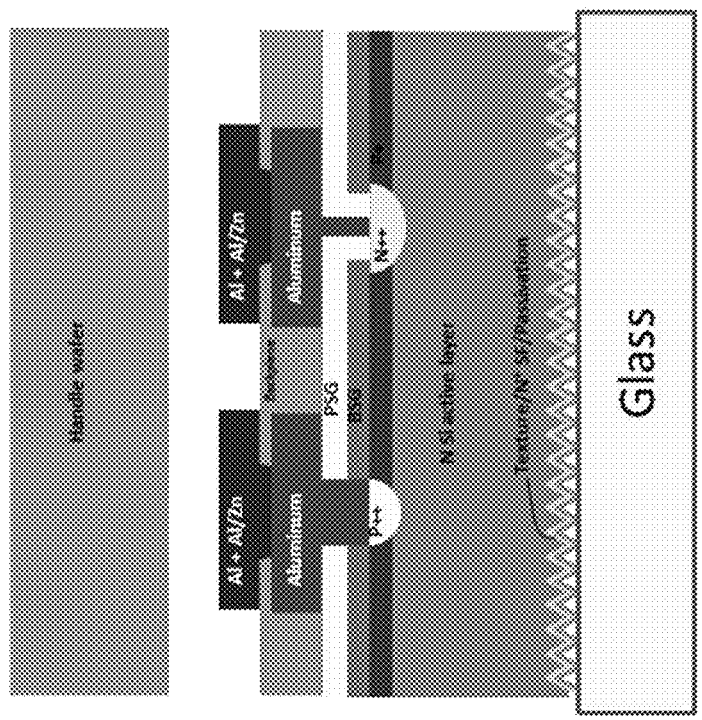
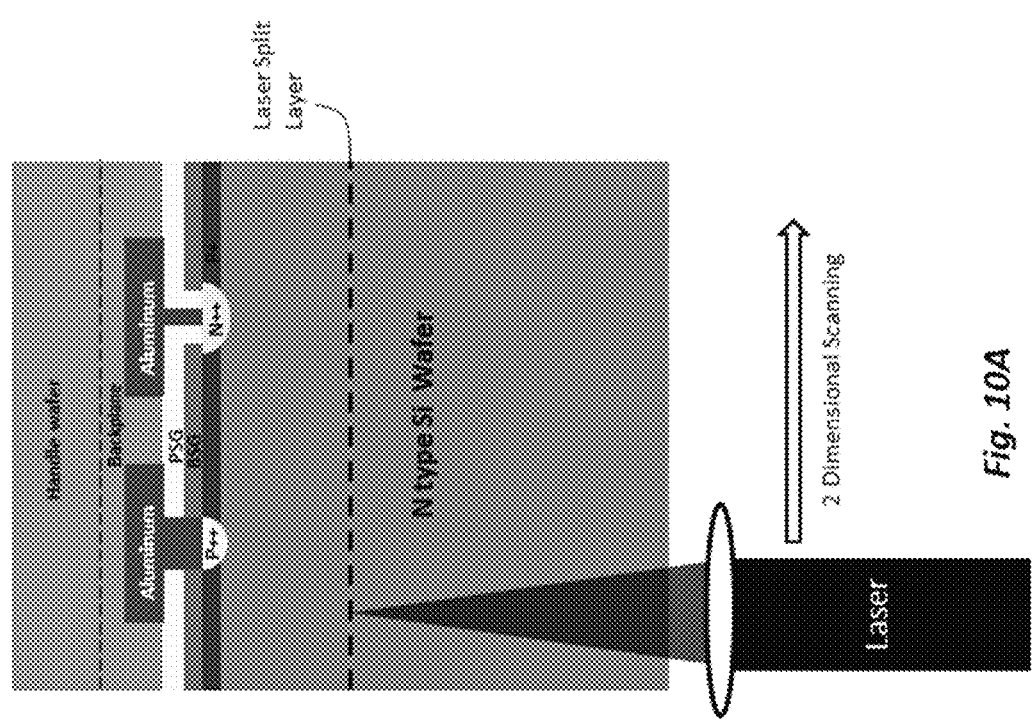
Fig. 10B
Fig. 10A

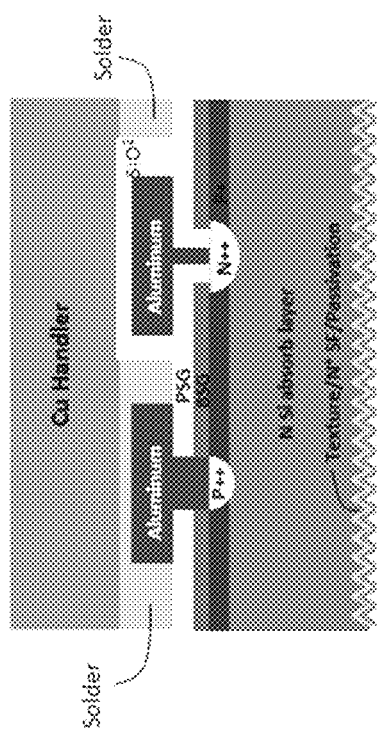
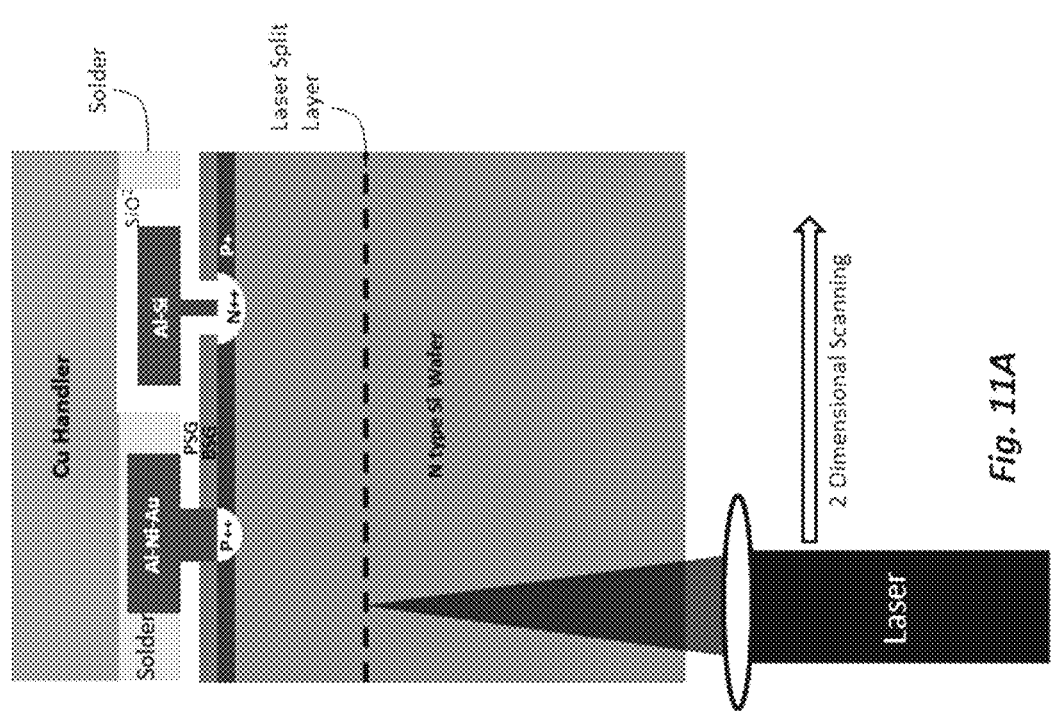
Fig. 11B
Fig. 11A

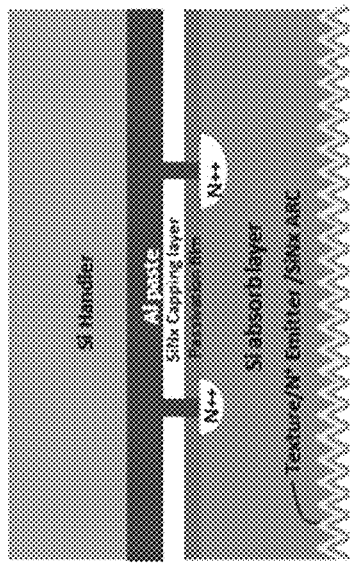
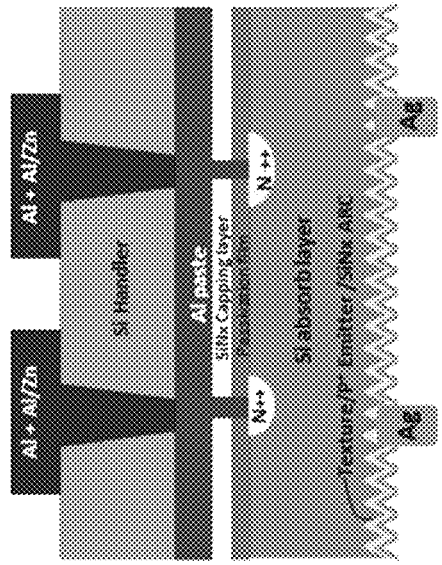
Fig. 12E
Fig. 12F
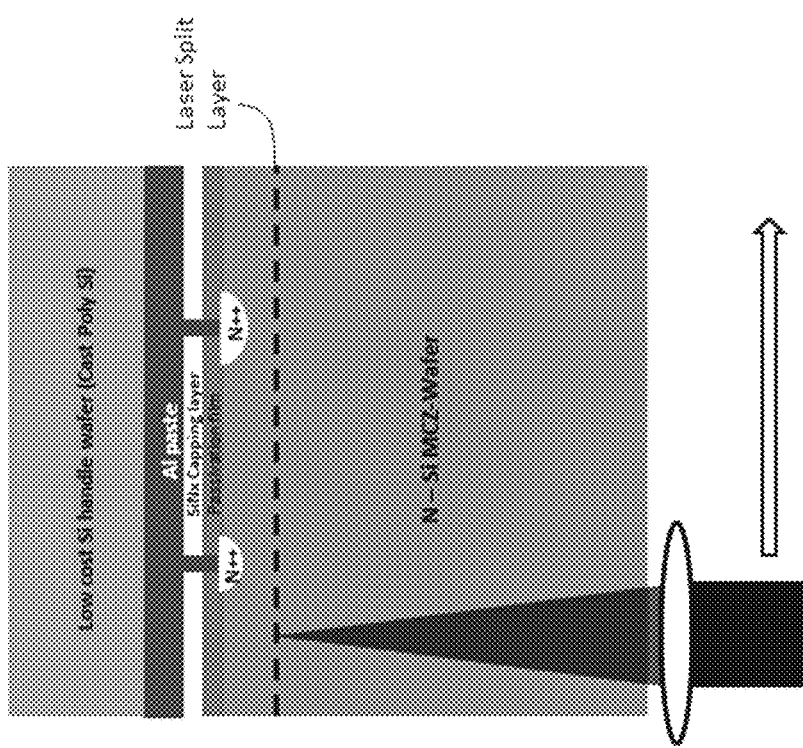
Fig. 12D

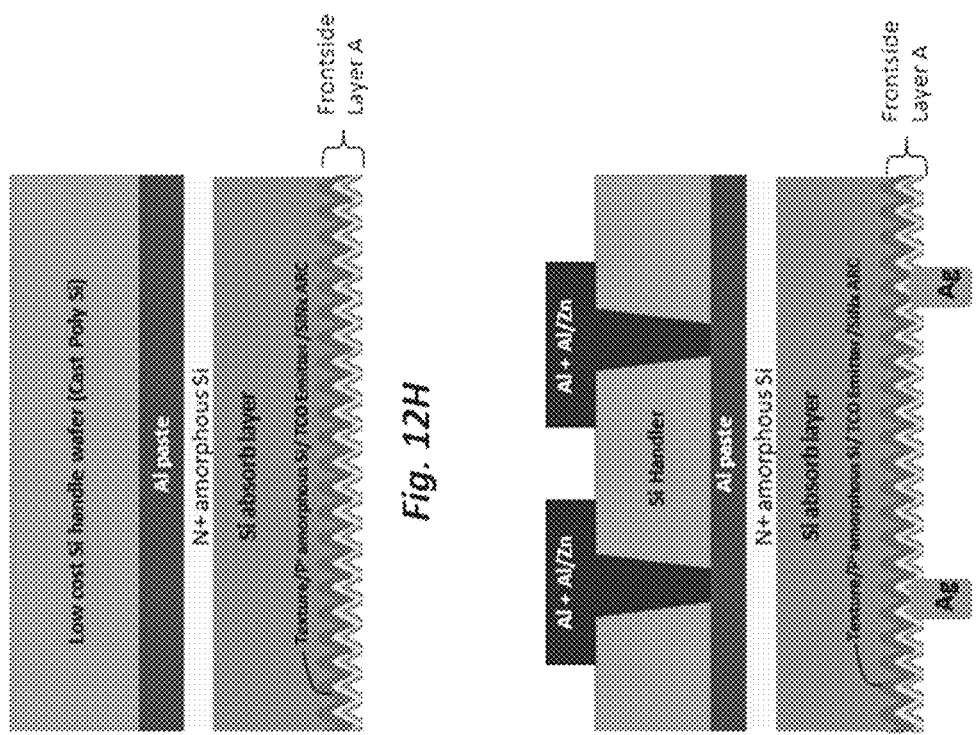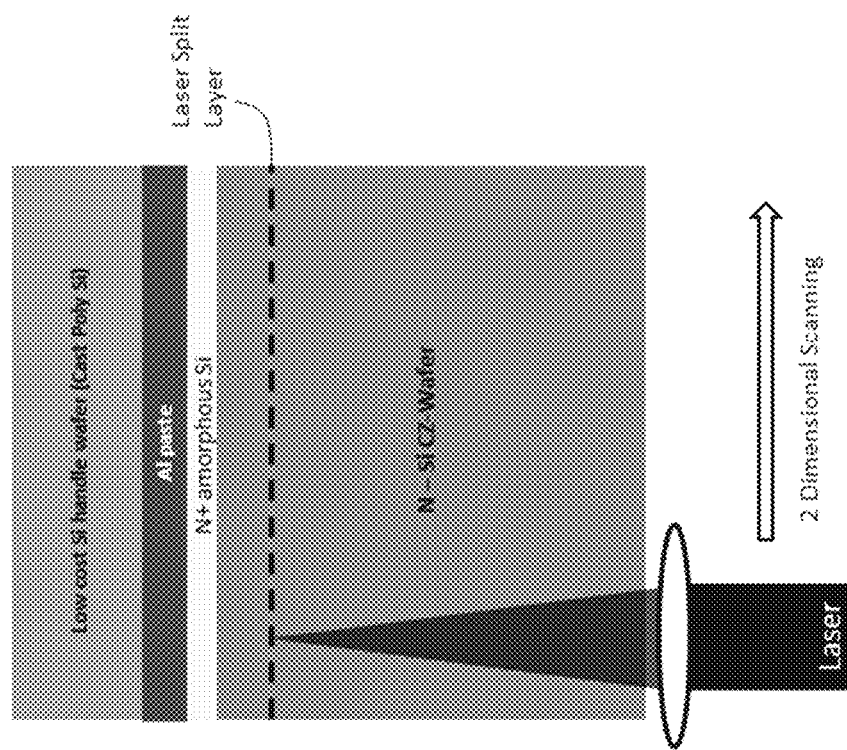

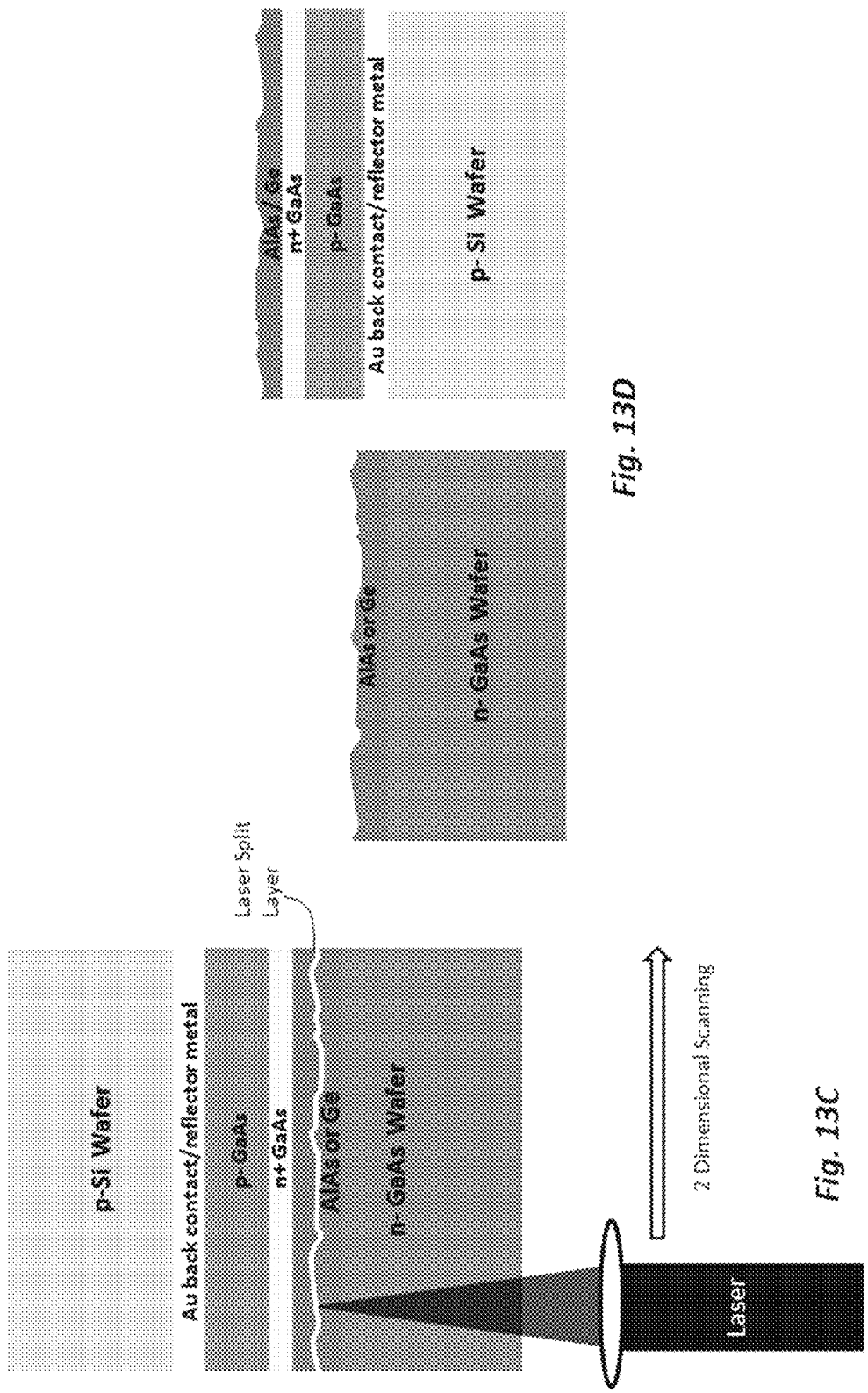

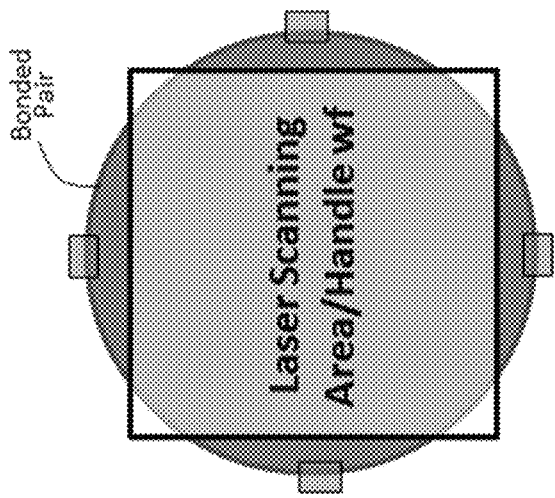
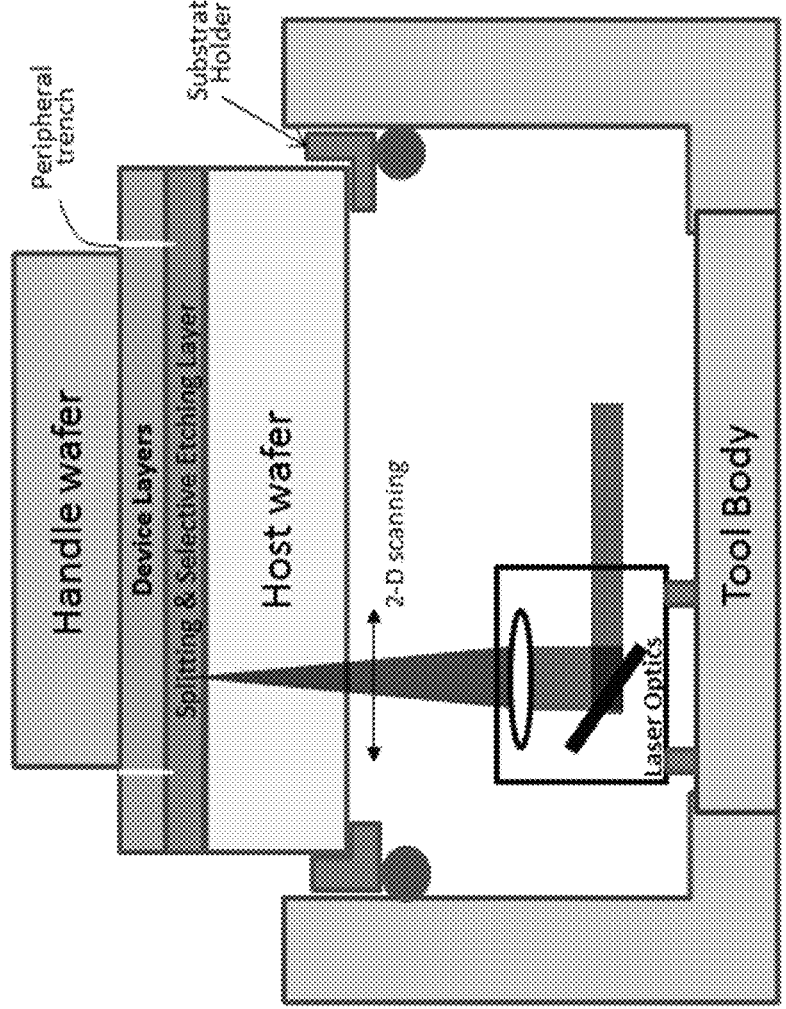
Fig. 17B
Fig. 17A

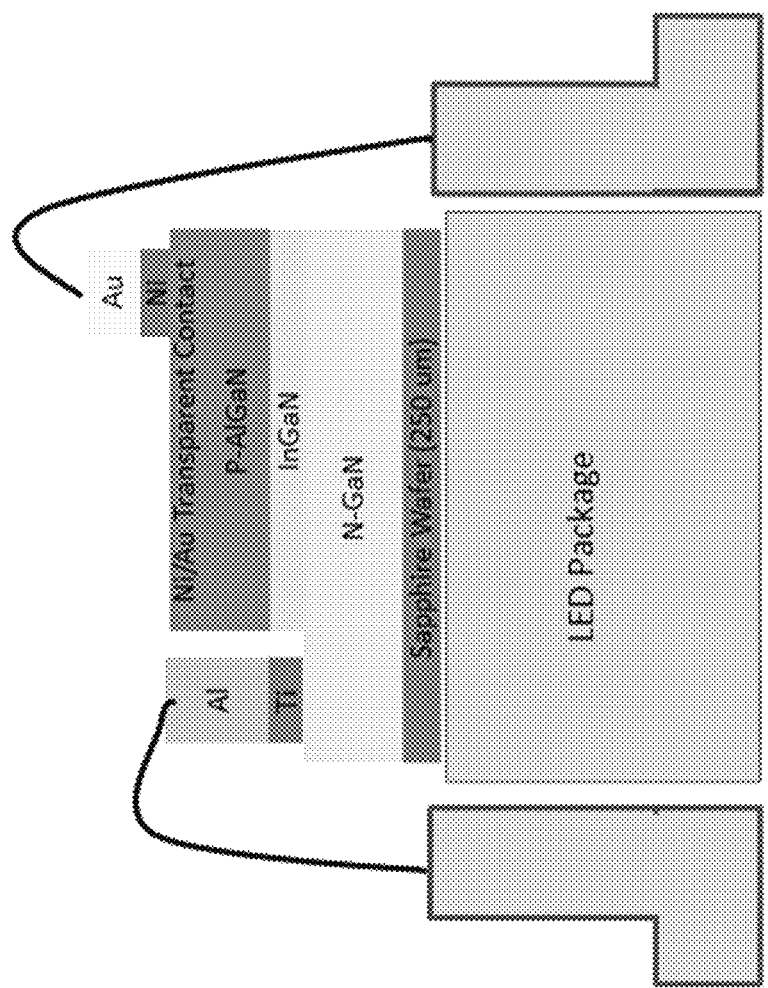
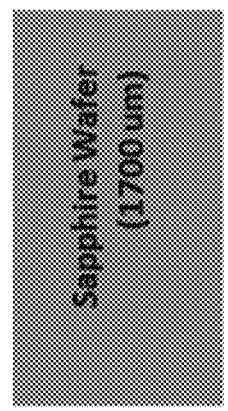
Fig. 28C
Fig. 28B

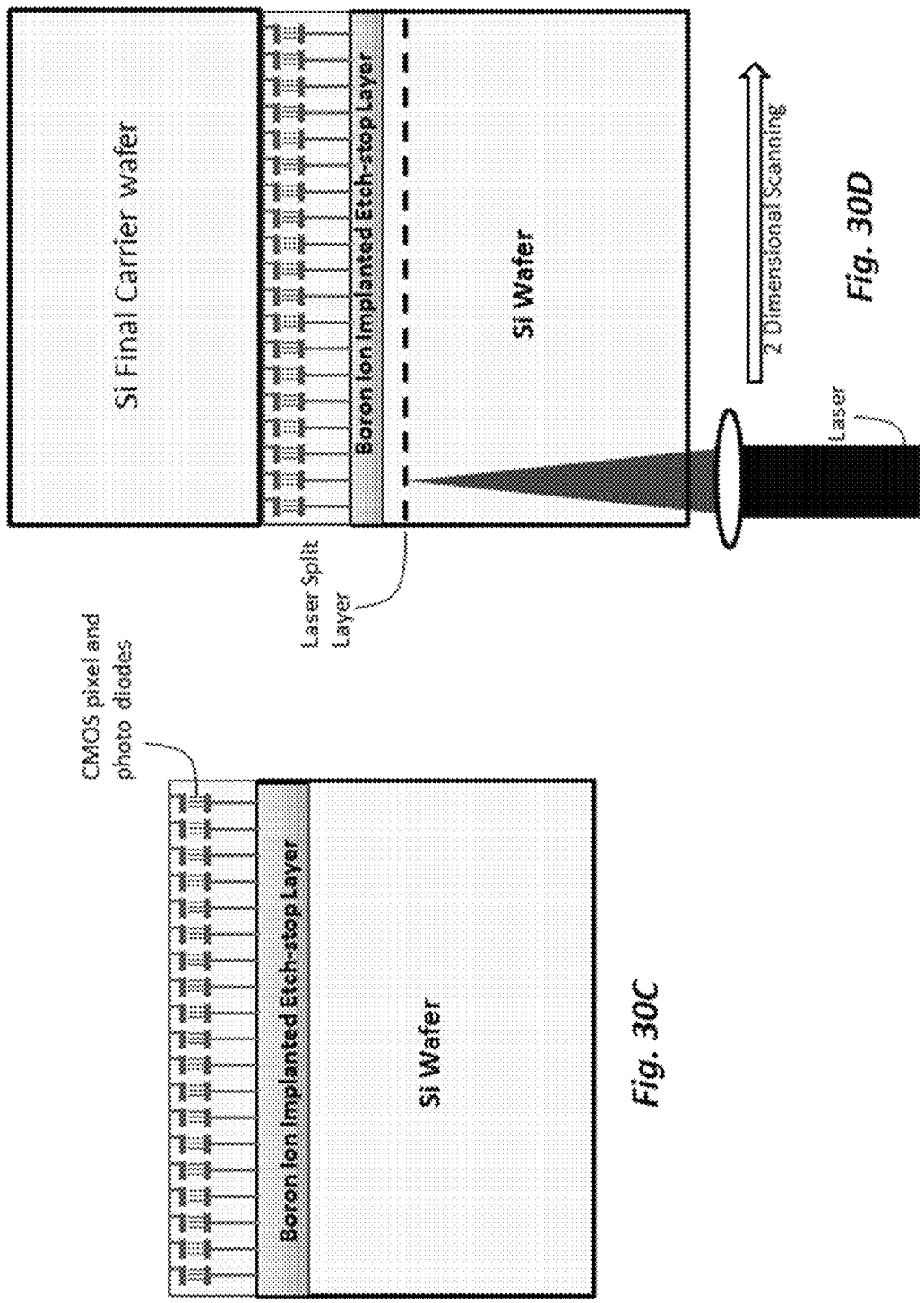

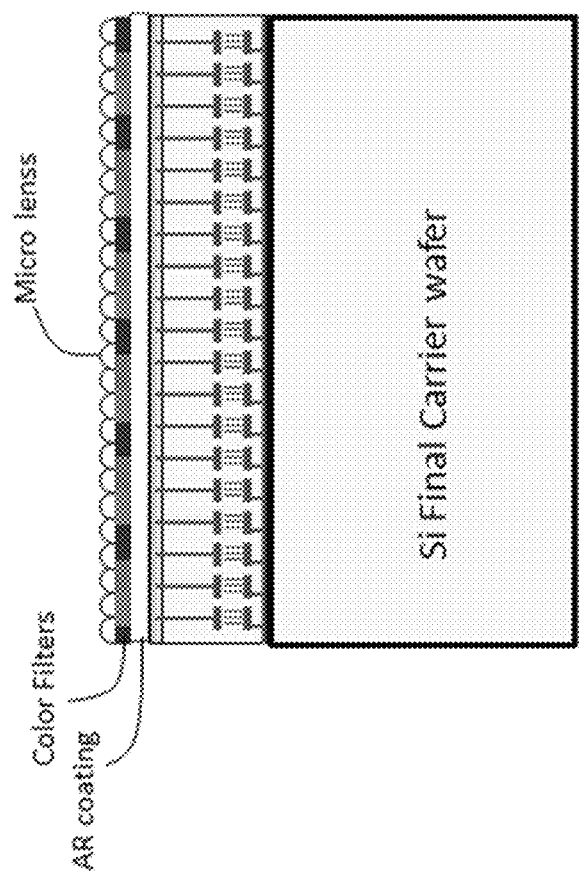

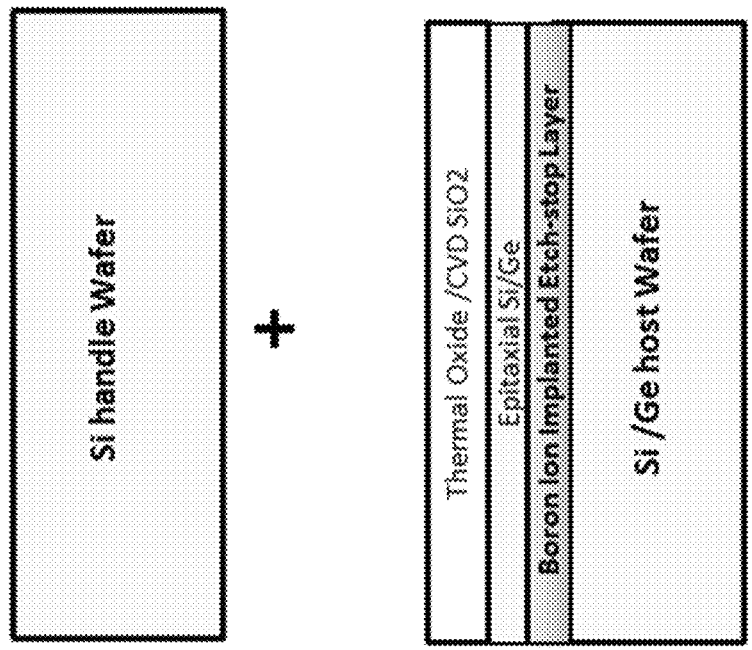
Fig. 31B1
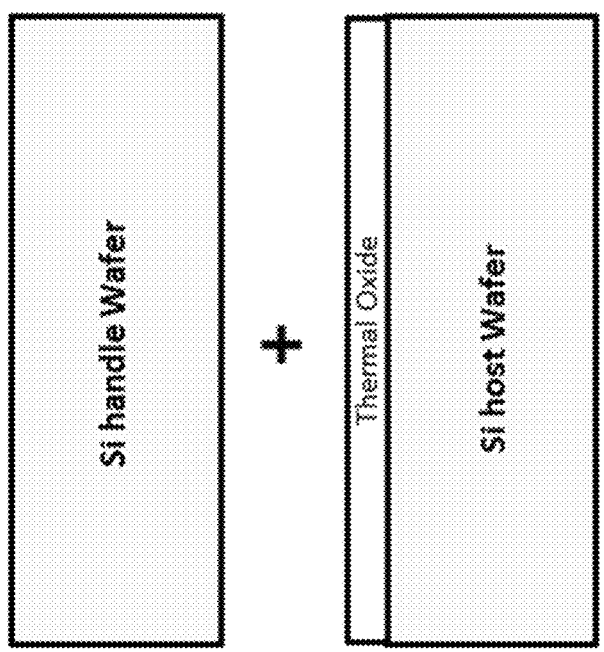
Fig. 31A1

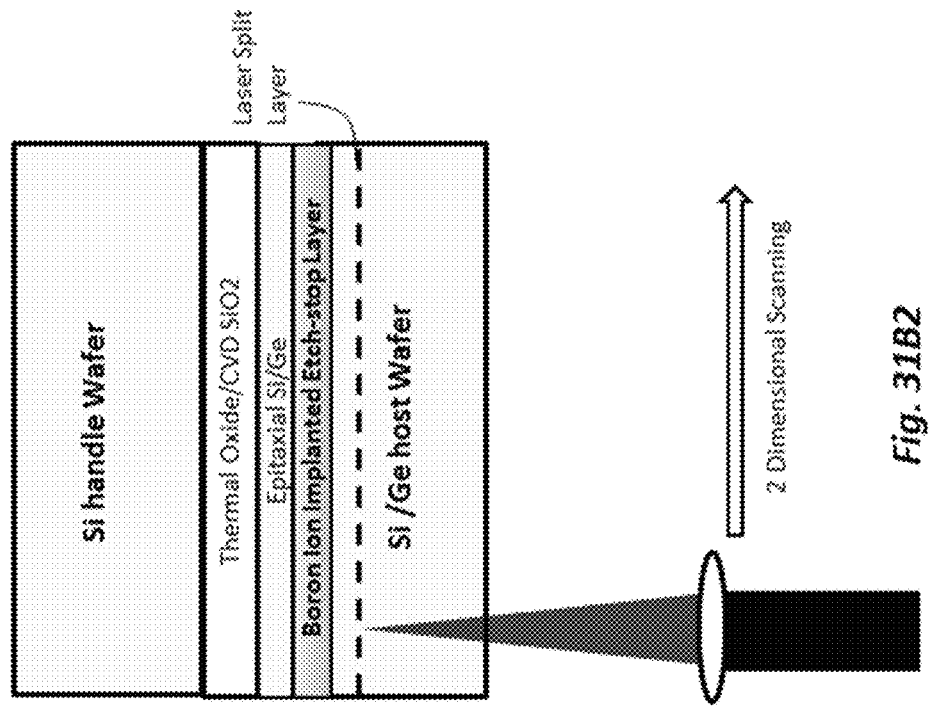
Fig. 31B2
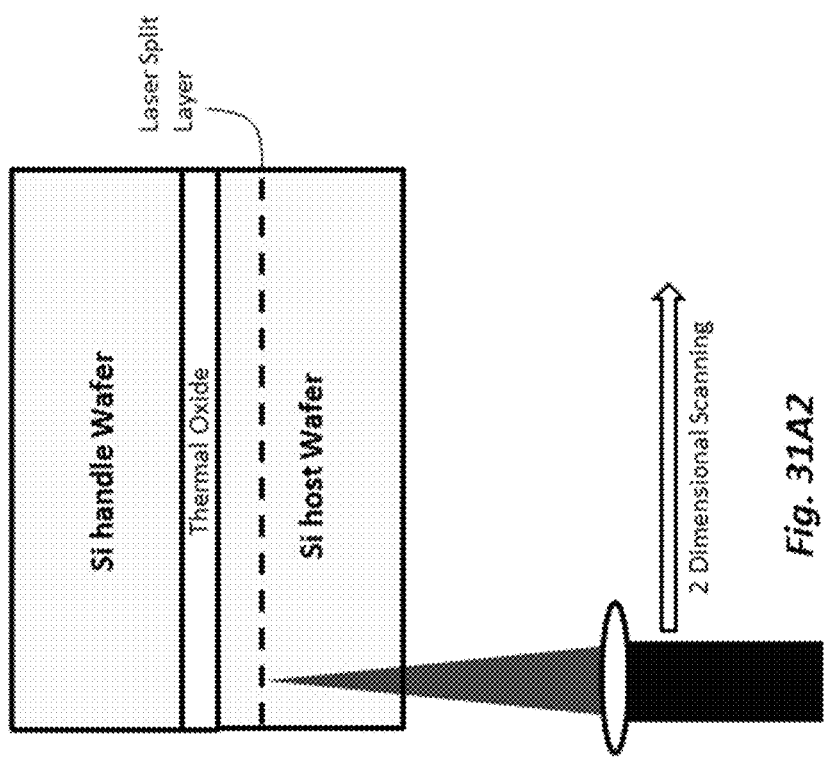
Fig. 31A2

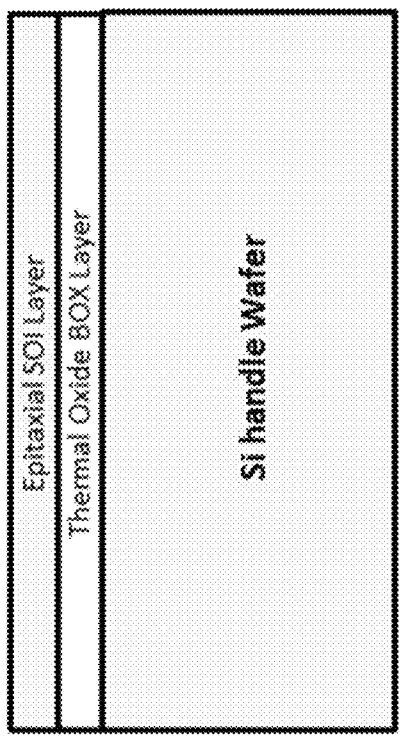
Fig. 31B3
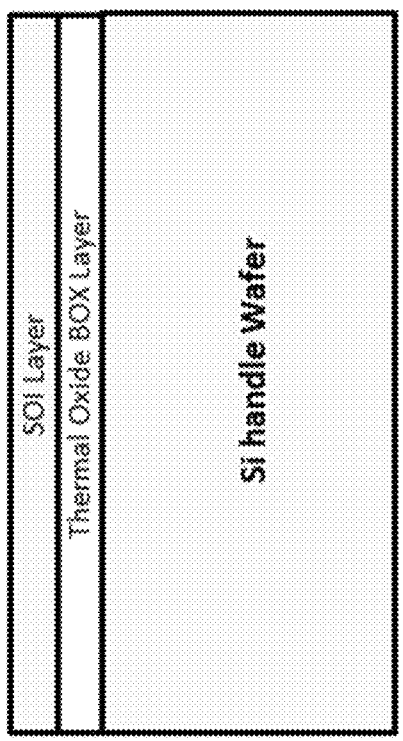
Fig. 31A3

SYSTEMS AND METHODS FOR LASER SPLITTING AND DEVICE LAYER TRANSFER

CROSS-REFERENCE TO RELATED APPLICATIONS

This application is a continuation of U.S. application Ser. No. 13/778,047 filed on Feb. 26, 2013 which claims the benefit of U.S. Provisional Application Nos. 61/603,370 filed on Feb. 26, 2012, 61/603,894 filed on Feb. 27, 2012, 61/609,347 filed on Mar. 11, 2012, and 61/708,477 filed on Oct. 1, 2012 which are hereby incorporated by reference in their entirety.

FIELD OF THE INVENTION

The present disclosure relates in general to the fields of semiconductor devices, and more particularly to laser processing of semiconductor device layers.

BACKGROUND

FIG. 1A is a cross-sectional diagram of energy particles 12 (for example photons from a laser beam) passing through semiconductor substrate 10 showing normal absorption of photons. In FIG. 1A, incident photons carry the optical energy without causing any mass transport. The material layer absorbs the energetic particles, in which the absorption passes are classified into two categories: Linear and Nonlinear absorption. Normal absorption of photons in semiconductor material takes place when electrons which are excited from the valence band to the conduction band by inter energy band transition, so that the incident photons are absorbed into the solid when photon energy is larger than the energy band gap of the solid (semiconductor material). In metals and heavily doped conductive semiconductors, a large number of free carriers such as free electrons exist in the conduction band. These free carriers may also absorb the incident photons (through free-carrier absorption) and are categorized as linear absorption since the number of absorbed photons is equal to the number of free carriers.

$h\nu > E_g$ (bandgap energy); Linear absorption

If photon energy is lower than the energy band gap ($E_g$), for example in a solid, the photons are not absorbed and are transparent. Product of h and $\nu$ is photon energy where h is Planck constant and $\nu$ is frequency.

$h\nu < E_g$ (bandgap energy); Transparent

On the contrary, FIG. 1B is a cross-sectional diagram of incident optical energy particles 16 (for example a laser) passing through lens 19 and semiconductor substrate 14 showing abnormal absorption of photons at selected material site/spot 18 (also referred to herein as a focal point within the material layer). Abnormal absorption may occur even in a transparent material/medium by linear absorption, for example with pulsed nanosecond laser focusing and nonlinear absorption with so-called multi-photon absorption in picoseconds pulse in which photons may be absorbed in multiple numbers per electron in (intra) the energy band gap or avalanche mode in conduction band.

$n \times h\nu > E_g$; Nonlinear absorption (n=2, 3, 4, . . )

Where, n represents an integer number. This phenomenon occurs when the energy is deposited in a small concentrated space, such as the selected site/spot 18 in FIG. 1B, and in short time (high power focused at a small area or volume in very short time), that is using high peak power and shorter pulses of laser irradiation. Using such conditions and when a short pulsed laser beam is irradiated on the solid, melting and/or ablation of the material often occurs in the linear absorption regime (this effect may often be observed without tight focusing into a very small material volume).

Consider the case for choosing photon wavelength for solid material to be transparent to the beam and tightly focusing the beam inside the solid. The laser beam penetrates internally up (or down) to a depth from the solid surface and is then absorbed at a small site with dense energy concentration, resulting in some inhomogeneity formed in uniform matrix of the solid material. This occurs because the unfocused laser power is not absorbed due to the material transparency, while the tightly focused beam spot within the solid material triggers enhanced light absorption due to increased light absorption coefficient during heating as shown by the graph in FIG. 2.

The inhomogeneity (and micro-cracks) induced by focused laser beam using short laser pulses inside the solid material may produce the following effects:
1. Index of Refraction shift in the solid material;
2. Phase transition from Solid to Liquid or sublimation and solidification;
3. Crystallographic phase change to amorphous phase (and other possible phase changes);
4. Crystallographic defects formed as dislocations, corresponding array, twins, and grain boundaries from small angles to large ones;
5. Cracks (micro-cracks) by breaking atomic bonds resulting in space or micro-voids between bonds;
6. Cavity, void, or pores on micrometer scale breaking a mass of bonds and diffusing out in solid phase due to abnormal local heating.

The index change has been observed in glass and has application in waveguides and sculpturing within glass.

In mono-crystalline silicon and other semiconductor materials, longer wavelength photons using, for example a micrometer-scale focused beam, may penetrate transparently through the material to a specified site since the material's energy band gap is greater than the photon energy ($h\nu < E_g$) and the laser is focused by optical lenss tightly at the sites under the surface while using short laser pulses. However, under such conditions the material crystallographic phase often changes from crystalline phase to amorphous state, and/or changes from single-crystalline structure to polycrystalline phase, in conjunction with crystallographic defects, dislocations, twins, grains and corresponding array and boundaries at the specified site (often relatively small site) where the laser beam is focused to cause linear and/or nonlinear absorption. Such inhomogeneity in the uniform matrix of mono-crystalline wafers often introduces a large amount of stress localized at the selected sites, resulting in breakage of Si—Si bonds in the proximate vicinity of the selected site which leads to micro-cracks. Formation of cavities, voids, and pores may also take place under extreme conditions of abnormal light absorption due to increased light absorption coefficient during heating.

BRIEF SUMMARY OF THE INVENTION

Therefore, a need has arisen for device layer fabrication from a donor wafer. In accordance with the disclosed subject matter, laser processing methods for fabricating a device layer which substantially eliminates or reduces disadvantages associated with previously developed device layer fabrication methods and systems.

According to one aspect of the disclosed subject matter, a method is provided for the split and separation of a layer of desired thickness of crystalline semiconductor material containing optical, photovoltaic, electronic, micro-electro-mechanical system (MEMS), or optoelectronic devices, from a thicker donor wafer, using laser irradiation.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

The features, natures, and advantages of the disclosed subject matter may become more apparent from the detailed description set forth below when taken in conjunction with the drawings in which like reference numerals indicate like features and wherein:

FIGS. 5B1, 5B1', 5B2, and 5B2' are diagrams showing a method for increasing spot pitch, specifically FIGS. 5B1 and 5B2 are cross-sectional diagrams of a wafer moving through laser and spray processing steps, respectively, and FIGS. 5B1' and 5B2' are top views of the wafer after the processing of FIGS. 5B1 and 5B2, respectively;

FIG. 6A through 6D are cross-sectional diagrams of a device layer separation;

FIGS. 9B-9H, 10A-10B, 11A-11B, 12A-12I, 13A-13F, and 14A-14F are cross-sectional diagrams depicting various embodiments for fabricating crystalline silicon photovoltaic (PV) solar cells;

FIG. 17A is a cross-sectional diagram showing an embodiment of a laser splitting tool and substrate and FIG. 17B is a top view of the scan area of the substrate using the tool shown in FIG. 17A;

FIGS. 28A through 28C are cross-sectional diagrams depicting the formation of a GaN/Sapphire LED device layer;

FIGS. 30A through 30E are cross-sectional diagrams depicting the formation of a back illuminated CMOS sensor;

FIGS. 31A1 through 31A3 are cross-sectional diagrams depicting the formation of a thick SOI wafer using laser splitting; and FIGS. 31B1 through 31B3 are cross-sectional diagrams depicting the formation of a thin SOI wafer using laser splitting.

DETAILED DESCRIPTION

Figure 1B:
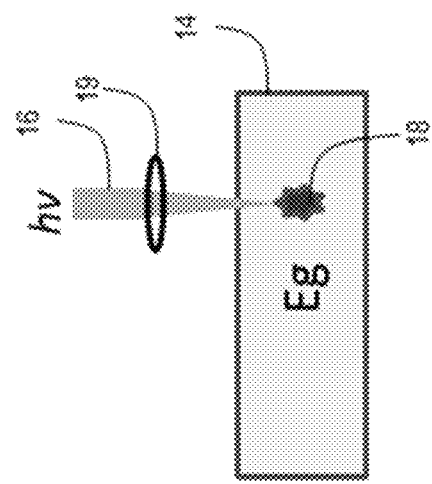
FIGS. 1A and 1B are a cross-sectional diagram of energy particles showing normal and abnormal absorption of photons.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

And although the present disclosure is described with reference to specific embodiments, such as back-contact solar cells using monocrystalline silicon substrates and other described fabrication materials, one skilled in the art could apply the principles discussed herein to front contact cells, other fabrication materials including alternative semiconductor materials (such as gallium arsenide, germanium, gallium nitride, etc.), technical areas, and/or embodiments without undue experimentation.

The embodiments disclosed herein are applicable to splitting or releasing various device layers attached to semiconductor wafers or host templates—semiconductor materials include materials such as Si, SiC, SiGe, Ge, GaAs, GaN, InP. Further, the methods disclosed herein may also apply to an electrically insulating sapphire substrate on which Si, GaAs and GaN active layers are epitaxially grown and processed to fabricate electronic and optical devices and with corresponding integration.

Devices which may be fabricated according to the embodiments disclosed herein include devices such as photovoltaic cells, three dimensional integrated circuits, System in Package (SIP), imagers, CMOS circuits, power devices, optical devices for light emitting diodes and lasers, and combinational integration for optoelectronics and LED printing array, and semiconductors on insulator (SOI) wafers.

Figure 2:
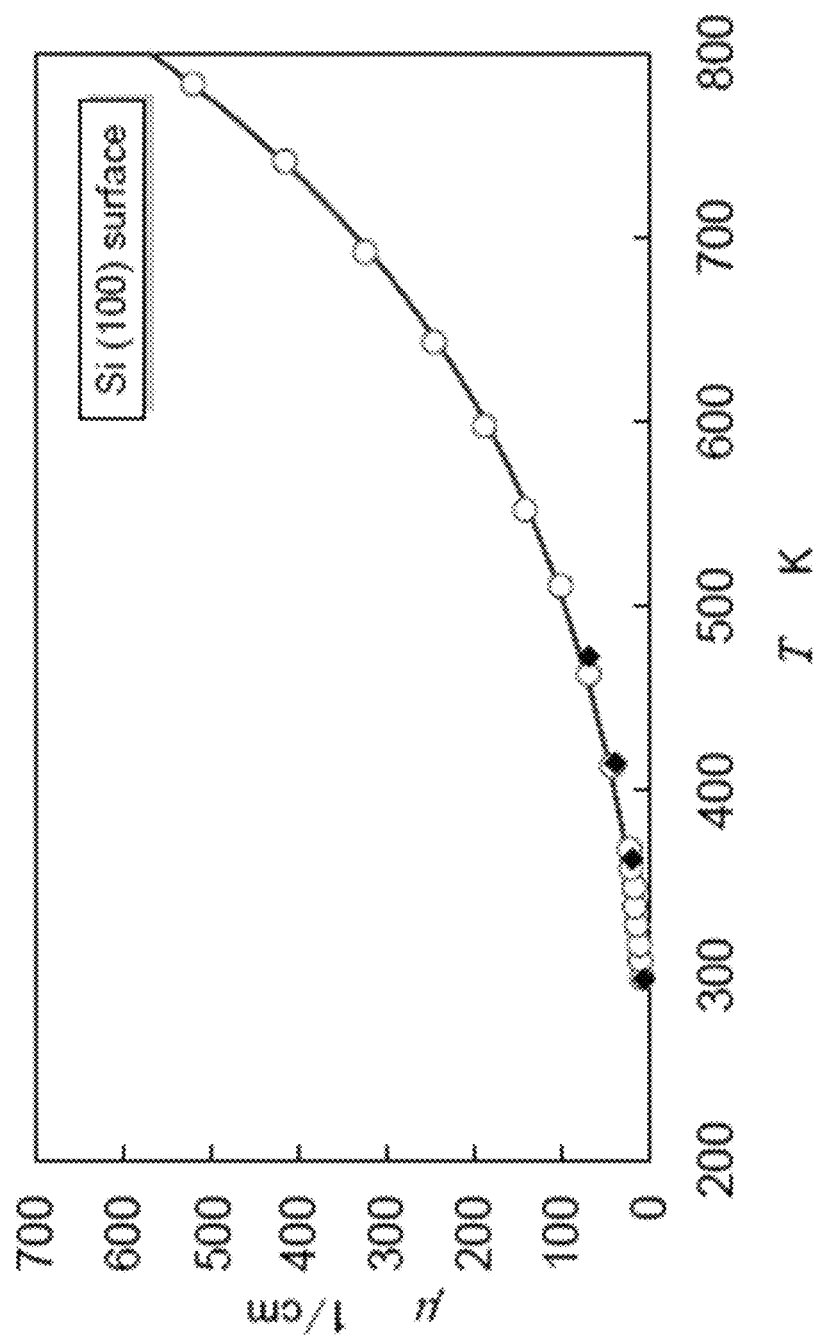
FIG. 2 is a graph showing absorption coefficient during heating.

Relating to laser processing of a semiconductor layer, if the laser beam wavelength is selected such that the semiconductor material layer is at least partially transparent for laser beam propagation then the laser beam power is not fully absorbed (or is only partially absorbed) when it is not focused—due to what is referred to as linear absorption by inter and intra energy band transition and free carrier absorption in conduction band. When the laser beam is focused to a relatively small dimension in the semiconductor material at a short time scale, the focused and higher density of laser power heats up the material locally—even when the laser beam is irradiated for relatively long duration, for example, in nano-seconds. The temperature of the material is highly elevated due to the phenomena of temperature dependency of light absorption coefficient, as shown in FIG. 2.

Figure 1A:
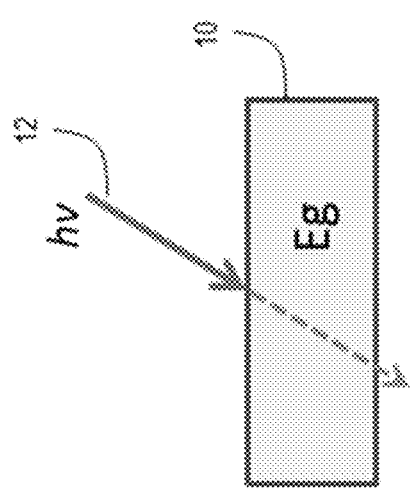

However, when the laser beam has a shorter pulse, for example, in pico-seconds, non-linear multiphoton absorption may take place in the energy bandgap or avalanche modes in the conduction band. This peculiar absorption phenomenon generates phase transition, structural reconstruction, crystallographic defects, and may even vaporize the semiconductor material by locally heating up a small portion of material, leaving small cavities, pores and voids at the irradiated small portions within the material (phenomena shown and described in FIGS. 1A and 1B).

Using the above-mentioned focused permeable laser irradiation process, the semiconductor crystalline phase may change to an amorphous state; thus altering the material reflective index while locally creating an array of dislocations such as twins, polycrystalline grains, and grain boundaries at the focused laser beam site on a small microns-scale area. By operating the irradiation in relatively short time periods, a relatively high laser beam energy density for the focused pulse laser irradiation can be achieved. In more extreme irradiation cases, localized vacancies and pores may be formed simultaneously with polycrystalline domains at the focused irradiating spots—in which case the pores are formed by evaporation or sublimation and the polycrystalline domains are formed by re-solidification process from the molten area beside the evaporation, due to the temperature dependent absorption coefficient in silicon—Si (as shown in FIG. 2 for 1064 nm wavelength laser). For a more detailed explanation of Si absorption coefficient see Fukuyo, F., Ohmura, E., Fukumitsu, K., Morita, H., Journal of Japan Laser Processing Society, Vol. 14, No. 1, pp. 24-29, 2007 and Weakliem, H. A., Redfield, D., Journal of Applied Physics, Vol. 50, No. 3, pp. 1491-1493, 1979 which is hereby incorporated by reference in its entirety. It is difficult for a 1064 nm wavelength laser to be absorbed in Si at room temperature (at a temperature of around 300K) due to the small absorption coefficient of approximately zero per cm; however, the absorption coefficient reaches as high as over 500/cm at temperatures of 700K-800K.

Figure 3A:
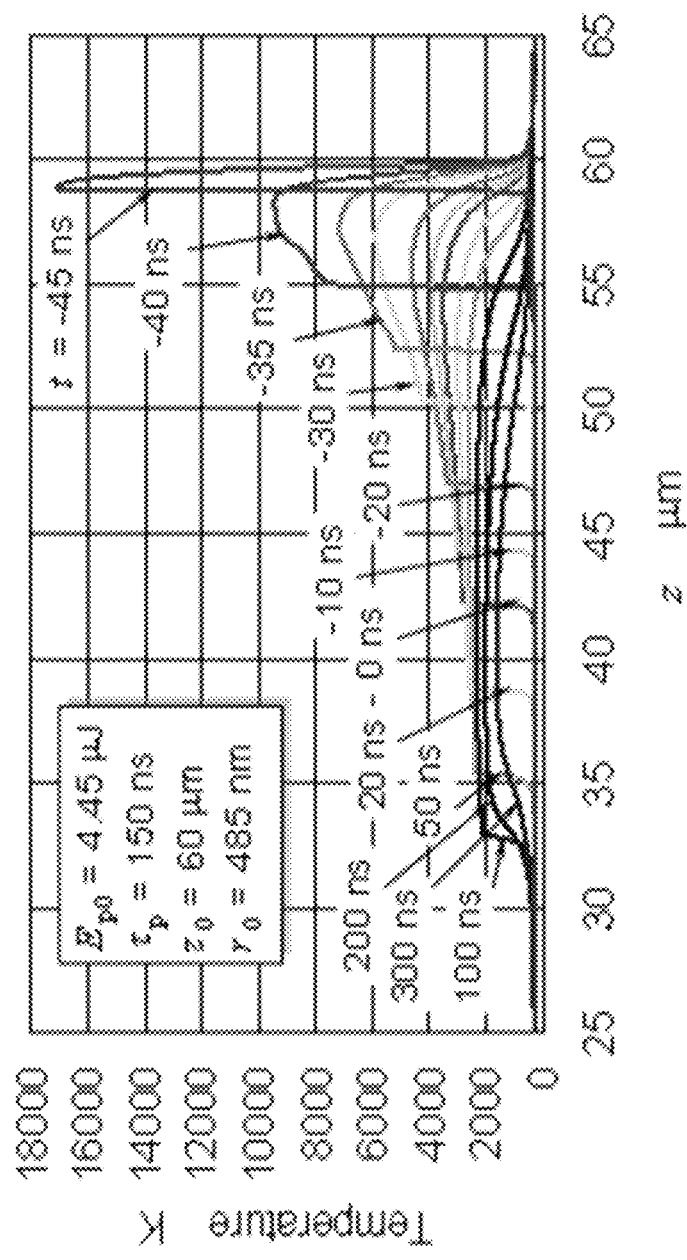
FIG. 3A is a graph showing temperature rise in depth profile of a single crystal silicon material when irradiated.
Figure 3B:
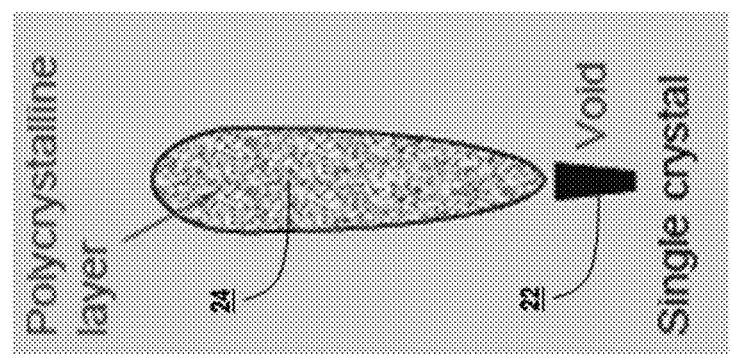
FIG. 3B is a cross-sectional diagram of a semiconductor material.

By heating Si by focusing a 1064 nm laser with dense power in a small portion/spot inside the material, the local portion/spot temperature may reach well over the melting temperature of Si (approximately 16000K) very quickly, as shown by the graph of FIG. 3A showing temperature rise in depth profile of a single crystal silicon material when irradiated with a 1064 nm wave length laser. The graph of FIG. 3A shows the temperature results of a 1064 nm wavelength laser with a power of 4.45 micro-Joules focused at 60 micron deep from Si surface with 450 nm radius at a small focal point/spot/site (for example having a size in the micrometer range and much smaller). The irradiation is performed for 150 nano-seconds duration. Temperature distribution for increasing focal point depths in the silicon material is shown in FIG. 3A. As can be seen, there is a sharp temperature rise around a of focal point with an Si depth of 58-60 microns or um (reaching over 16000K) while at a deeper focal point Si position and depth (over 60 um) negligible or zero temperature rise exists since the laser photons are completely absorbed up to and at the focal point due to the sharply increased absorption coefficient (shown in FIG. 3A)—as a result, two kinds of heterogeneity are formed in Si. At a focal point depth of 60 um (microns)—again, for example a relatively small focal point in the range of micrometers—Si atoms are evaporated resulting in voids and pores (for example trapezoidal shaped voids as shown in the cross-sectional diagram of a semiconductor material FIG. 3B) and may also result in a heat affected Si area above the laser focal point (for example approximately 10 micrometers above the laser focal point and shown as the polycrystalline layer in FIG. 3B) melts and resolidifies leaving a polycrystalline domain/layer after silicon cooling following 150 nanoseconds irradiation. For a more detailed explanation of this phenomena see Ohmura, E., Fukuyo, F., Fukumitsu, K., and Morita, H., Vol. 17, Issue 1-2, pp. 381-384, 2006, which is hereby incorporated by reference in its entirety. FIG. 3B shows a cross-section of a portion of an Si layer 20 comprising trapezoidal void 22 and polycrystalline domain/layer 24 both formed above a laser focal spot (focal spot not shown but positioned at the bottom of trapezoidal void 22).

Figure 4:
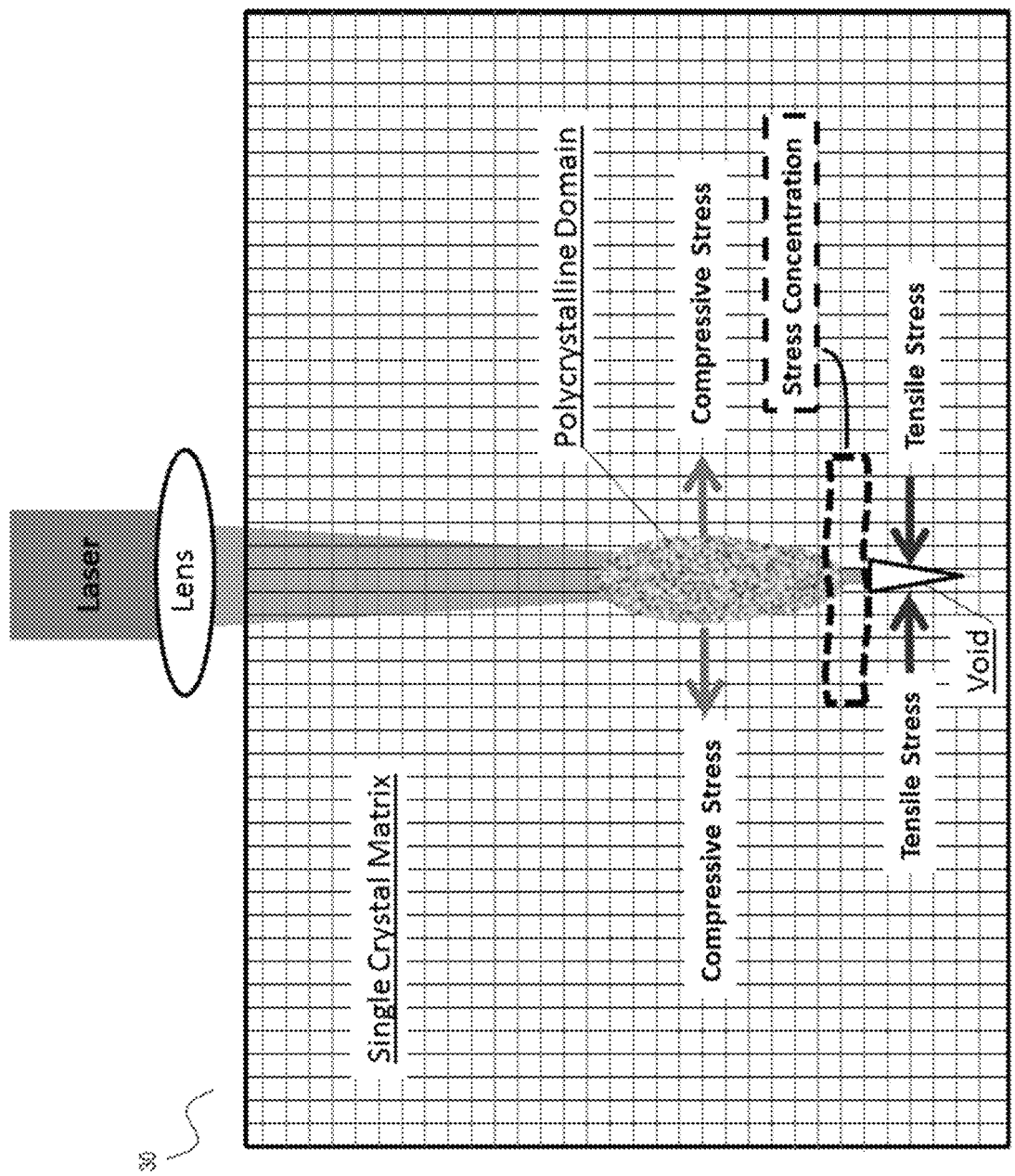
FIG. 4 shows a cross-section of laser irradiation processing of single crystal semiconductor layer.

Further, sharp stress differences are formed between the void (such as trapezoidal void 22 in FIG. 3B) and the polycrystalline domain (such as polycrystalline layer 24 in FIG. 3B) as tensile stress is formed in the neighboring single crystalline matrix around the void and compressive stress formed around the polycrystalline domain—shown in FIG. 4 for single crystal semiconductor layer 30. This may be because the vacuum voids have no Si atoms while the polycrystalline domain, including Si atoms having defects and grain boundaries, are expanding in volume. The oppositely directed stresses create a stress concentration where the distortion energy is maximized in the uniform single crystalline matrix.

When the focused laser beam is scanned over the wafer in two dimensions across the entire surface of the wafer (in other words across and over the wafer surface, substantially parallel to the wafer frontside and/or backside as shown in FIG. 5, also referred to as the wafer horizontal (x) axis and wafer vertical (y) axis), the heterogeneous structures and corresponding stress fields may be introduced in a plane inside the wafer parallel to the wafer surface. The stress concentrated zone may span inside and along the entire length wafer (in other words extending bi-directionally internally across the wafer as shown in FIG. 5) and may be inter-connected by micro-cracks introduced during or formed by laser processing (a phenomenon driven by minimizing stress energy of the wafer). FIG. 5 shows a cross-section of laser irradiation processing of single crystal semiconductor layer 40 similar to FIG. 4 except that laser beam 42 (and corresponding focusing lens 44) is scanned across the wafer area. For example, the micro cracks may be generated at the each stress concentrated zone by a single laser hit and may then propagate and connect with each other by controlled thermal and/or external mechanical stress after laser irradiation. The continuous crack formation of the connected micro cracks may leads to splitting of the wafer and formation of a thin semiconductor layer separated on demand from the host semiconductor substrate, for example along a pre-deposited sacrificial layer.

Figure 5A:
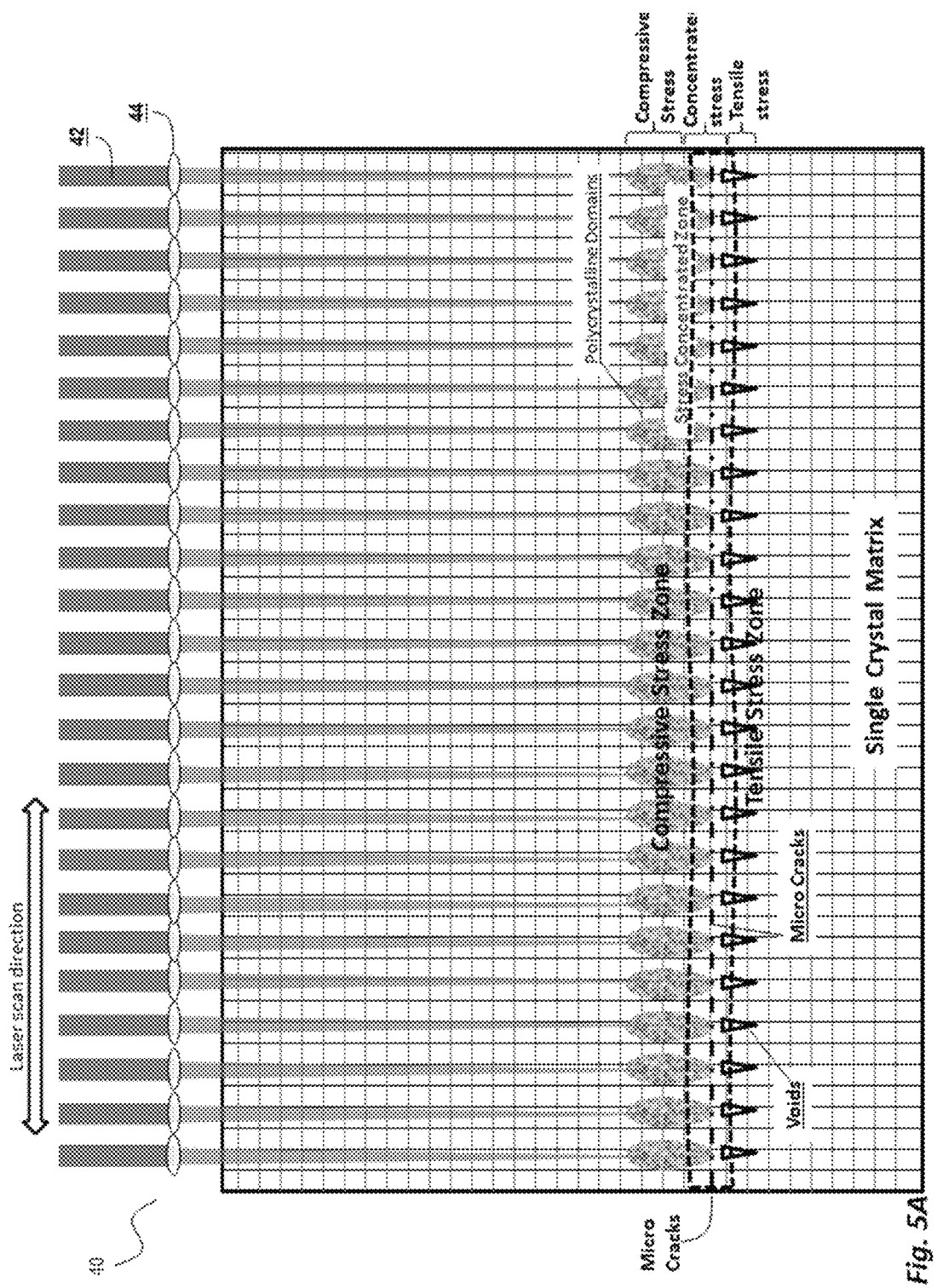
FIG. 5A shows a cross-section of laser irradiation processing of single crystal semiconductor layer as a laser scans across the semiconductor layer.

Mechanical weakness of the semiconductor layer may also contribute to micro crack propagation and connection by the existence of internal voids—for example a preformed mechanically weak layer such as a porous silicon layer comprising voids. This crack formation mechanism and corresponding crack plane formed of continuous micro cracks is depicted in FIG. 5A. The cracking plane may be formed substantially parallel to the crystalline cleavage plane, for the cracking plane may be along the (111) plane which is a known cleavage crystallographic plane in Si, thus, a Si (111) wafer may be desired for consistent and organized cracking, connecting, and splitting in some applications. However, (100) Si plane may also be used for splitting and cracking by adjusting laser splitting conditions, such as polarization which is able to elongate the micro-cracks in the desired direction.

In one photovoltaic cell processing embodiment, texturing with chemical etching with an alkaline such as KOH or NaOH solution may be used on the (100) Si surface plane for random micro-pyramid formation. This heterogeneity creates an abrupt stress field alteration in the surrounding matrix of crystalline solid material (e.g., semiconductor) and leads to formation of localized micro-cracks at small sites. This laser-irradiation-induced micro-cracking effect may be more pronounced than such effects generated by external mechanical, thermal, and ultrasonic initiations. The laser beam is scanned over and across the surface of a device layer (for example, the backside surface) deposited on a wafer or host template while the relative location (focus depth) of laser focusing points are constantly maintained from the front or back surfaces of the device layer during the scanning laser irradiation process, for example, by supporting the device layer and attached template with a stiff handler. Thus, the generated inhomogeneities are interconnected, resulting in propagating the micro cracks along a separation crystallographic plane across the device layer surface area or wafer/host template surface area to release the thin semiconductor device layer from the donor wafer or host template. The device layer formed by the laser splitting process may then be transferred from the host template onto a handler such as a backplane sheet without any breakage of the thin separated semiconductor device layer. Thus the device layer, for example a thin semiconductor layer sliced by the laser splitting process, is supported at all times either on an original semiconductor wafer/host template prior to the thin layer separation and then by a support backplane (or support front plane) after its separation from the host template.

The laser processing innovations disclosed herein are based on localized absorption of a focused laser beam in transparent (or semi-transparent) matter (such as a crystalline semiconductor material) by focused photon energy (for example a focused laser beam with a suitable wavelength and energy) in which material phase change (for example from crystalline to amorphous semiconductor material) and reconstruction, and/or voids or pores formation, and/or re-solidification forming polycrystalline domains are managed and controlled. Such heterogeneity forms a relatively abrupt stress field in the material and the stress may be relaxed through induced micro-crack generation, resulting in inhomogeneity around the irradiated sites by injecting energy without any mass transportation. Selective and controlled formation of inhomogeneity may be induced in small spots by dense photon energy for short time period.

The controlled micro-crack formation methods and systems disclosed herein may be applied to many electric, photonic, mechanical, photonic, and opto-electronic devices and corresponding integrated circuits on the surface of the semiconductor wafers. Generally the modern integrated circuits and light emitting devices are built over the relatively thick (well over 100 microns and up to 100's of microns thick) wafers and subsequently thinned down by back-lapping and/or grinding for thin packaging after device processing as well as three-dimensional stacking of integrated circuits referred to as SiP (System in Package) where thinned integrated circuits (ICs) are stacked in the package and connected by wire-bonding between the each thin layers of ICs. Thus, the laser splitting methods disclosed herein may replace conventional chip thinning methods, for example those using mechanical grinding and/or lapping by wet processes where the grinded semiconductor material is wasted. The laser splitting methods disclosed herein will enable one to reuse the host/donor wafers (also called starting wafer) thereby reducing device production cost.

For host/donor template/wafer reuse after releasing the device layer, the template surface should be flat and smooth with minimal or zero contamination for the next device processing. The laser irradiation methods disclosed herein deposits photon energy with minimal to zero material mass transported during the laser processing. Thus, metal contamination is minimized or eliminated over the split surface interface of the wafers/device layers within the donor wafer. Irradiated damage and the surface roughness created by scanning the laser beam may be reduced or eliminated by etching of the wafer surface or sacrificial layer if used and/or hydrogen annealing method whereby an atomically clean and flat surface is recovered by heating the wafer (and deposited sacrificial layer if used) to around 1000 degree C. in hydrogen atmosphere with enhanced surface diffusion phenomena at no loss semiconductor (Si) material. Thus, in some embodiments there may be no starting wafer/host (donor) template semiconductor (Si) thickness loss after releasing the device layer using laser splitting. This allows for multiple reuses of the starting wafer leading to a large reduction in starting wafer cost—and cost benefits are magnified when the starting wafers are costly and difficult to mechanically thin down (for example, GaAs, Sapphire, GaN, SiC, etc.).

Although the laser splitting and crack generation methods described herein are useful for releasing a thin device layer and transferred to a supporting handler, thin films of single crystalline Si and Ge layers on insulating substrates (SOI and GOI) may also be efficiently formed by this method. In this case, the laser beam focuses into the wafer backside after bonding with the insulated handle wafers, resulting in producing semiconductor-on-insulator (SOI) wafers made of Si (SOI) or Ge (GOI) semiconductor layers which may be used to form the high speed CMOS (Complimentary Metal Oxide Semiconductor) and other electronic applications. In some instances, the cost of forming such integrated material wafers may be mitigated by multiple use and reuse of the starting donor wafers. After splitting SOI wafers and host/donor wafers, the surface roughness may be reduced and the flat surface recovered by a hydrogen annealing method as described above.

FIGS. 6A through 6E are cross-sectional diagrams of device layers attached wafers utilizing laser splitting methods in accordance with the disclosed subject matter. The present application provides systems and methods for reducing and/or eliminating this top laser irradiation semiconductor wafer damage. In one embodiment, this may comprise laser irradiation from the backside of the wafer.

The starting semiconductor donor wafers or host template are processed to form a desired device layer (for example a semiconductor active layer over non-semiconductor wafers/host templates such as a Si, GaAs, or GaN layer on a sapphire wafer) on the front surface of the semiconductor layer. Often this process may utilize a planer device layer formation technology on bulk semiconductor wafers. The device layer may be used to form devices such as solar cells, CMOS imagers, CMOS integrated circuits, bipolar integrated circuits, optical devices of LED (Light Emitting Diode) and Laser, and combinational integrated devices with electrical and optical devices ("optoelectronics") using a variety of semiconductor active layers/device layers of materials such as silicon, silicon germanium, compound semiconductors of GaAs, GaAlAs, InP, GaP, GaN, silicon carbide, as well as SOI (silicon on insulators), GOI (germanium on insulator), SOS (silicon on sapphire).

Figure 6A:
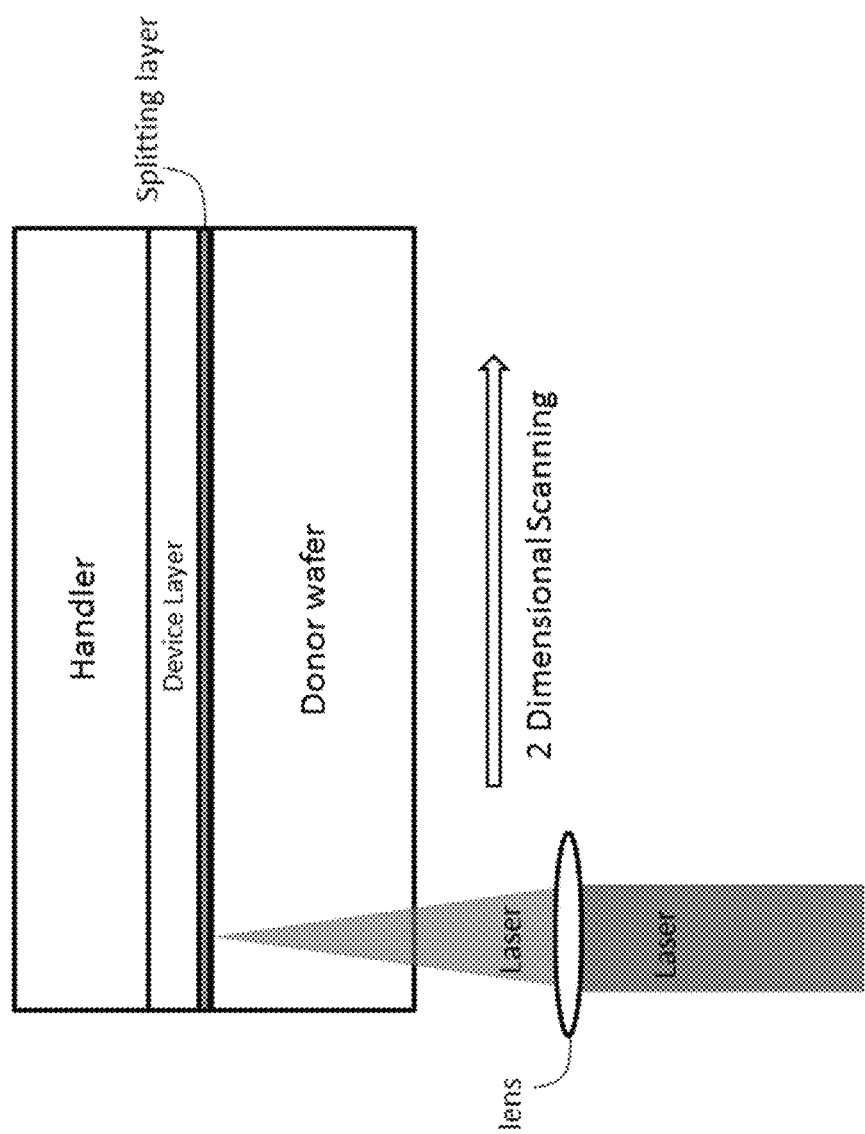

FIG. 6A is a cross-sectional diagram of a device layer attached to or formed on a host wafer and supported by a handler or backplane. In this example, the handler or backplane supports the wafer frontside while laser irradiation processing scans the backside along a focal point at the intersection of the device layer and host wafer to form a splitting layer. FIGS. 6B through 6D depict a general process flow of laser irradiation to form a splitting layer (FIG. 6B which is similar to FIG. 6A), device layer release (FIG. 6C), and a subsequent formation of a second device layer on or in the host/donor wafer (FIG. 6D). Thus, the host wafer may be reused for multiple device layer formation and release cycles, hence, reducing the overall manufacturing cost by amortizing the donor wafer cost over the reuse cycles. For example, the donor/host wafer or template may comprise active semiconductor material which may include doped p-type and/or n-type regions in bulk wafers made of CZ or FZ, or an epitaxial Si layer (as the device layer) over a silicon host wafer or sapphire host wafers. A porous silicon layer or silicon dioxide layer may be formed between the host wafer and epitaxial Si layer.

After splitting the device layer in (shown in FIG. 6C), the device layer may be processed in back end processing and/or packaging for formation into and device such as a solar cell and solar module. The separated donor/host or donor wafer may be reused in another device layer fabrication process (as shown in FIG. 6D with Device Layer-2 bonded to another handler/backplane and ready for release) where again laser spitting processing may be used (FIG. 6B) for device layer release while maintaining host wafer quality.

Figure 6E:
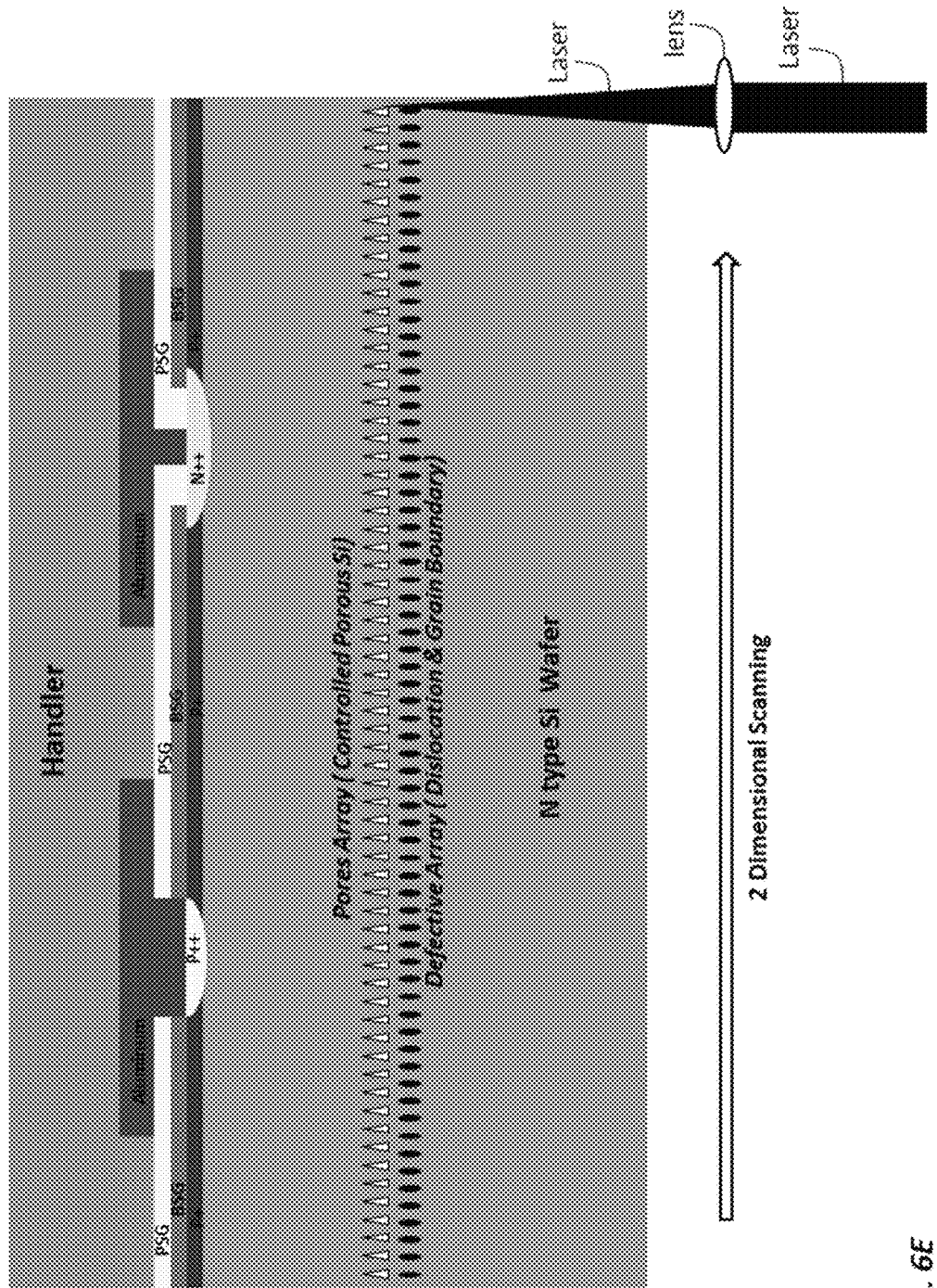
FIG. 6E is a detailed cross-sectional diagram of a laser processing across an N type Si wafer.

After device layer formation on the surface of active semiconductor layers (again the donor/host wafer may comprise active and non-active semiconductor elements) a handling substrates/backplane may be attached, bonded, laminated, or covered over the device layer to form a structural support. The handler/backplane may comprise materials such as polymer, plastic sheet, prepreg, screen printed (or sprayed) paste or resin, insulator, semiconductors, metals, glass, or ceramics, with stiffness and providing structural integrity to the device layer to prevent delamination and warpage during post procedures for device layer handling. Again, in some instances the semiconductor device layer may have a thickness in the range of about 1 micron up to about 100 microns and as large as 150 microns. FIG. 6E is a detailed cross-sectional diagram of a laser processing across an N type Si wafer.

Figure 7:
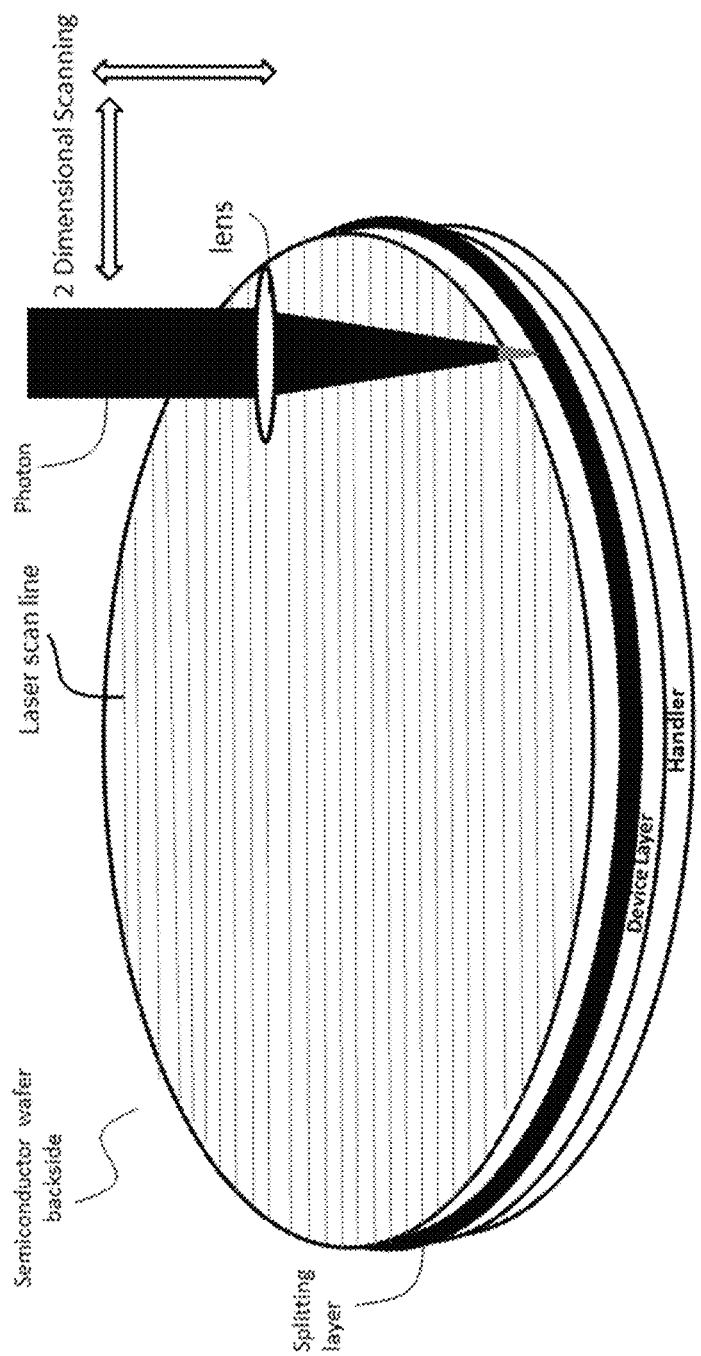
FIG. 7 is a diagram showing a backside view of a semiconductor wafer having frontside attached/deposited device layer.

As shown in FIG. 7, the host wafer is irradiated by photons (a laser beam) focused at the backside of device layer, with a laser wave-length at which the semiconductor wafer is transparent (at least partially transparent to the laser beam) from one surface (such as the backside) and scanned over and across the entire wafer surface (for example the entire backside surface so that the photons are injected in the semiconductor wafer at focal points extending bi-directionally internally throughout and across the wafer surface for the formation of the corresponding formed splitting layer). The laser scanning speed and period may be selected and optimized based on the laser power, focused cross-sectional area, semiconductor material index, numerical aperture of optical lenss, and laser input power to form the desired density of spots of localized stress, voids, pores and defect-containing areas inside and buried within the wafer and beneath the device layer formed on the surface of the wafer. During the irradiation and upon propagating/interconnecting the defective (micro-cracked) regions, the device layers may be delaminated and peeled away or lifted off (also referred to as released from the wafer) the wafer on demand. However, in some cases, and particularly if the delaminated device layer is a thin layer (for instance, in the thickness range of about 1 micron up to about 100 microns), if the released device layer is not supported on or by a handler substrates or backplane the device layer may crack and break into pieces due to insufficient mechanical strength and poor rigidity. Thus, a handling substrate or backplane is attached to the exposed surface of the wafer (in other words attached to the device layer) before delamination. Using this laser irradiation process, the bulk stresses are accumulated which result in chipping and enhancing cleavage of the device layer (for example a thin semiconductor layer in the thickness range of about 1 micron up to about 100 microns). The interconnected inhomogeneous areas spanning in plane of the wafer surface and beneath the device layers are referred to as a splitting layer or a splitting interface herein. And the two dimensional propagation of micro-cracking by interconnecting voids and pores around the sharply localized stress zone parallel to the wafer surface in which the lateral propagation of micro-cracks is thus enhanced at the cleaving interface with the device layer (for example Si).

The focal point/laser spot pitch (distance between the adjacent irradiated laser spots) or beam period between adjacent laser shots may be increased to increase the size of the cracks in the plane of separation after the initial cracks have been created by the laser. This allows the laser spots to be placed further apart and non-overlapping (not touching laser spots) and to obtain device layer separation—as shown in FIG. 5B. FIG. 5B (FIGS. 5B1, 5B1', 5B2, and 5B2') are diagrams showing a method for increasing spot pitch (and/or beam-period) using a cold (or hot) gas spray to increase and propagate micro-crack formation within the wafer at the crystallographic separation plane. FIGS. 5B1 and 5B2 show a high throughput design for moving wafer 50, for example by electrostatic chuck, through laser processing by laser 54 and corresponding focusing lens 52 to spray device 58 which sprays cold (or hot) gas spray 56 (for example from dry ice or liquid nitrogen, or alternatively, hot air) on wafer 50. Thus, the wafer/template (or substrate) is subjected to a stream of very cold gas, or alternatively hot gas such as hot air, after the laser radiation to create thermally induced stresses and to facilitate the layer splitting process. FIGS. 5B1' and 5B2' are top views of wafer 50 after the processing of FIGS. 5B1 and 5B2, respectively, and shown laser damage areas formed within wafer 50. As shown in FIG. 5B1', the leading edge of wafer/template 50 is subjected to laser irradiation that creates cracks that touch each other, or may even overlap, shown as the row of interconnected laser damage 62 while the area ahead of these cracks (laser damage 62) has laser spots that are placed much farther apart, shown as laser damage areas 60. In this embodiment, laser damage areas 60 are a uniform array of buried spots placed far apart. The exposure to cold (or hot) gas generates thermally induced stress by creating a temperature difference between the two opposite sides of the wafer (by cooling or heating the top side). Thermally induced stresses and wafer bow are created that results in micro crack extension and propagation between the laser micro-crack spots and along the desired crystallographic cleavage plane, shown as crack plane 64 in FIG. 5B2'—in other words, the cracks spread and connect to each other due to the thermal stress created by the cold gas spray. As a result, in some instances a device layer, such as a thin layer of silicon, may then be more readily cleaved and lifted off from the host substrate.

The successful splitting of a large area and the resulting micro-roughness of the split surfaces may depend on the period between the adjacent irradiation sites. This may also determine the time to scan over the entire wafer surface which may result in higher throughput and reduced production costs. The lateral extension of micro cracks (which allows for laser damage to be formed farther apart, in other words a larger period between adjacent irradiation sites) is important for throughput and may be further substantially enhanced by the crystallographic nature of cleavage, which is well known to be dependent on the crystallographic plains. The highest atomic packed plain, such as the (111) plane in Si, provides the longest lattice distance between the plains to be cleaved by breaking atomic bonds, for example Si—Si bonds, with the least energy since the bonding strength decreases as distance increases (in other words bonding strength is smallest at the longest distance of inter plains). Therefore, if the crystallographic cleavage plane parallel to the wafer surface (frontside/topside or backside) is selected, the period between adjacent laser shooting sites may be extended (due to the crystallographic nature of cleavage) and further increases to throughput and cost reductions may be achieved.

Known methods to transfer an active semiconductor layer from an initial host substrates onto a handler/backplane (also referred to as a dissimilar substrates) include hydrogen ion (proton) implantation into the wafers to create buried microcavities and cracks, and metal stress induced spalling or exfoliation. However, high dose hydrogen ion implantation typically requires expensive and energy-intensive mega-electron-volt or MeV energy ion implantation in order to reach to several tens of micrometers (or microns) thickness in a wafer. MeV energy ion implantation is a relatively capital intensive process and creates an excessive amount of defects due to ion bombardment by proton implantation damage and related material mass transportation (hydrogen ion or sputtered metals). Further, in some instances this method may not enable back side irradiation since the wafer, for example bulk Si, thickness may be thicker than several hundred microns (and require extraordinary high energy to penetrate through) and have crystallographic damage due to ion bombardment and mass transport. In contrast, device layer transfer using the photon/laser splitting methods disclosed herein may have negligible to zero mass transport damage. Thus in some instances it may be difficult and challenging to cost effectively utilize hydrogen MeV ion implantation process for transferring/releasing/splitting a device layer.

Another method to delaminate thin layers from donor/host wafers is based on metal stress induced spalling or exfoliation. Using this approach, a thick metal layer is deposited onto the wafer, for example a very thick layer of plated nickel metal. This thick metal layer produces a stress field for exfoliation, spalling, or cleavage of the thin semiconductor layer from the wafer surface. And while this method has been demonstrated for prototype silicon solar cells, as the blanket metal layer may impose process integration constraints applying this method to the more sophisticated and higher performance device structures (such as point and back contact solar cell structure in PV, CMOS imagers, and three dimensional integrated circuits, and optical device applications) has serious limitations. This metal-stress-induced spalling or exfoliation technique also may have severe limitations in terms of scalability and manufacturability for use in low-cost applications, such as solar cells.

In contrast, backside irradiation using a laser having a suitable wavelength for the material to be at least partially transparent provides for multiple reuses of the wafer/template to form multiple layers of semiconductor from a single starting wafer. Thus, substantially reducing the production cost of the resulting wafers (or material/device layers) through kerfless laser splitting and slicing. Because photon injection and transmission through the semiconductor wafer is not accompanied with material mass transport, the high quality of crystalline structure of the transparent material or wafers is fully preserved with negligible or zero bulk defects (other than desired defects formed at the splitting interface) and with negligible or zero contamination introduced into the bulk wafer. In contrast, in some instances hydrogen MeV ion implantation technique may introduce some metallic contamination into the wafer from a metallic vacuum chamber wall as hydrogen ion bombardment is known to introduce delamination of the metallic vacuum chamber walls. The laser scanning equipment in accordance with the disclosed subject matter is much simpler and less costly than known MeV hydrogen implantation methods using vacuum processing which may require high electrical power and consume gas and chemicals.

According to one embodiment the disclosed laser processing methods, the microcracks for laser splitting are formed by laser scanning from the front side surface of a wafer (in other words laser scanning from the device layer surface side) before the device layer is formed or at a suitable step during the device manufacture that does not degrade the device layer. The density or the intensity of these cracks may be such that the device layer does not delaminate during the device manufacture and attachment to the handling substrate/backplane. In another embodiment, such as that described herein, when microcracks, in addition to pre-existing microcracks, are created by scanning from the backside of the wafer (in other words the side opposite the device layer) the device layer is separated/released.

Moreover, based on the embodiments disclosed herein, before (or even during) processing of an active device or device layer on top of a wafer surface, laser irradiation may be performed from the top surface (also referred to as the device layer side or wafer frontside) to create a degree of inhomogeneity at a controlled depth beneath the device layer. This degree of the structural change/inhomogeneity may be controlled by laser power and/or period of scanning. For example, doubling the scanning period may introduce approximately half of the defects embedded in the wafer which may further enable subsequent device layer processing and subsequent controlled delamination on demand without pre-mature device formation process-induced delamination if the thermal budget and introduction of stresses into the device layer over the pre-splitting layer is acceptable for preventing spontaneous or undesirable premature delamination during device processing. After forming device layer processing and attaching support handlers over the device surfaces, the device layer may be separated in a controllable manner by irradiation for the final release of the device layer by shifting the irradiation path placed in the middle of the front side laser scanning paths.

In one embodiment, an initial pre-splitting device layer formation may comprise a doped layer to collect and absorb more photons by linear absorption through free carriers as well as nonlinear absorption via laser focusing. For example, the enhancement of absorption coefficient is significant in heavily doped $p^+$ boron doped Si in contrast with lightly doped Si so that using a laser wavelength suitable for (at least partially) transparent transmission in the bulk Si semiconductor, the highly doped layers absorb more photons via both linear and nonlinear mechanisms. Similarly, wider bandgap materials such as GaAs, SiC, GaN and InP are more transparent, and alloys such as SiGe with narrower energy band gap can absorb more photons. Therefore, SiGe or heavily doped p+ or n+ doped layers embedded/buried in a semiconductor wafer beneath the device layer may promote selective absorption and such buried doped layers may serve as splitting layers.

As described above, FIG. 7 is a diagram showing a backside view of a semiconductor wafer having frontside attached/deposited device layer (which may be formed from the semiconductor wafer) attached to a handler using a focused laser beam to irradiate the entire semiconductor wafer area from the backside to form a splitting layer for the release of the device layer. The photons travel through the backside of wafer and are absorbed at the laser beam focal point through linear or nonlinear absorption beneath the device layer. The laser irradiation processing may be performed before or after attaching the handler/backplane. The absorbed photons create localized change in the crystalline structure, such as shifting from crystalline to amorphous state, poly-crystallization, dislocation defect array formation, pores, voids and cavities formed at the localized sites by photon energy absorption concentrated in a short laser pulse period for nano and pico seconds. When the laser beam is scanned over the wafer surface according to a given scanning algorithm, these inhomogeneities form abrupt localized stress field changes resulting in introducing microcracks which interconnect with each other to form a continuously propagated splitting layer entirely over/within the wafer. The defects produced in small sites are interconnected and, as a result, a continuous two-dimensional defective strained plane (laser slitting plane) is formed. This splitting layer is optimized in dimension and in density of the defects as well as in weakness within the splitting layer which is then loosely binding the wafer and the device layer. The laser power and scanning speed as well as focused area of laser beam are critical parameters to optimize the stress field and the splitting layer.

After completion of laser scanning process, the delamination process may be performed, for example by a controlled thermal and/or mechanical stress force, in order to initiate laser splitting and to transfer the device layer onto the handler/backplane.

Solid, liquid, and vapor wedges may be used to initiate splitting by hitting at the edge of the wafer after the laser splitting irradiation process. Multiple spray nozzles and/or rotating the wafers to initiate splitting along the periphery of the wafer during inserting the wedges may also shorten the time to separate and transfer the device layer to the hander. Other methods to initiate the splitting process include, for example, ultrasonic agitation, thermal treatment (heating and/or cooling) which enhances the internal stress to assist the cracks propagation in plain, and pulling force applied to back and front surface of the wafer and device layer by alternating the pulling/sucking frequency on and off to apply vibrational motion to assist crack propagation and completion of the splitting process. Liquid or water jet may also be a powerful and efficient way method to initiate splitting as such flexibly shaped changeable wedge (the sprayed liquid acts as a wedge as can a gas) can penetrate into the small gaps in cracks without excess warpage which could damage the device layer and the wafer. Minimizing wafer damage enables multiple reuse of the wafer for additional device layer formation, laser splitting, and layer transfer. Another method may use a combination of liquid jet and laser beam, for example where the laser beam is collimated through the jet stream as shown in the cross-sectional diagram of FIG. 8B.

Figure 8A:
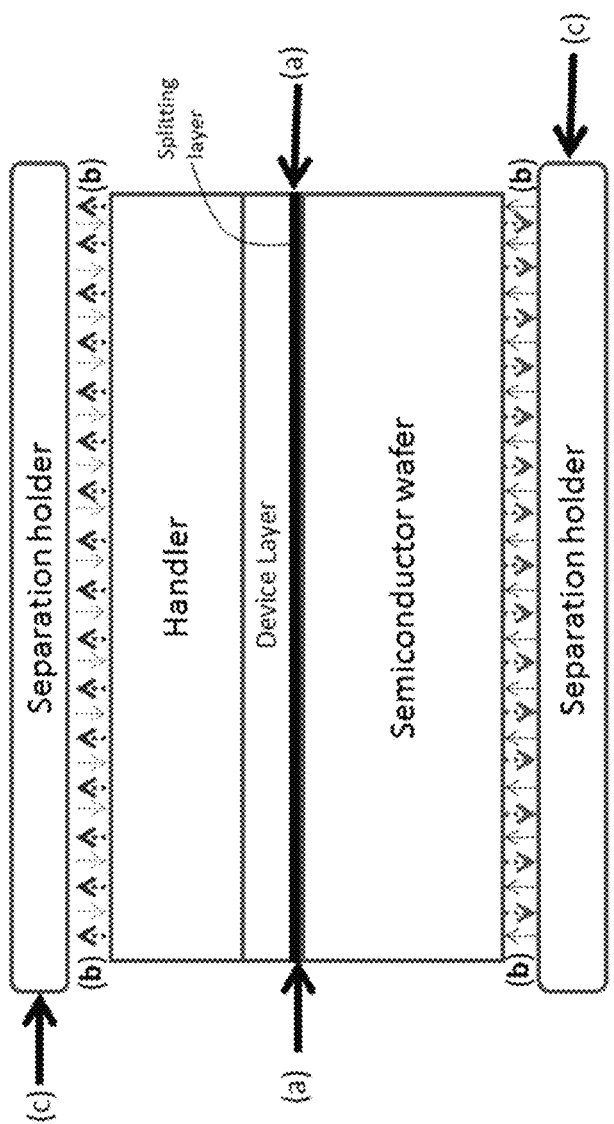
FIG. 8A is a cross-sectional diagram of a handler attached to a device layer.

FIG. 8A is a cross-sectional diagram of a handler attached to a device layer mechanically weakly attached to a semiconductor layer along a laser splitting layer used to describe some of the release initiating methods above. In case of wedge insertion, for example by collimated fluid, liquid, gas or inserting wedges mechanically, the wedge is inserted at the edge of the splitting layer (wedge insertion point shown as (a) in FIG. 8). The ends of the splitting layer at the periphery of the wafer may be exposed for stable separation. The splitting layer may be extended to the wafer apex of the beveling end to assist in guiding wedges at the edge site. Selective etching at the defective splitting layer may also be performed to expose wider gaps in the splitting layer to increase inlet size for the wedges. When vibrational motion by alternating on/off sucking of top and bottom separation holders (for example using electrostatic power and vacuum sucking, shown as vertical motion (b) in FIG. 8) is used to initiate separation, the distance between the substance and the separation holders, switching frequency for sucking the substance, and sucking strength are the primary parameters to optimize. Higher frequency may be more applicable for electrostatic chucking. When vibrational shear stress by finely controlled electrically piezoelectric actuators is used to initiate separation (shear stress shown as horizontal stress (c) in FIG. 8), shear force is applied horizontally to both separation holders by piezoelectric actuators. Oscillating the actuators causes vibrational motion to initiate device layer separation. The release initiating methods described herein, as well as other known release methods, may be combined. Additionally, ultrasonic forces may be used to further enhance and facilitate the splitting process yield by mitigating damages and chipping at the device layers which may provide for additional reuse of the initial wafer for subsequent device layer process by laser splitting of multiple layers. Importantly, the device layer may be separated exclusively with internal stress relaxation and without additional external force to initiate the release process, for example after the laser irradiation when the stress is adjusted and accumulated during device processing such as during bonding with the handlers or back plane material.

For example, after the laser splitting/separation is completed, the exposed back surface of the devices (in other words the surface separated from the host wafer and opposite the handler/backplane) may undergo processing for the formation of back-contact solar cells such as texturing, doping, and passivation in order to collect more light by the devices and/or to create surface field doping for improved photovoltaic efficiency. Surface laser damage may be removed by selective chemical etching on the irradiated portions of the device. Color filters may be stacked up over the back surface of devices for back illumination of semiconductor solid state imagers. Via holes may be formed to connect with electrodes on the device surface for three dimensional integration of large scale integrated circuits and for interconnecting between optical devices transferred on the holder in which CMOS driver circuits are embedded.

Handlers substrates (for example backplanes) or sheets may be made of semiconductor, metal, polymers, ceramics or other suitable materials for supporting thin device layers and to prevent breakage of the separated layers (particularly important for thin sub-100 micron semiconductor layers). Handler substrates, for example mono-crystalline silicon wafers, may have embedded memory, logic, or driving circuits to provide additional functionality through material and device integration with overlaid devices (for example integrated circuits using optical and electrical device integration).

This disclosed subject matter also describes systems and apparatus providing high throughput laser scanning for layer splitting. High throughput may comprise wafers scanning at a very high speed using multiple laser beams and multi-wafer batch processing.

While many of the device layer fabrication embodiments and structures disclosed herein are described with reference to an epitaxially deposited active layer, the laser splitting methods and tools are applicable for forming a splitting layer for releasing a device layer formed or deposited by any means including those formed from a donor wafer. In other words, the donor or host wafer provides device layer material which may then be separated from the donor wafer in accordance with the disclosed laser splitting subject matter.

Si Photovoltaic Cells. FIGS. 9 through 14 depict various embodiments for fabricating crystalline silicon photovoltaic (PV) solar cells. The following description of various laser splitting embodiments are described with reference to photovoltaics devices, specifically crystalline silicon photovoltaics (PV) modules as they currently account for over 85% of the overall global PV market. The silicon wafer material cost of these crystalline silicon PV modules currently constitutes over 40% of the total PV module manufacturing cost. This laser splitting technique is used to manufacture an all back contact, back junction solar with a thin silicon absorber layer. The P and N junctions are formed and passivated and connected with a thin layer of metal (metal 1). The laser splitting technique is used to separate a thin layer of silicon containing these components and transfer to a handling substrate such as a prepreg. This is followed by drilling vias in the prepreg and the deposition of another layer of metal (metal 2) and patterning to complete the solar cell. This technique can be used during the manufacture of other devices such as light emitting diodes made from a host of substrates such as GaN, GaAlN, InGaN, GaAs, InP, GaAlAs, etc., or CMOS imagers, or CMOS circuits, or power devices, or silicon on insulator (SOI), or germanium on insulator (GOI) devices.

The various laser system configurations for multiple wafer processing using multiple laser beams sub divided from primary beams from several laser are presented. The laser system have stations that carry multiple wafers. The laser systems also facilitate real time measurement of wafer surface height, roughness, and reflectivity measurement for control of the scanner and the laser power to obtain high quality layer separation.

It is to be noted that it is not necessary that the defects created by the laser beam at focus overlap since we present schemes that allow to place these defects at large distances and still connect using these schemes. These schemes include increasing the crack size by moving the wafer under a cold spray, for example, from the liquid nitrogen container; by applying mechanical vibrational forces; inserting wedges, and shear stress for the bonded substrates; by applying thermal annealing, water jet, chemical jet, and gas jet in conjunction with laser beam.

Figure 9A:
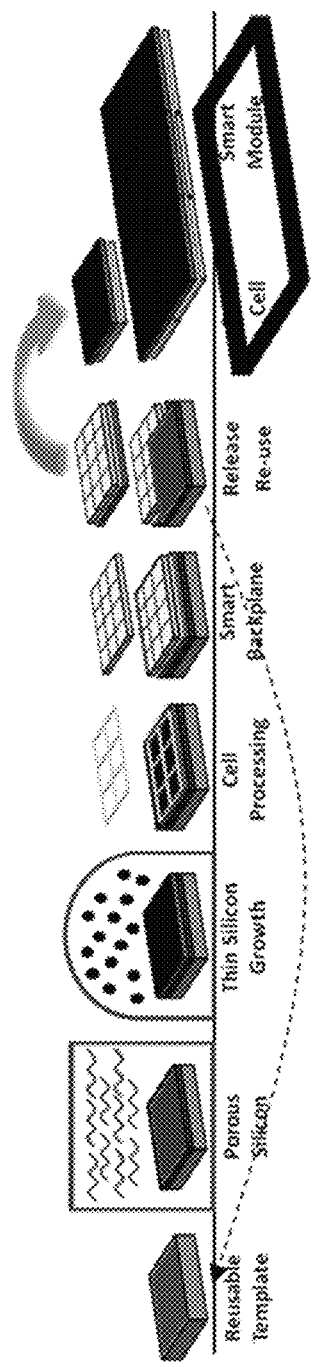
FIG. 9A is a general process flow highlighting key processing steps of a tested thin-crystalline-silicon solar cell manufacturing process.

FIG. 9A is a general process flow highlighting key processing steps of a tested thin-crystalline-silicon solar cell manufacturing process which substantially reduces silicon usage and eliminates traditional manufacturing steps to create low-cost, high-efficiency, back-junction/back-contact monocrystalline cells. Specifically cells with laminated backplanes for smart cell and smart module design using a reusable template and epitaxial silicon deposition on a release layer of porous silicon. The solar cells and processing methods described may utilize and integrate the laser splitting methods disclosed herein.

The example process shown in FIG. 9A starts with a reusable silicon template, typically made of a p-type monocrystalline silicon wafer, into which a thin sacrificial layer of porous silicon is formed (for example by an electrochemical etch process through a surface modification process in an HF/IPA wet chemistry in the presence of an electrical current). Upon formation of the sacrificial porous silicon layer, which serves both as a high-quality epitaxial seed layer as well as a subsequent separation/lift-off layer, a thin layer (for example a layer thickness in the range of a few microns up to about 70 microns, or preferably no thicker than about 50 microns) of in-situ-doped monocrystalline silicon is formed, also called epitaxial silicon growth. The in-situ-doped monocrystalline silicon layer may be formed, for example, by atmospheric-pressure epitaxy using a chemical-vapor deposition or CVD process in ambient comprising a silicon gas such as trichlorosilane or TCS and hydrogen.

After completion of a majority of solar cell processing steps, a very-low-cost backplane layer may be bonded to the thin epi layer for permanent cell support and reinforcement as well as to support the high-conductivity cell metallization of the solar cell. The backplane material may be made of a thin (for instance, about 50 to 250 microns), flexible, and electrically insulating polymeric material sheet such as an inexpensive prepreg material commonly used in printed circuit boards which meets the process integration and reliability requirements. The mostly-processed back-contact, back-junction backplane-reinforced large-area (for instance, a solar cell area of at least 125 mm×125 mm or 156 mm×156 mm or larger) solar cell is then separated and lifted off from the template along the mechanically-weakened sacrificial porous silicon layer utilizing the laser splitting while the template may be re-used many times to further minimize solar cell manufacturing cost. Final cell processing may then be performed on the solar cell sunny-side which is exposed after being released from the template. Sunny-side processing may include, for instance, completing frontside texturization and passivation and anti-reflection coating deposition process.

The laser splitting and release methods and designs of this application may be integrated into device fabrication, such as the exemplary disclosed solar cell fabrication process flow, without substantially altering or adding manufacturing process steps or tools, and thus without substantially adding to the cost of manufacturing the solar cell.

The backplane material may be a thin sheet of a polymeric material with sufficiently low coefficient of thermal expansion (CTE) to avoid causing excessive thermally induced stresses on the thin silicon layer. Moreover, the backplane material should meet process integration requirements for the backend cell fabrication processes, in particular chemical resistance during wet texturing of the cell frontside and thermal stability during the PECVD deposition of the frontside passivation and ARC layer. The electrically insulating backplane material should also meet the module-level lamination process and long-term reliability requirements. While various suitable polymeric (such as plastics, fluropolymers, prepregs, etc.) and suitable non-polymeric materials (such as glass, ceramics, etc.) may be used as the backplane material, backplane material choice depends on many considerations including, but not limited to, cost, ease of process integration, reliability, pliability, etc.

A suitable material choice for backplane is prepreg. Prepreg sheets are used as building blocks of printed circuit boards and may be made from combinations of resins and CTE-reducing fibers or particles. The backplane material may be an inexpensive, low-CTE (typically with CTE<10 ppm/° C., or preferably with CTE<5 ppm/° C.), thin (usually 50 to 250 microns, preferably in the range of about 50 to 150 microns) prepreg sheet which is relatively chemically resistant to texturization chemicals and is thermally stable at temperatures up to at least 180° C. (or preferably to as high as at least 280° C.). The prepreg sheet may be attached to the solar cell backside while still on the template (before the cell lift off process) using a vacuum laminator. Upon applying heat and pressure, the thin prepreg sheet is permanently laminated or attached to the backside of the processed solar cell. Then, the lift-off release boundary is defined around the periphery of the solar cell (near the template edges), for example by using a pulsed laser scribing tool, and the backplane-laminated solar cell is then separated from the reusable template using a mechanical release or lift-off process. The subsequent process steps may include: (i) completion of the texture and passivation processes on the solar cell sunnyside, (ii) completion of the solar cell high conductivity metallization on the cell backside (which is the solar cell backplane). The high-conductivity metallization (for example comprising aluminum and/or copper, as opposed to silver to reduce the solar cell manufacturing and material costs) including both the emitter and base polarities is formed on the laminated solar cell backplane. The backplane material may be made of a thin (for instance, about 50 to 250 microns), flexible, and electrically insulating polymeric material sheet such as an inexpensive prepreg material commonly used in printed circuit boards (PCB) which meets the process integration and reliability requirements. Generally, prepregs are reinforcing materials pre-impregnated with resin and ready to use to produce composite parts (prepregs may be used to produce composites faster and easier than wet lay-up systems). Prepregs may be manufactured by combining reinforcement fibers or fabrics with specially formulated pre-catalyzed resins using equipment designed to ensure consistency. Covered by a flexible backing paper, prepregs may be easily handled and remain pliable for a certain time period (out-life) at room temperature. Further, prepreg advances have produced materials which do not require refrigeration for storage, prepregs with longer shelf life, and products that cure at lower temperatures. Prepreg laminates may be cured by heating under pressure. Conventional prepregs are formulated for autoclave curing while low-temp. prepregs may be fully cured by using vacuum bag pressure alone at much lower temperatures.

The viscosity of a prepreg resin affects its properties, and it is affected by temperature: At 20° C. a prepreg resin feels like a 'dry' but tacky solid. Upon heating, the resin viscosity drops dramatically, allowing it to flow around fibers, giving the prepreg the necessary flexibility to conform to mold shapes. As the prepreg is heated beyond the activation temperature, its catalysts react and the cross-linking reaction of the resin molecules accelerates. The progressive polymerization increases the viscosity of the resin until it has passed a point where it will not flow. The reaction then proceeds to full cure. Thus prepeg material may be used to "flow" around and in gaps/voids in the M1 metallization pattern.

Further, PCBs are alternating layers of core and prepreg where core is a thin piece of dielectric with copper foil bonded to both sides (core dielectric is cured fiberglass-epoxy resin) and prepreg is uncured fiberglass-epoxy resin. Prepreg will cure and harden when heated and pressed. In other words, prepregs are rolls of uncured composite materials in which the fibers have been pre-impregnated (combined) with the resin. During production, the prepreg sandwich is heated to a precise temperature and time to slightly cure the resin and, therefore, slightly solidify through cross-linking. This is called B-Staging. Care must be taken to insure that the sandwich is not heated too much, as this will cause the prepreg to be too stiff and seem "boardy." The solvent is removed during B-Staging so that resin is relatively dry of solvent. Typical thermoset resins and some thermoplastic resins are commonly used in prepregs. The most common resin is epoxy as the major markets for prepregs are in aerospace, sporting goods, and electrical circuit boards where excellent mechanical, chemical, and physical properties of epoxies are needed. Typically, prepregs have a thickness in the range of as little as about 1 mil (~25 μm) up to a multiple of this amount.

Further, prepegs may be made of thermoplastics (not as common as thermosets). Thermoplastic prepregs are often used for their toughness, solvent resistance, or some other specialized purpose. Most of the thermoplastics used are very high performance resins, such as PEEK, PEI, and PPS which would compete with 350° F. cure epoxies in aerospace applications. Some new applications such as automotive body panels which depend up special properties, such as toughness, are using thermoplastics either alone or mixed with thermosets.

For example, solar cell designs and manufacturing processes described herein may have two levels of metallization which are separated by the electrically insulating backplane layer. Prior backplane lamination, the solar cell base and emitter contact metallization pattern is formed directly on the cell backside, for example by using a thin layer of screen printed or plasma sputtered or evaporated (PVD) aluminum (or aluminum silicon alloy) material layer. This first layer of metallization (herein referred to as M1) defines the solar cell contact metallization pattern, such as fine-pitch interdigitated back-contact (IBC) conductor fingers defining the base and emitter regions of the IBC cell. The M1 layer extracts the solar cell current and voltage and transfers the solar cell electrical power to the second level/layer of higher-conductivity solar cell metallization (herein referred to as M2) formed after M1. After formation of the backplane, subsequent detachment of the backplane-supported solar cell from the template, and completion of the frontside texture and passivation processes, higher conductivity layer M2 is formed on the backplane. Via holes (in some instances up to hundreds or thousands of via holes) are drilled into the backplane (for example by laser drilling). These via holes land on pre-specified regions of M1 for subsequent electrical connections between the patterned M2 and M1 layers through conductive plugs formed in these via holes. Subsequently, the patterned higher-conductivity metallization layer M2 is formed (for example by plasma sputtering, plating, or a combination thereof—using an M2 material comprising aluminum and/or copper). For an interdigitated back-contact (IBC) solar cell with fine-pitch IBC fingers on M1 (for instance, hundreds of fingers), the patterned M2 layer may be designed orthogonal to M1 —i.e., the M2 fingers are essentially perpendicular to the M1 fingers. Because of this orthogonal transformation, the M2 layer may have far fewer IBC fingers than the M1 layer (for instance, by a factor of about 10 to 50 fewer M2 fingers). Hence, the M2 layer may be a much coarser pattern with much wider IBC fingers than the M1 layer. Solar cell busbars may be positioned on the M2 layer, and not on the M1 layer, to eliminate electrical shading losses associated with busbars on a solar cell. And as both the base and emitter interconnections and busbars may be positioned on the M2 layer on the solar cell backside backplane, electrical access is provided to both the base and emitter terminals of the solar cell on the backplane.

As described above the starting material or reusable template may be a single crystalline silicon wafer, for example formed using crystal growth methods such as FZ, CZ, MCZ (Magnetic stabilized CZ), and may further comprise epitaxial layers grown over such silicon wafers. The semiconductor doping type may be either p or n and the wafer shape, while most commonly square shaped, may be any geometric or non-geometric shape such as quasi-square or round. As the laser splitting methods disclosed herein allow for the separation and release of a device layer from a single wafer, it is possible to produce multiple solar cells by splitting the cell device layers for transfer to the handlers from a single starting wafer. The starting wafer thickness may be thicker than common wafers used in PV industry, for example a starting thickness around several hundred micrometers up to over one millimeter such as a thickness in the range of 500 to 2000 micrometers or alternatively 700 to 1500 micrometers. FIG. 9B is a cross-sectional diagram showing a starting Si wafer. Various surface finishing conditions are applicable for the starting material Si wafers, such as lapped and etched, and mirror surfaces. Further, the wafer-based silicon solar cell processing methods may also utilize a mono-crystalline or poly-crystalline starting silicon wafers. Currently, the wafering kerf-loss value for solar wafers may be as high as 50%, starting from initial growth from molten silicon to form the ingot through subsequent shaping, sawing, lapping, etching, and additional wafer processing. Sufficient removal of the mechanical damages by wafering processes may further increase kerf-loss. In some instances, wafering kerf loss contributes to making the starting material to over 50% of total PV cell manufacturing composition. This may be particularly true for the cells with the highest conversion efficiency by using FZ and MCZ wafers with the lower oxygen content resulting in the longest minority carrier life time over one millisecond. Therefore, in order to reduce the material cost, thinner wafers have been introduced as the cell efficiency is not degraded when the wafer thickness is reduced to about 100 micrometers and preferably to approximately 40 microns to 80 microns, relating to photon penetration depth as well as light capturing efficiency for the solar-photon generating electron carriers. Kerf-loss, for example from wire sawing, for the thinner wafers sliced by wire saws may be increased in proportion to the number of wafers needed as a thinner cell wafer yields more wafers from a starting wafer. Furthermore, cell process yield is lowered with thinner wafers due to handling and processing related wafer breakage problems. This is caused by the reduced mechanical strength of thinner wafers and results in increased chipping and breakage during wafer handling and processing.

Figure 9C:
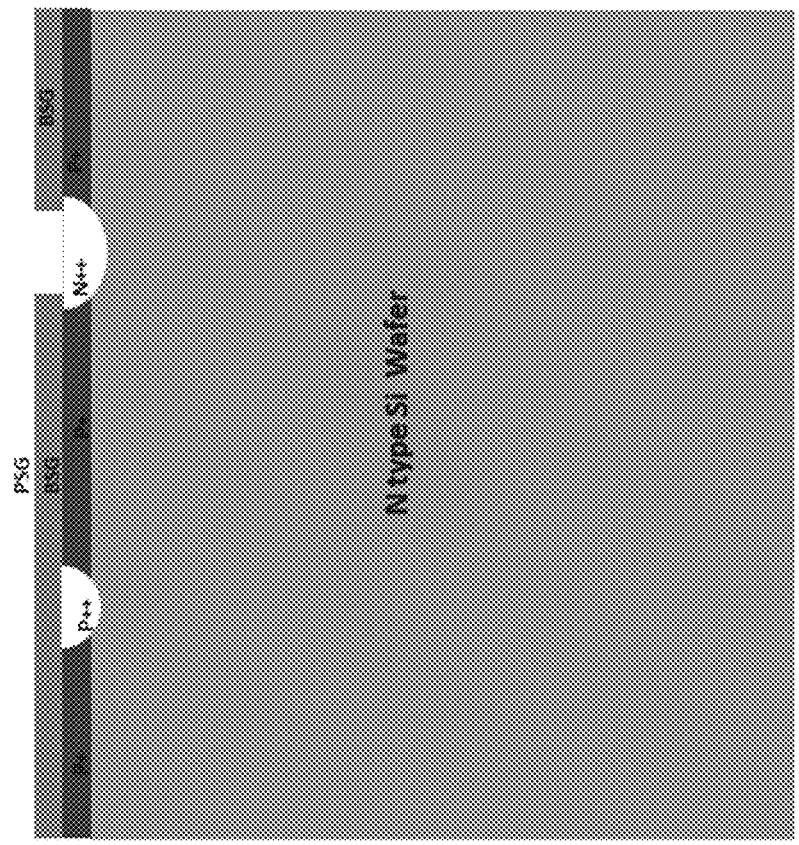
Figure 9B:
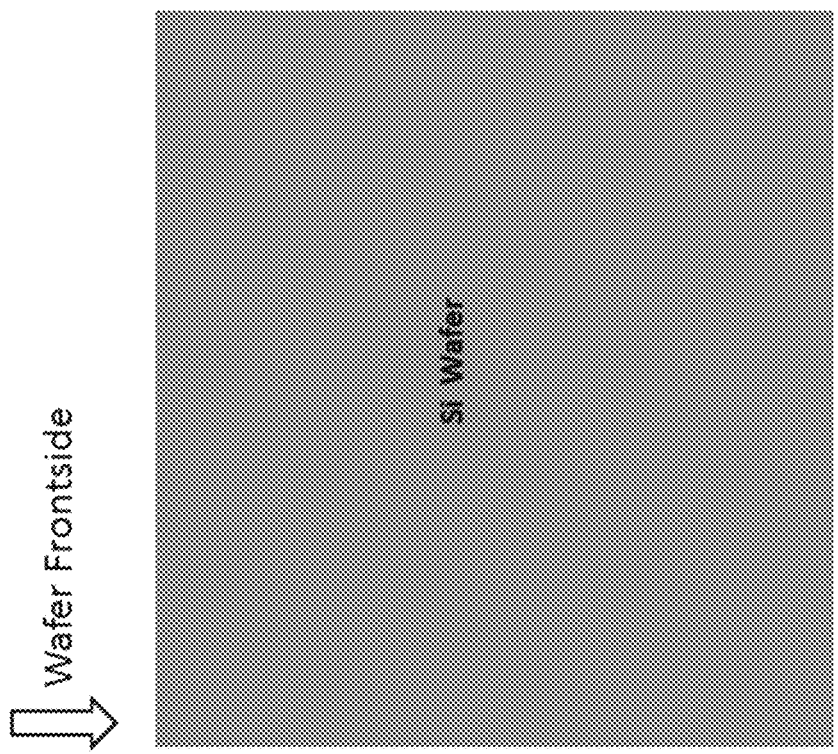

FIG. 9C is a cross-sectional diagram of an n doped Si wafer after frontside processing commonly used for the higher efficiency PV cells such as PN junction formation and contact doping by boron-doped glass (BSG) and phosphorus-doped glass (PSG) APCVD deposition. As shown in FIG. 9C, the Si wafer is an n type Si wafer (doped with phosphorus: $1\times10^{15}$ cm$^{-3}$, 156 mm×156 mm full-square or pseudo-square shaped). Wafer cell processing starts with fabrication of PN junction by depositing BSG with APCVD and subsequently driving p$^+$ type dopant of boron to form the emitter junction. Contacting p$^{++}$ regions are also formed with this boron dopant source layer. Then, PSG is deposited by APCVD as n type dopant source which is driven in to form n$^{++}$ base contact regions (which may be formed concurrently with the same anneal used for formation of the emitter junction regions). For additional exemplary interdigitated back contact cell fabrication process flows see P.C.T. Pat. No. PCT/US12/00348 filed Dec. 28, 2012 and which is hereby incorporated by reference in its entirety.

Figure 9E:
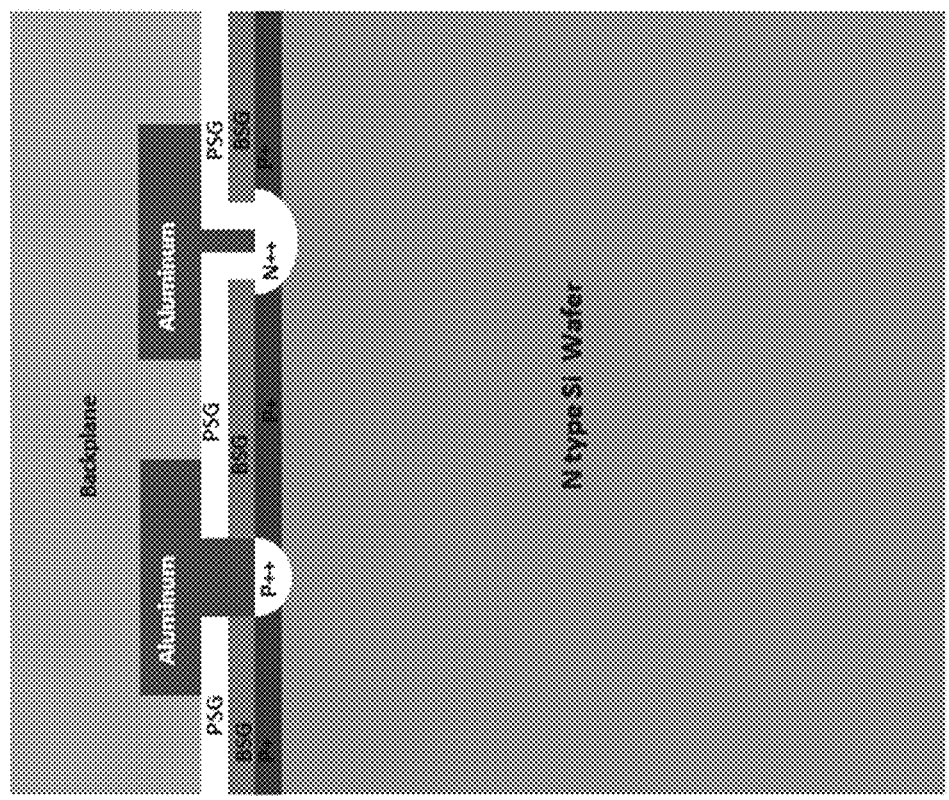
Figure 9D:
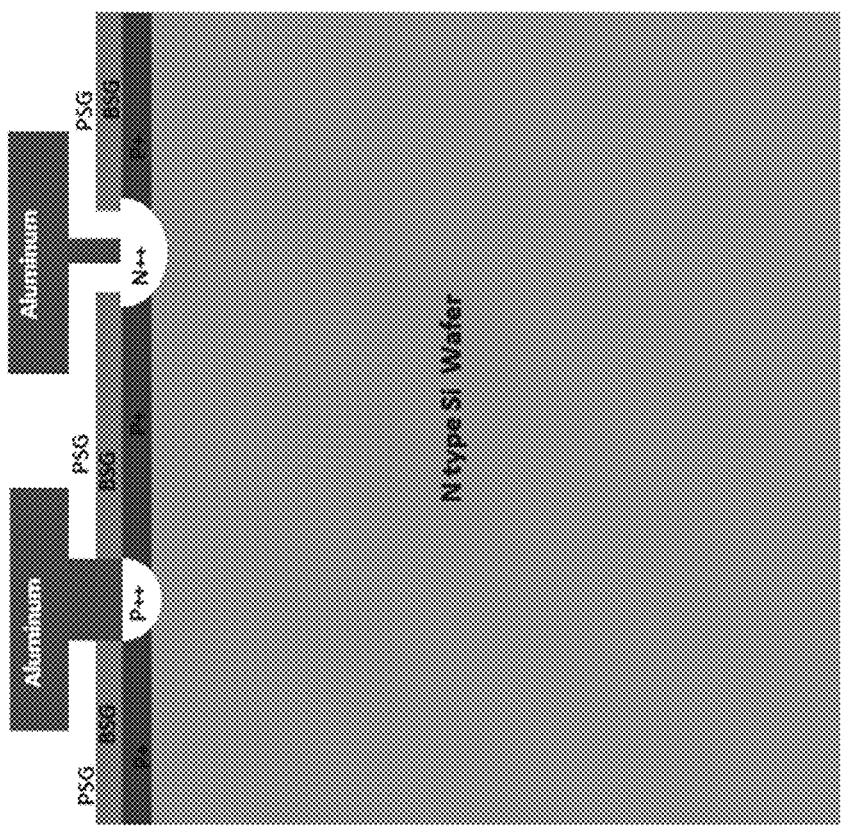

After opening the base and emitter contact holes, aluminum metal layer may be deposited by screen printing to form the emitter and base electrodes over the p$^{++}$ and n$^{++}$ regions (as shown in FIG. 9D). The cell surface is laminated with prepreg as a handler as well as protective layer (as shown in FIG. 9E) for following processing including device layer split.

Figure 9F:
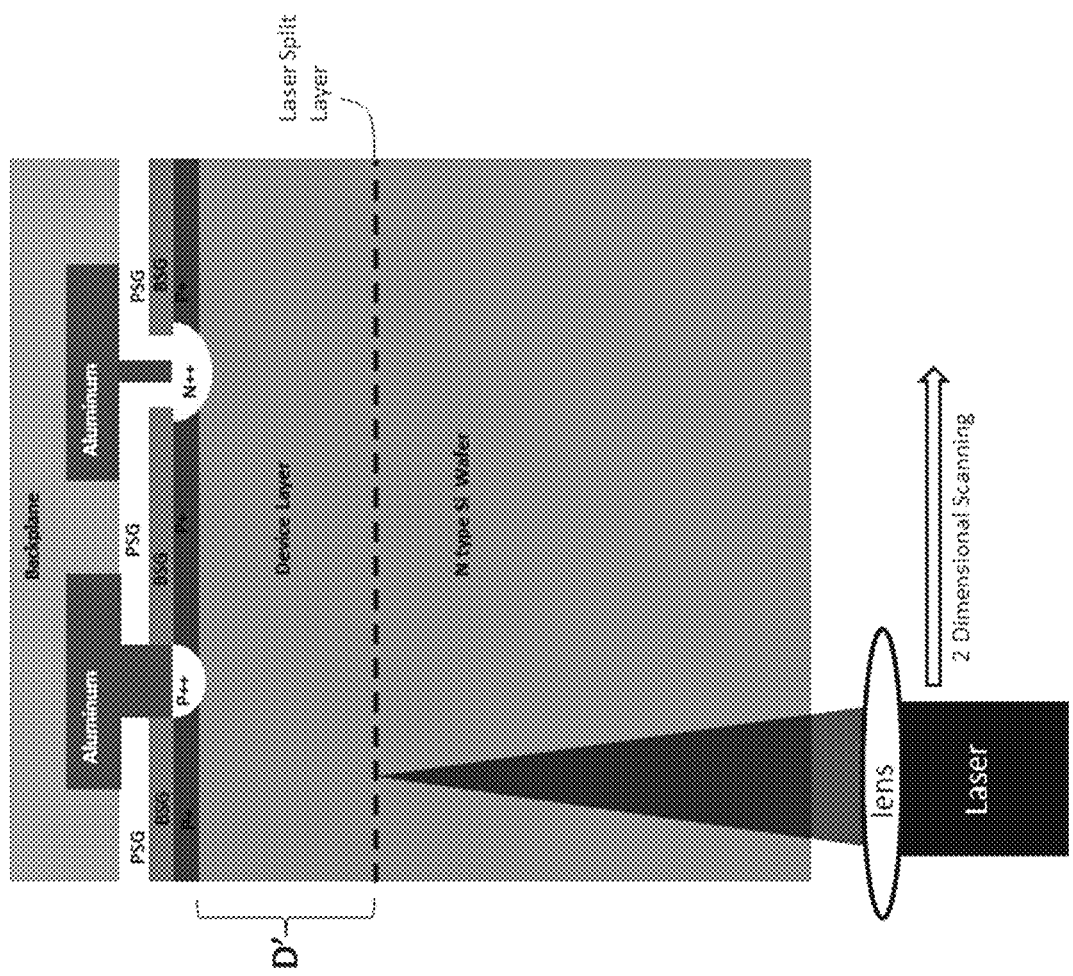

FIG. 9F shows laser splitting processing for forming a continuous crack region for the release of the device layer from the Si wafer. For example, a 1064 nm wavelength Nd: YAG laser may be used as the lightly doped silicon is transparent at this long wavelength in infra-red, in the normal and linear absorption regime. Alternatively, Nd: YVO4 laser, Nd: YLF laser and titan sapphire laser sources may also be used. The laser pulse length may be in the nanoseconds range. Laser beam transmittance is a strong function of thickness of the wafer as well as doping concentration, mainly due to the penetration depth of photons and free carrier absorption (which is also in linear absorption regime). The internal transmittance ranges from over 95% to 60% as Si thickness is changed and reduced to below 30% for heavily doped p+ silicon with concentration of $3\times10^{18}$/cm$^3$ in 1000 micrometer thickness. The laser beam is focused by an optical lens, with controlled depth of focus as well as focusing location set at just under the cell active layer/device layer at a desired layer thickness, for example 10 to 100 micrometer from the cell frontsite surface. An exemplary set of laser parameters for high throughput silicon splitting are provided below; however, these are provided for descriptive purposes and additional parameters may also be used, for example to provide higher throughput or form a more mechanically weak splitting layer. Assuming the starting material is n type phosphorus doped with $1\times10^{15}$ cm$^{-3}$, 1 mm thick MCZ wafer, 156 mm×156 mm pseudo-square (or full-square) shaped single crystalline silicon: laser output power in the range of 0.1 to 1.5 W; Q switch frequency in the range of 10 to 200 kHz; irradiation period in the range of 1 to 15 micrometers; scanning speed (stage moving speed) in the range of 10 to 1000 mm/sec; numerical aperture in the range of 0.3 to 0.9; lasing mode TEMoo; and spot size at focused in the range of 1 to 3 micrometers in diameter.

The focused laser is scanned bi-directionally all over the wafer from the backside of the cell surface, for example keeping the focused point set at 60-80 micrometers from the cell surface beneath Al electrodes (shown as depth D' in FIG. 9F). The defective localized sites, as depicted in previous figures, are induced by dense laser power using short nanosecond pulses by linear absorption and micro-cracks are formed at each laser shot site in the surrounded concentrated stress field. The micro-cracks are continuously interconnected, for example due to stress relaxation with or without external force, and form a bi-directional separation plane entirely over and within the wafer (the laser splitting layer). For example, the separation plane (laser splitting layer) may be in the range of 10 to 80 micrometers thick. FIG. 17 is a diagram of a tool embodiment which may be used to keep the focal point constant from the backside surface of the device processed wafer (in other words the side opposite the handler).

Figure 8B:
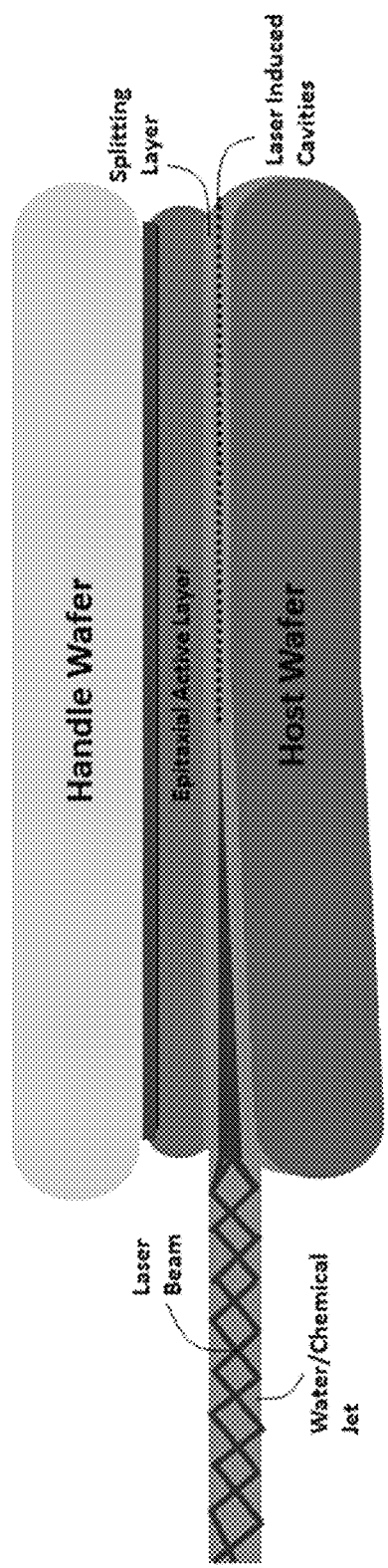
FIG. 8B is a cross sectional diagram showing release of a device layer from wafer along a splitting layer.

In one embodiment, the wafers may be clamped by separation holders placed on both the backside of Si wafers and the prepreg (backplane) over cells, as shown in FIG. 8A. The wafers are chucked by electrostatic force and vibrational motion is applied by switching the applied voltage polarity with 100 Hz (or another suitable frequency). Simultaneously, the holders produce vibrational shear stress by piezo actuators located at (c) in FIG. 8A. In some cases, collimated N2, gas (air), or water jet in 100 micrometer diameter orifice may be injected at the edge of the wafer at (a) in FIG. 8A. FIG. 8B is a cross sectional diagram showing release of a device layer from wafer along a splitting layer using a laser beam injected to the edge of the splitting wafers through the jet stream (for example diluted water or low rate etching Si solution, for example, HF/H2O2). The laser is penetrating inside the liquid jet-stream by total reflection optical mechanism. This may further reduce the laser splitting time for completing splitting the wafers into two parts: a cell layer backed by the prepreg handler and the rest of approximately 900 microns thick bulk wafer. Additional separation methods include heating the wafer above room temperature but lower than the temperature affecting any damage to the electrodes or by adjusting the lateral stress by tuning the material composition of the backplane handles. Thus, the wafers may be split without external mechanical stress or force, and using the internal stress accumulated at around the defective stress field.

Figure 9G:
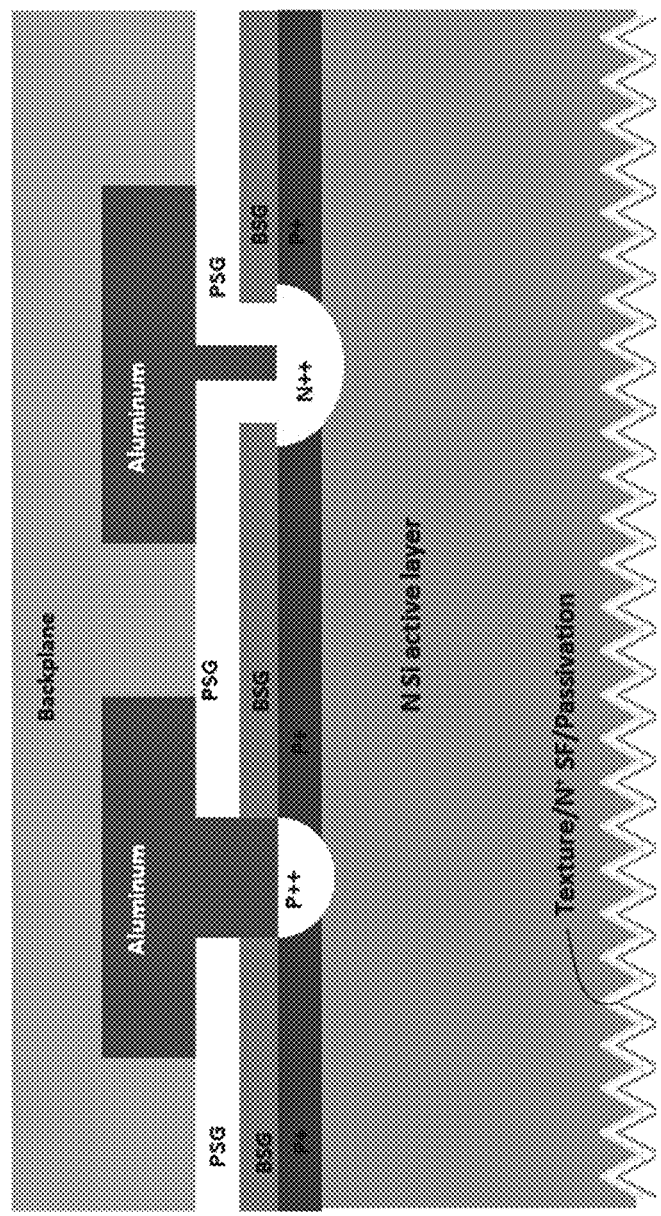
Figure 9H:
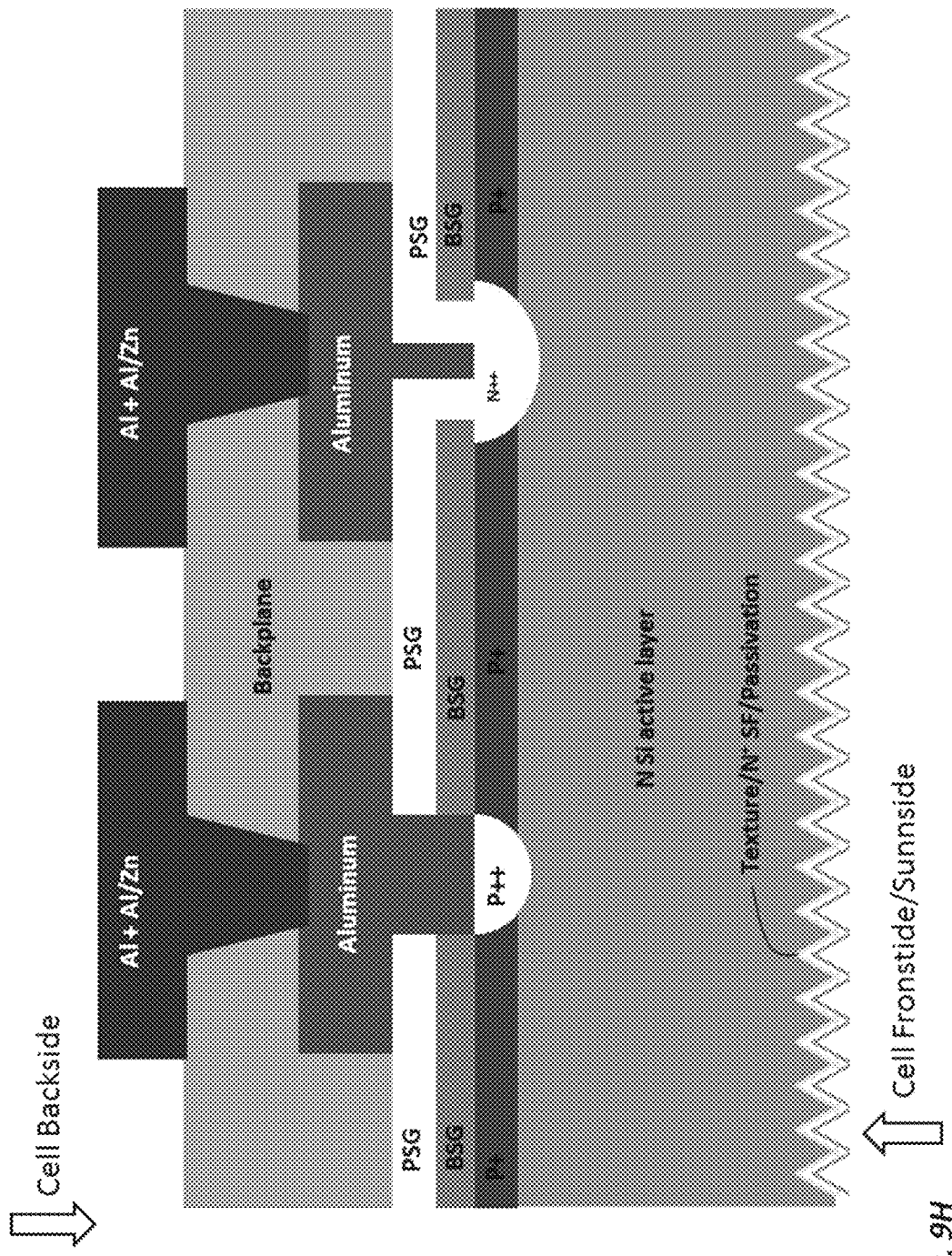

The resulting split surface may be as comparably smooth as a lapped silicon wafer and superior to a sliced wafer surface (a typical Si wafer surface after lapping has a surface micro roughness of Ra=0.5 um and P—V=5-10 um). The backside cell surface (backside surface of the released device layer) may then be etched in KOH solution to create texturing structure to enhance light capturing and blanket doping a shallow depth $n^+$ layer to form a front surface field layer (as shown in FIG. 9G). Chemical etching may reduce or eliminate laser damaged at the as-separated surface and interface. Subsequent process step may include passivation on the cell surface with $SiN_x$ to reduce the surface recombination velocity. Silicon nitride also serves as the anti-reflection coating (ARC) layer. Finally, prepreg backplane is laser drilled to form via holes through to Al electrodes, followed by patterned deposition of Al (and if necessary Al/Zn or Ni or NiV overlayers to cap aluminum; alternatively, copper may be used instead of aluminum) as shown in FIG. 9H. The cells are then ready for test and sort and module packaging.

The host wafer, now having a reduced thickness (for example 900 mm) may be reused and again processed to produce a second cell by the same manner after conditioning and cleaning the host wafer surface as needed. In order to minimize the kerf-loss of material of the wafer, optional hydrogen annealing may be applied to smooth out the separated surface up to the atomic level without any reduction of the thickness of the wafers by heating the wafer in to the range of 900-1100 degree C. in H2 ambient. In some instances, a specially designed furnace may be used for batch processing by carefully eliminating metal and moisture contamination inside of the furnace tube as moisture consumes Si by a chemical reaction resulting in thickness reduction of the wafer and Cu or Fe metal contamination degrades the wafer quality resulting in the poor cell performance.

For layer separation, the micro cracks induced by the strain energy reduction are connected through stress-relaxation macroscopically. Microscopically, atomic bond breaking is responsible for introducing micro-cracks. In a single crystalline solid, for example single crystalline Si, the tendency for easier material cleavage is strongly dependent on the crystalline planes. Generally, the highest packed atomic plane in Si is (111) and the distance between the planes is the longest among any other crystal planes. Therefore, the micro cracking and linking phenomena is enhanced along (111) plane. The (111) Si plane makes it easier to extend the micro-cracks laterally, by suppressing the vertical extension of cracks inside Si. This allows for placement of the laser shot period longer than the actual size of the micro-cracks (micro-cracks having a size of a few micro-meters) which can reduce the time to scan the laser beam over the large size of the processed wafers. Thus, this results in increasing the manufacturing tool throughput and reducing the laser splitting processing cost.

The wafer template may be reused multiple times to produce multiple solar cells until the remaining thickness of the wafer is too thin to process reliably with good mechanical yield (in some instances reuse stops once the template thickness is reduced to about 150 microns). Depending on the thickness of the original wafer and the laser splitting layers, the number of template reuse cycles may be anywhere from a few to tens of reuse cycles.

The above described solar cells are based on IBC (Interdegitated Back Contact) cell architecture. Alternative IBC cell embodiments are shown in FIGS. 10 and 11. FIG. 10A shows an IBC cell transferred onto a handle wafer (for example a glass substrate), a design applicable when the backplane structure (such as prepreg) is not enough rigid to support the cell during splitting process. Glass wafers are used for the handlers and are bonded to the top surface of the prepreg with UV sensitive adhesive before the final metallization through the prepreg. After backside laser splitting, texturing and other cell processing on the split back surface, and the cell is bonded on a transparent glass final carrier (handle wafer) with adhesive (in some cases adhesive not sensitive to UV light exposure). The handler is removed by UV irradiation from the top and released, followed by final metallization through vias formed in the prepreg. Thus, the handle wafers are applied as temporary support. Glass wafers coated with UV sensitive resist are bonded with the wafer backside, shown as Glass wafer in FIG. 10B, with Al electrodes on the cell frontside. Two beams of laser are simultaneously and bi-directionally scanned over the back surface to reduce the scanning time per wafer. The irradiation conditions may be similar to those described above. FIG. 10B shows the IBC cell of FIG. 10A after texturing, doping and passivating the back surface split from the rest of wafers, and the cell has been mounted on glass (shown as Glass in FIG. 10B) with CTE (Coefficient of Thermal Expansion) matched with Si and laminated with prepreg sheet followed by Al extracting electrodes through via holes drilled by laser.

FIG. 11 show an IBC cell transferred onto a Cu metal handler, as compared to a glass handler as shown in FIG. 10. A Cu metal handler may be a superior heat conductor as compared to glass, with less thermal conduction coefficient. Cupper handle plates (Cu Handler in FIG. 11A) are fusion bonded (soldered) with a copper plating surface (Solder) on the cell, as shown in FIG. 11A and the released device layer is shown in FIG. 11B. Cell processing steps consistent with those described above may then be performed.

Thinning the starting Si wafer may be useful for reducing kerf-loss, an added advantage in the cost sensitive market of PV cells and modules. Moreover, a thinner PV can potentially contribute to improve the cell performance as reducing solar cell (and device layer) thickness enhances the diffusion-length-to-cell-thickness ratio thus improving the overall cell efficiency. With adequate light trapping and good surface passivation, cell efficiency may peak in the 20-70 micrometer absorber thickness range.

Simulating Si cell efficiency as a function of cell thickness may show efficiency peaking around 40-50 micro-meter silicon thickness and reaching over 27% cell efficiency, surpassing by 3% the current record-highest cell efficiency in Si IBC cell of 24% (S. Bowden, Proc. $19^{th}$ workshop crystalline Silicon Soar Cells and Modules, Vail, Co, 2009, pp. 192-195). This insightful speculation may be extended to the standard bifacial cell architecture called PERC (a Passivated Emitter and Rear Cell structure) to provide impact on a bifacial cell structure as the generated carriers recombined larger in a bifacial structure than in IBC cells where the carriers, both holes and electrons, near the top surface are contributing to be extracted with both the base and emitter electrodes (located exclusively at the surface). This is because the back contact cells need to capture the carriers at the front surface by travelling the entire substrate thickness distance. On contrary, bi-facial cells may be relaxed due to the electrodes located at the both ends of the absorbing layer. Thus, a PERC cell may have a higher efficiency as compared to IBC cells in terms of the thin absorbing layer.

Figure 12B:
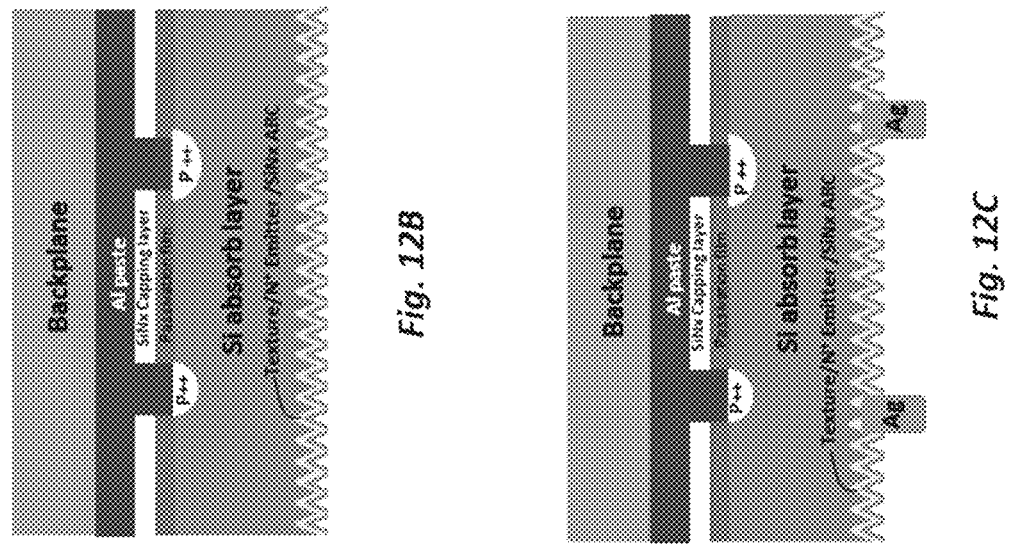
Figure 12C:
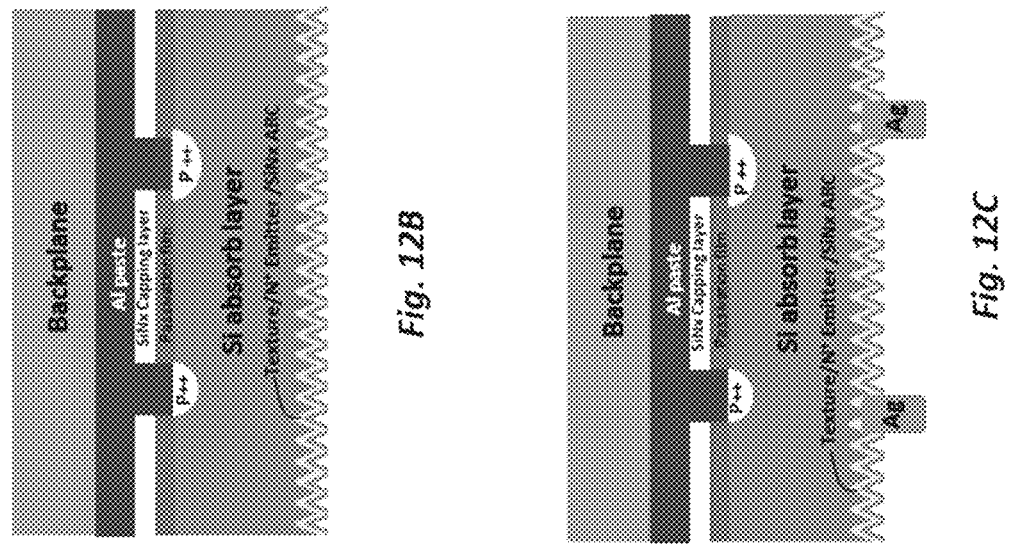
Figure 12A:
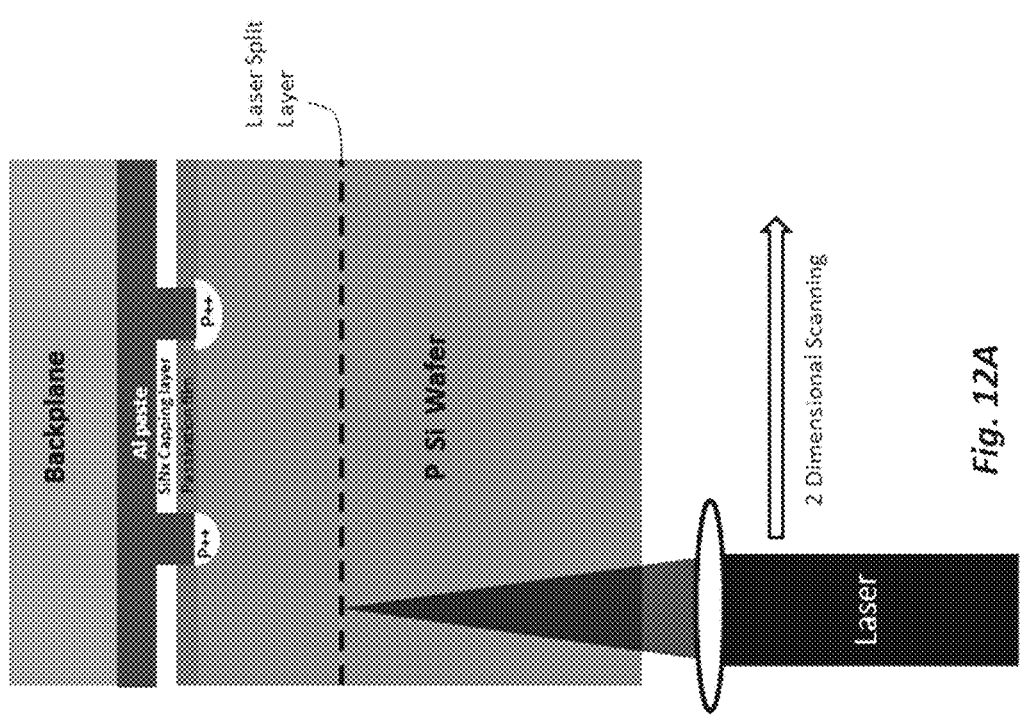

FIGS. 12A through 12C are diagrams showing a Si PV PERC cell with bifacial configuration formed by laser splitting. N type Si wafer is used for a starting material and doped N++ regions are formed with PSG (Phosphorous Doped Silicate Glass) followed by passivation and SiNx capping layer deposition. A backplane is bonded on the top of Al pasted base electrode and the wafer is split by the permeable laser focusing 50 micron deep from the cell top (cell backside) and 900 micro deep from the wafer backside (forming the cell frontside) as shown in FIG. 12A. After splitting, the split surface is chemically remove and textured simultaneously by KOH etching solution and a P+ blanket doped emitter is formed, followed by an anti-reflection coating (ARC), shown in FIG. 12B. Ag emitter electrodes are screen printed after SiNx anti reflection coat (ARC) is formed, shown in FIG. 12C. N-type MCZ Si wafers may also be used and in some instances may further improved cell performance as boron-oxygen pairs do not degrade the cell characteristics. The cell performance in thin PERC cell may exceeds a cell efficiency in the thick cells by about 1-2% due to less recombination in the middle of the cell structure in the thinner absorbing layer among other factors.

FIGS. 12D through 12F are diagrams showing a thin MCZ PV solar cell using an Si handler for forming a thin continuous Si cell with reduced warpage and cracks utilizing laser splitting methods. Base region of P++ is locally doped by BSG in the surface of n-type MCZ Si wafer and Al paste is screen printed on over the entire top surface of the wafer (wafer frontside) and through both the passivation layer and SiN capping layer on the Si wafer. A low cost Si wafer such as a cast poly Si wafer or quasi mono wafer is bonded with the host wafer of MCZ Si wafer using an Al pasted layer as a fusion bonding medium. The bonded pair is heated to several hundred degree C. to fasten the bonding strength. Lower temperature processing may also be used to bond the Si handle wafer, for example spin-on-SiO2 is span over the handle wafer surface and joined with the processed host wafer, which is followed by lower thermal annealing temperature than Al paste (structure shown in FIG. 12D). Laser splitting is carried out from the backside of the wafer at a depth of about 10's of microns (for instance, 60 micrometer) underneath the junction (in other words 60 micrometers from the top surface of the wafer) as shown in FIG. 12D. As both the host wafer and handler are silicon, warpage and crack propagation is reduced or minimized after-splitting is completed due to matching coefficient of thermal expansion. The splitting PV back surface is textured by a chemical etching followed by P+ blanket doping for the emitter junction with passivation. SiNx anti reflection coat (ARC) covers the whole back surface of the cell (separated cell structure shown in FIG. 12E). Final metallization is carried out on both cell surfaces as shown in FIG. 12F. Al extracting electrode is deposited on the cell backside and provides conductive plugs through via holes in the handle Si wafer to the first Al paste layer without any insulating wall inside the vias in Si. Ag is screen printed in fingers through the surficial insulating films on the cell frontside. Si MCZ (Magnetic applied during CZ-pulling) wafers may have lower oxygen in Si crystal than conventional CZ Si wafers and a higher minority carrier life time as compared to FZ (Floating Zone)-Si. Moreover, by thinning (for instance, to 10's of microns, such as about 20 microns to 80 microns and more specifically around 50 microns thick) such high-life-time material may increase effective carrier life time and raise cell efficiency by 1-2% due to less probability of recombining photo-generated carriers as compared to thick bulk Si. The higher cost of MCZ wafer usage may be compensated by multiple reuses of the host wafer, for example 10 reuses producing 10 cells per starting wafer.

FIGS. 12G through 12I are diagrams showing a thin CZ hetero-junction PV solar cell using an Si handler for forming a thin continuous Si cell with reduced warpage and cracks utilizing backside laser splitting methods. FIG. 12G is a cross-sectional diagram of the thin CZ hetero-junction PV solar cell during backside laser splitting layer formation. FIG. 12H is a cross-sectional diagram of the cell after release also comprising cell frontside layer A comprising, from cell backside to frontside, a P+ amorphous Si layer on a SiNx ARC layer on a transparent conductive oxide layer. FIG. 12I is a cross-sectional diagram of the cell after backside (Al+Al/Zn or Al+NiV) and frontside (Ag) metallization. The Si bifacial PV cell shown in FIGS. 12G through 12I may be used to reduce cell processing temperature by introducing amorphous Si hetero junction onto the thin N type Si absorber. Low temperature processing may be particularly important for thin Si PV because thin Si mono crystalline cell layers tend to warp, chipping and cracking macroscopically. Microscopic slip lines and dislocations are introduced into the crystalline lattice leading to degradation to the minority carrier life time. In some instances, the highest processing temperature may be reduced in hetero junction cells with amorphous Si by several hundred degree C. to 200-300 degree C., in contrast with the single junction cell depicted in FIGS. 12D through 12F which may require activation anneal for the dopants for base and emitter formation. Transparent conducting oxide such as Indium Titanium Oxide (ITO) is applied for the emitter that is connected with silver front finger electrodes by screen printing method as shown in FIG. 12I. Amorphous Si contains a large amount of hydrogen atoms in the material during deposition and the hydrogen plays a role in passivating and terminating the dangling bonds at the interfaces of the thin CZ mono-crystalline Si absorber. A well-tailored surface may reduce the surface recombination velocity that is necessary to boost the cell efficiency by combining the effect with thinner Si absorber CZ by reducing the recombination probability with high minority carrier life time in the bulk Si. It may desired for the Si absorber to have a longer carrier life time. It is well known carrier life time may be strongly dependent upon the oxygen content that is incorporated from the silicon dioxide crucible in which Si is melted for CZ crystal pulling growth of Si ingots. On the contrary, Floating Zone (FZ) Si mono crystalline material may provide a higher minority carrier life time because the crystal growth may avoid oxygen incorporation from the crucible which is not necessary for FZ crystal growth. MCZ Si is a new class of longer carrier life crystal growth in which oxygen content is suppressed by applying magnetic field during Si growth for stabilizing the molten Si flow inside the crucible. Both FZ and MCZ Si have minority carrier life times over one millisecond which in some instances is higher than other crystalline growth in Si such as epitaxial growth and quasi-mono Si (seeded re-solidification.) In combination with other considerations, a high carrier life time may be desired to increase efficiency in a Si PC. In some instances, productivity of as FZ Si wafer may be inferior to MCZ Si wafer; however MCZ may be economically favored over conventional CZ Si wafers. In this case, the cost of MCZ can be compensated by multiple reuses for solar cell fabrication.

The disclosed solar cell fabrication systems and methods are aimed to manufacture high efficient photovoltaic cells with low cost by transferring compound semiconductor cell layers on dissimilar substrates (from a starting wafer/host template to a handler/backplane) with micro cracks generated by laser irradiation at a splitting layer formed underneath the active cell layer. In one embodiment, active cell layers are epitaxially grown over mono crystalline host wafers with splitting layers formed between the active layers and the host wafers. After processing the cell structure with electrodes on the surface of active layers (cell backside), the cell is bonded with another substrate such as a handle wafer or backplane. Laser beams are focused at the middle of the splitting layers from the backside of the host wafers to form and propagate a splitting layer.

Alternatively, the semiconducting materials of active layers may comprise one or a combination of GaAs, InGaAs, AlGaAs, GaN, and InGaP and the host/starting wafers may be made of GaAs and Ge, which may preferably have identical or closely matched atomic lattice spaces as the active compound semiconductor layers (for reduced dislocation density). The handle wafers may be formed of the elemental semiconductor material Si which may further have use in bottom/backside electrode structure of the cells; however, other materials such as metal, ceramic, polymers or plastics may be used as handler wafers instead of Si. The laser-split semiconductor layers and donor wafers provide and serve two primary functions: one is to absorb laser light to generate the micro cracks within the donor wafer, and the other is to be etched off selectively against the active semiconductor layers and the host or donor wafer materials (by selective removal of the laser splitting damage from the surfaces of the separated layer and host wafer surfaces) in order to protect the active layers from being damaged by laser irradiation and propagation of laser splitting microcracks. The laser-split layer should be able to be etched (for selective removal of laser splitting damage from the surface of the layer) while preserving thickness uniformity of the active device layer as designed during epitaxial growth as well as to smooth and flatten the surface by removing or mitigating surface micro-roughness and damage. These functions may be particularly crucial for compound semiconductor based solar cells as these types of materials may absorb solar light within relatively thin layers (for example on the scale of only a few microns absorber thickness, since the desired compound semiconductor absorbers such as GaAs, are direct bandgap semiconductors). In some instances, elemental semiconductor solar cells made of silicon absorber may require an active layer thickness of tens of micrometers to absorb sun light (since silicon is an indirect bandgap semiconductor material). These laser-split layers should also have a similar or close lattice match to both the active layers and the host or donor wafer materials, and AlAs, AlGaAs or Ge donor wafers may be used for this purpose. Laser wavelength for laser splitting process may be selected by permeability in the host or donor wafers, if irradiated from the donor wafer backside (the side opposite the device side), thus, the laser may be focused inside the laser-split layers after going through the host or donor wafers from the backside (the side opposite the device side). Linear and multi-photon-nonlinear absorptions are responsible for the selective absorption at the focal point in non-linear fashion. This peculiar phenomenon takes place at the highly focused, dense energy region that is concentrated at a small micro-scale site even in a transparent matrix of material.

In some instances, solar cells made of compound semiconductor materials may provide superior performance to Si elemental semiconductor materials due to the difference of carrier generating, transporting, and recombining modes (direct or indirect) resulting in higher light absorption and increasing efficiency in the compound semiconductor (such as in GaAs) as well as photon re-generating after recombining the carriers.

Another advantage to using a thin layer of compound semiconductor (such as GaAs) is photon confinement and its recycling based on radiation recombination of their carriers. However, cost of compound semiconductor cell is usually higher than a Si cell in large part due to the higher material cost of the starting wafer and by epitaxial junction formation using high cost metal-organic gases with sophisticated growth machines such as MOCVD (Metal Organic source Chemical Vapor Deposition). To mitigate these costs, reuse of the starting compound semiconductor wafers after transferring the thin cell layers onto dissimilar and low cost wafers like Si or metals (or polymeric sheets) may be critical. Additional mitigation measures include decreasing energy consumption during cell processing. And while device layer transferring methods have been sought for transferring an Si layer by forming micro cavities in Si by using porous Si or hydrogen ion implantation and for transferring compound semiconductor layers by lateral selective etching an AlAs intervening layer between GaAs substrate and the active epitaxial layers with the aid of mechanically bowing the over layer, these methods suffer from several limitations including cost, throughput, and structural disadvantages.

The laser processing methods and apparatuses disclosed herein are applicable across a wide variety of device layers deposited or formed on semiconductor wafers such as SiC, SiGe, GaAs, GaN, InP, AlGaAs, and AlGaN. The laser processing methods and apparatuses disclosed herein may also be applied to an electrically insulating sapphire substrate of Al2O3 on which Si, GaAs, GaN and related compound semiconducting active layers are epitaxially overgrown and processed to fabricate electronic and optical devices. The devices which can be fabricated using the released device layers in accordance with the disclosed subject matter include photovoltaic (PV) cells, optical devices for light emitting diodes and lasers, and combinational integration for optoelectronics and LED solid-state scanning array, and semiconductor on insulator (SOI) wafers.

Currently, a whole area of epitaxially grown GaAs single junction layer over a 2 inch diameter GaAs wafer has been successfully peeled off by selective wet chemical etching (which is a very slow process) of AlAs interlayers inserted in-between the host or donor wafer of GaAs and the active junction layer by bowing the thin layer using mechanical force (see J. J. Schemer et al. reported an article entitled by "Photon confinement in high-efficiency, thin-film 3-5 solar cells obtained by epitaxial lift-off" in Thin Solid Films 511-512 (2006) page 645-653). In the Schemer article, a transparent plastic flexible carrier was used to support the thin layer. However, even after increasing lateral selective etching rate by opening the interfacial inlet area for HF selective etchant to penetrate into AlAs small cross sectional area, the rate was still 1 to 30 millimeter per hour. The separated film on the plastic carrier was warped, to the extent of being visibly curled, after releasing the host wafer of GaAs which was then processed with metal electrodes and bonded onto a glass handle substrate. A cell efficiency of 24.5% was achieved for single junction cell in an active area of 2 cm$^2$ as compared to 24.9% obtained by processing a bulk (large area) cell using the same process—the increase in efficiency was claimed to be a result of photon confinement in the thin film absorber using a reflector.

Brendan M. Kayes et al. disclosed a paper entitled by "27.6% conversion efficiency, a new record for single-junction solar cells under 1 sun illumination" in the proceeding of IEEE PVSC Photovoltaic Specialists Conference (PVSC), 2011 37th IEEE Page 4-8. They extended the above work to the highest efficiency of over 27% for world record at that moment in an area of 1 cm$^2$ and such performance was attributed to photon recycling mechanism that allowed the recombining carriers to reemit radiating photons and to have a second chance to generate photo-generated carriers.

Further, a method for transferring a thin silicon layer by delamination with hydrogen ion implantation into Si wafers, creating micro cavities to be connected following annealing (400-600° C.) after bonding with a handle silicon wafer has been attempted. (see M. Bruel, Electronics Letters, vol. 31, no. 14. 1995 page 1201). In the Bruel work, high dose hydrogen ($2 \times 10^{16}$–$1 \times 10^{17}$ cm$^{-2}$ at 100 KeV implantation energy) was implanted at shallow depth from Si wafer surface. Annealing at over 1000 degree C. recovered crystallinity (for the region which was heavily damaged by high dose implantation) after delaminating the sacrificial Si layer bonded onto another oxidized Si wafer. A final step included polishing the transferred Si surface. The ion implanter had to be specially designed for mass selecting and filtering heavy metal ions and other molecular ions included along with the main hydrogen ions, which resulted in increased cost and size of the tool. This technology has been applied to a sub-micrometer thin Si on insulator material for high speed and low energy consumption CMOS applications.

The technology has been extended to increased delaminated/released silicon layer thickness, for example up to 10 micron thick, by raising the acceleration voltage up to 750 KeV with a dose of $1.8 \times 10^{17}$ cm$^{-2}$ sec$^{-1}$ at 30 mA cm$^{-2}$ (see M. Hanada in Journal of Plasma Fusion Research, vol. 78, No. 6 pp 541-547, 2002, "Evolution of Particle Beam Technique Applications of Beam Technology to Material Industry"). However only a small area, about 10 mm square shaped 10 micro-meter thick fragments, was produced.

A 1.2 MeV high voltage and high current (100 mA) hydrogen ion implanter was developed to slice a 20 micrometer thick Si layer for solar cell application. This large size tool could produce 156 mm pseudo square shaped Si thick layers for photovoltaic cells. However, substantial implant damage was generated which would have to be annealed out by thermal annealing and/or other methods and the cleaved silicon surface would have to be smoothed by removing the damaged sacrificial layers on both the sliced layers and rest of the donor wafer. (see US patent 2009/0197368 filed Aug. 6, 2009 by Srinvasan Sivaran et al.). A similar approach using hydrogen induced micro cracks in compound semiconductors were reported in ECS Transactions, 33 (13) pages 177-187 (2010). GaAs, InP and GaN layers were separated with hydrogen ion implantation, however none of the devices have not been reported using this method presumably because of its heavily damaged layer by a high energy and a high dose implantation.

Detailed depictions of laser processing relating to semiconductor compounds is shown in FIGS. 13 through 16, which show single to triple junction GaAs solar cells over Si in conjunction with homo and hetero junction designs. In some instances, a difference for solar cells by compound semiconductors as compared to Si cells is the thin cell layer thickness to absorb sun light (in some instances it may be approximately one tenth thinner for the compound semiconductor cells than Si cells, for instance, about 1 to several microns for a compound semiconductor such as GaAs vs 20 to 80 microns for silicon cells). Thus, the laser splitting accuracy, in other words the splitting position uniformity in the splitting layer may be one tenth tighter than in a thicker cell layer such as Si. Uniformity in splitting position may be determined by deviation at the focal point in the host wafer which is dependent on laser fluctuations mainly in power, wavelength and wafer stage movements.

Junctions and doped regions in the compound semiconductor device may be formed by deposition of multiple thin (micronmeter thick) epitaxial layers. Thus, laser splitting accuracy should be strictly implemented to prevent damage to the thin active layers. In accordance with the disclosed subject matter, relatively thick splitting layers (in some instances, splitting layers may also be referred to herein as protective layers as they "protect" adjacent layers from damage during the splitting process), with capability for protecting the laser-split surfaces when laser irradiated (and the splitting layer is split by creating and propagating micro cracks two dimensionally/bi-directionally within a cleavage crystallographic plane) are provided. The interfacial splitting layer residue (and damaged region) may then be removed by high selectivity wet etching (for example etchants with several orders of magnitude selectivity for removal of the damaged region) so the precisely tailored and pre-determined active layer thickness and uniformity are preserved. Furthermore, the residual defects and cracks generating dangling bonds may be chemically (and gently to preserve device structure) and selectively removed within the splitting/protective layer for the active device layers. In some instances, compound semiconductor thin layers may be extremely brittle (for example, mechanical splitting along the splitting layer may cause crack propagation into the active layers); thus the compound semiconductor thin layers (the active layers) have to be protected very carefully during the laser splitting process.

Alternatively, relatively gentle/soft selective etching may be used to separate the device layers (active layer) from the host wafer. In one embodiment, a jet stream of selective etchant is injected into the side of the bonded pair of wafers at the splitting layer after introducing and forming laser cracks within the splitting layer, such as micro pores and cavities discretely distributed within and along the splitting layer. Selective etching may be used to connect the micro spaces until wafer splitting occurs without substantially bending the wafer mechanically (which may in some instances occur during mechanical or water jet injection release). As described with reference to FIG. 8A, laser abrasion mechanism may be added to liquids wedge injection (for example, using water or an etchant) from the edge of the wafer pair in order to enhance the splitting and separation throughput. Stress-induced delamination after laser irradiation may also be induced by thermal expansion difference between the host (donor) and handle wafers, which may be further accelerated by heating or cooling the bonded pair. After splitting/layer separation/wafer release, the splitting layer residue material may be removed by using a highly selective etching without degrading the thickness uniformity of both the active layer (separated device layer) and separated host/donor wafers, as well as preserving the surface flatness of both surfaces along the splitting plane to ensure device layer geometry as well as a high quality host wafer (starting wafer) for reuse in subsequent device layer formation (such as epitaxial growth over the host/donor wafers through multiple donor wafer reuse cycles).

Compound semiconductor solar cells structures and fabrication processing methods are depicted in the cross-sectional diagrams of FIGS. 13 through 16 for a variety of cell embodiments with different active layer junction types. The starting host may be materials such as GaAs, Ge, SiC and sapphire wafers. Commonly commercially available GaAs wafers may often be restricted in size, for example with a diameter below than 6 inches, while Ge, SiC and sapphire host wafers may be commonly commercially available with a diameter up 8 inches. The wafers may be in various geometric shapes including square shaped for the module assembly; however, the wafers may also be round as they are often commercially formed a round shape during the ingot crystal growth. After device layer processing, for example, using epitaxial growth on a host/donor wafer, the subsequently formed round shape cell may be laser treated using a permeable laser focusing inside the handle/host wafers in accordance with the disclosed subject matter and producing negligible to zero debris, particles and kerf loss. Generally, laser abrasion is driven by surface abrasion with the laser incident at the surface, and is not concentrated inside the solid by focusing the permeable laser at an internal focus point.

Further, as multiple device layers may be separated using laser splitting and separation from a single donor wafer, it is possible to produce a plurality of solar cells by splitting the cell device layers for transfer onto multiple handle wafers. In some embodiments, epitaxial layers are grown over the host/donor wafers for the active device layers with doping in vapor phase by MOCVD (Metal Organic Chemical Vapor Deposition). The epitaxial layer thickness may be in the range of up to a few microns (for instance, from about 1 micron up to about 5 microns), sufficient to absorb solar light. In some cases this may produce device absorber layers approximately one tenth thinner than the Si solar cells, although the price of a GaAs wafer is substantially (at least ten or 10's of times) higher than a Si wafer. The splitting layer may be inserted between the active layers and the host/donor wafers with relatively larger thickness for confining the splitting waviness containing defected region as compared to device layer formation using a silicon wafer as described above. The splitting layer thus is used to protect the active and host wafer surfaces after laser splitting. The splitting layer residue on the active and host/donor wafer surfaces may be chemically etched using a selective wet etchant. For example, layers of materials such as AlAs, InGaAs, Ge layers having a thickness in the range of about 1 micron up to 5 microns may be used as splitting layers based on characteristics such as a close lattice match of the active layers and the host/donor wafers, laser beam absorption, and selective etching ratio.

Figure 13B:
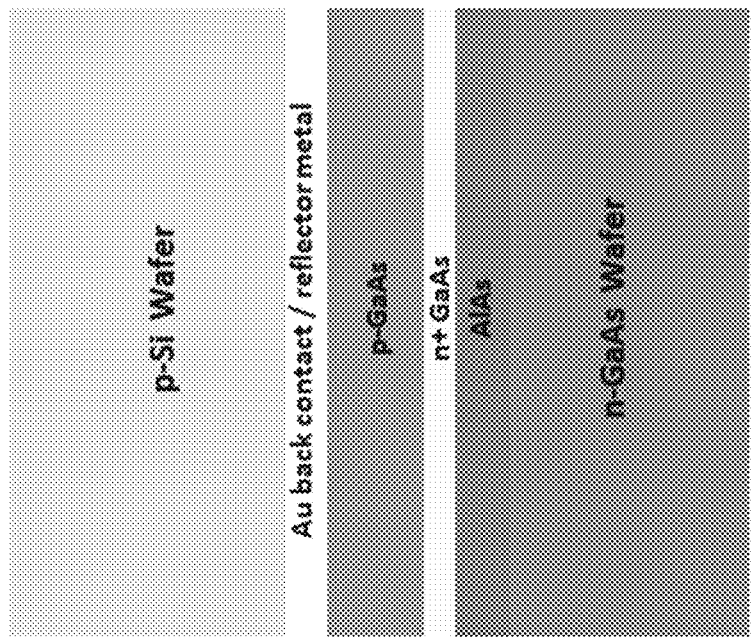
Figure 13A:
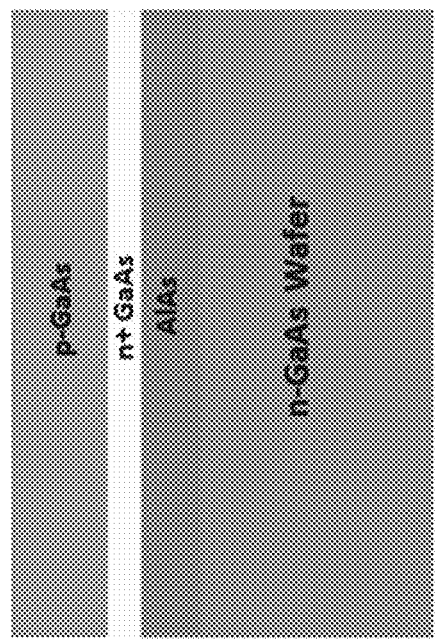

FIGS. 13A through 13F are cross-sectional diagrams depicting the formation of a single junction GaAs device layer solar cell transferred onto a Si wafer handler. As shown in FIG. 13A, n-type GaAs wafers (for example a round 6 inch diameter or a square wafer) may be used for formation of single homo-junction PV cells. An AlAs layer (for example having a thickness in the range of about 1 to 20 microns) is epitaxial grown over GaAs host wafers as a splitting layer. The cell process starts with fabrication of a PN junction by growing GaAs active layers doped by Zn and Si to form n+ type GaAs and p type GaAs layers for use as a single homo-junction solar cell. Then Au or another reflector/conductor metal (such as Al) may be deposited over the top layer of p-type GaAs and bonded with a p-type Si wafer (for cell support and transfer) doped with boron impurity to reduce the resistivity lower than 0.1 ohm-cm to form an ohmic contact with Au by annealing in a furnace at a temperature lower than the eutectic point, as shown in FIG. 13B.

Backside laser processing is applied to split the GaAs layers, for example a 1064 nm wavelength Nd: YAG as GaAs is transparent at this long wavelength in the normal and linear absorption regime. Alternatively, Nd: YVO4 laser, Nd: YLF laser, and Titan sapphire laser sources may also be used. Laser beam transmittance is a strong function of thickness of the layer as well as doping concentration due to the penetration depth of photons and free carrier absorption (which is also in the linear absorption regime). The laser beam is focused by an optical lens, at a controlled focus depth and the focusing point may set in the center of the AlAs splitting layer just under the solar cell active layers from the back surface of GaAs host/donor wafer, as shown in FIG. 13C. Laser irradiation from the back surface favors (in other words interferes with) neither the absorption nor the reflection layers formed on the surface of the host/donor wafer as seen in FIG. 13C. Representative laser irradiation conditions may include, for example: laser output power in the range of 0.1 to 1.5 W; Q switch frequency in the range of 10 to 200 kHz; irradiation period in the range of 1 to 10 micro-meters; scanning speed (stage moving speed) in the range of 10 to 1000 mm/sec; numerical apertures (NA) in the range of 0.3 to 0.9; lasing mode $TEM_{00}$; and spot size focused at 1 to 3 micrometers in diameter.

The focused laser is scanned over the GaAs host/donor wafer (in other words two-dimensionally or bi-directionally) from the backside keeping the focused point set at the middle depth/thickness of the AlAs layer. Defective sites are induced in plane as the laser beam is scanned, while providing high-density laser power using short laser pulses by linear and/or nonlinear absorption, and the irradiated spots are continuously interconnected by placing the sites contacting each other or in some period which may linked or interconnected through microcrack propagation after processing, resulting in a defective separation crystallographic plane/layer. This crystallographic plane/layer generates some strong internal stress field around the laser splitting defect sites within the donor wafer.

Figure 13F:
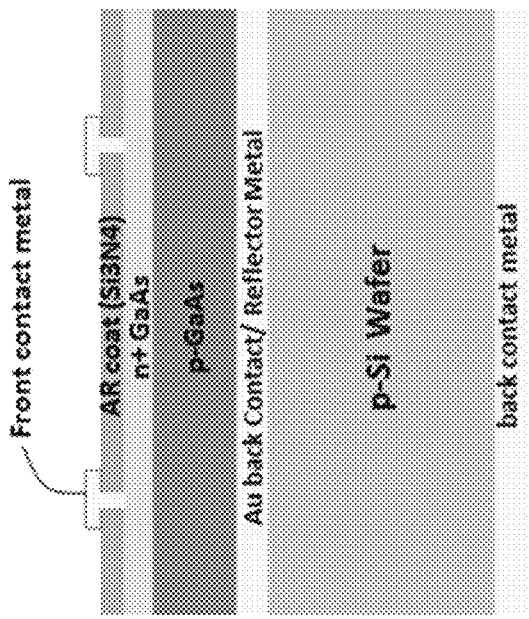
Figure 13E:
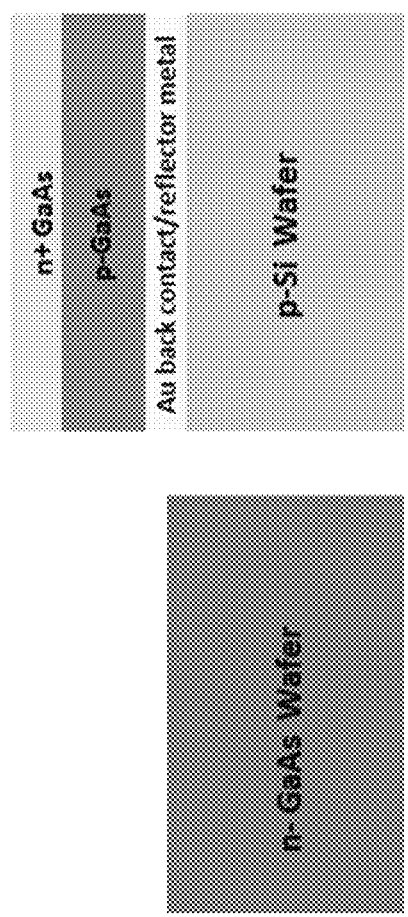

After irradiation, the bonded pair wafers are separated. For example by clamping the wafers with the separation holders placed on both the backside of the pair wafers. The wafers are chucked by electrostatic force and vibrational motion is applied by switching the applied voltage polarity with, for instance, about 100 Hz (or another suitable frequency over the range of a few Hz up to several kHz). Simultaneously, the holders may produce vibrational shear stress by the piezo actuators. In some cases, collimated gas or diluted water jet in 10-100 micrometer diameter orifice are injected at the edge of the wafer at the laser split layer. Laser abrasion may be applied by injecting the laser beam through the water jet or selective etching chemical jet stream, as described previously. In some cases, annealing or cooling may induce interconnection of the small cavities discretely formed by the laser focusing/splitting process (annealing temperature may be selected to minimize the inter diffusion of the dopants in the cell junction) which may reduce the completion time to split the bonded pair into two parts: a cell layer backed by the Si handler and the other host/donor wafer of GaAs, separated/transferred cell and host wafer both shown in FIG. 13D. As shown in FIG. 13C, the waviness/non-uniformity of the cleaved surfaces is confined within the splitting layer. Both the n+ GaAs device layer and the n− GaAs wafer surfaces may be roughened as a laser irradiation period is increased and thus are protected by the residual AlAs or Ge layer, as shown in FIG. 13D. Residue of the AlAs layer on both the host wafer and the released GaAs device layer may be selectively etched off, for example, using an HF solution providing a very high selectivity of $10^6$ against both a GaAs layer and a host/donor wafer, as shown in FIG. 13E. The host/donor wafer is now ready for reuse and the cell/device is ready for additional solar cell processing. After depositing a $Si_3N_4$ anti-reflective coat (ARC) on n-type GaAs surface, frontside metal grid electrodes may be formed through via holes in the insulating layer, as shown in FIG. 13F. Backside metal contacts on the Si handle wafers may be formed by Al or Ag paste. Further, before depositing a cell frontside antireflection coat, the GaAs surface may be roughen to collect more light. Alternatively, W/Cu metal or a plastic or a prepreg plate may be used as a handle wafer instead of Si as shown.

Figure 14B:
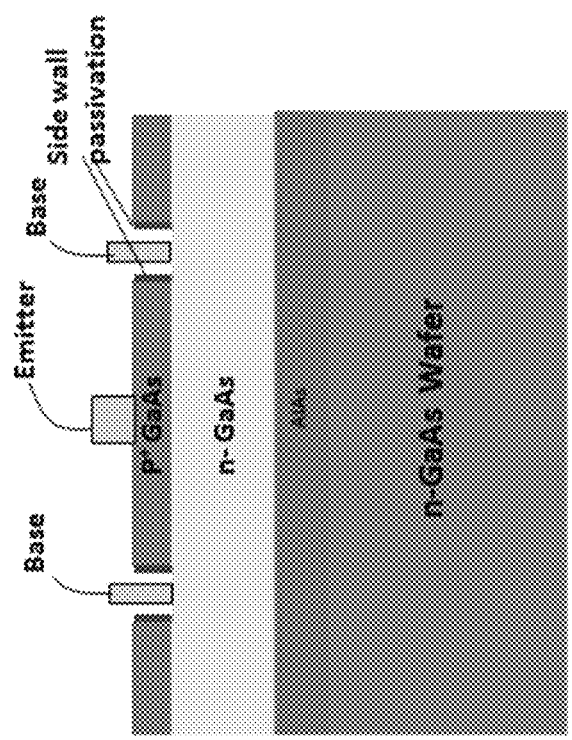
Figure 14A:
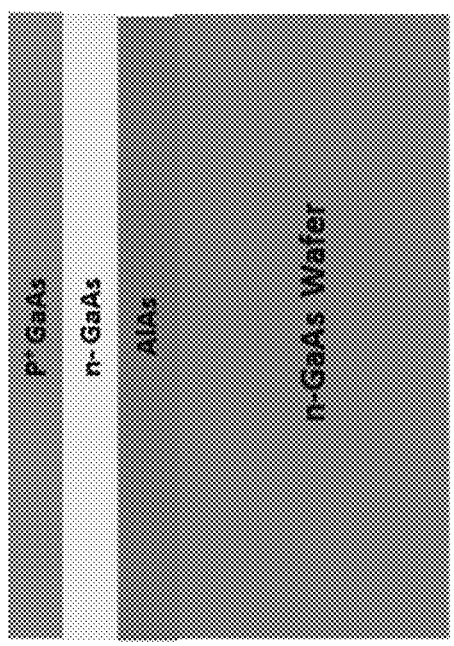
Figures 14C, 14D:
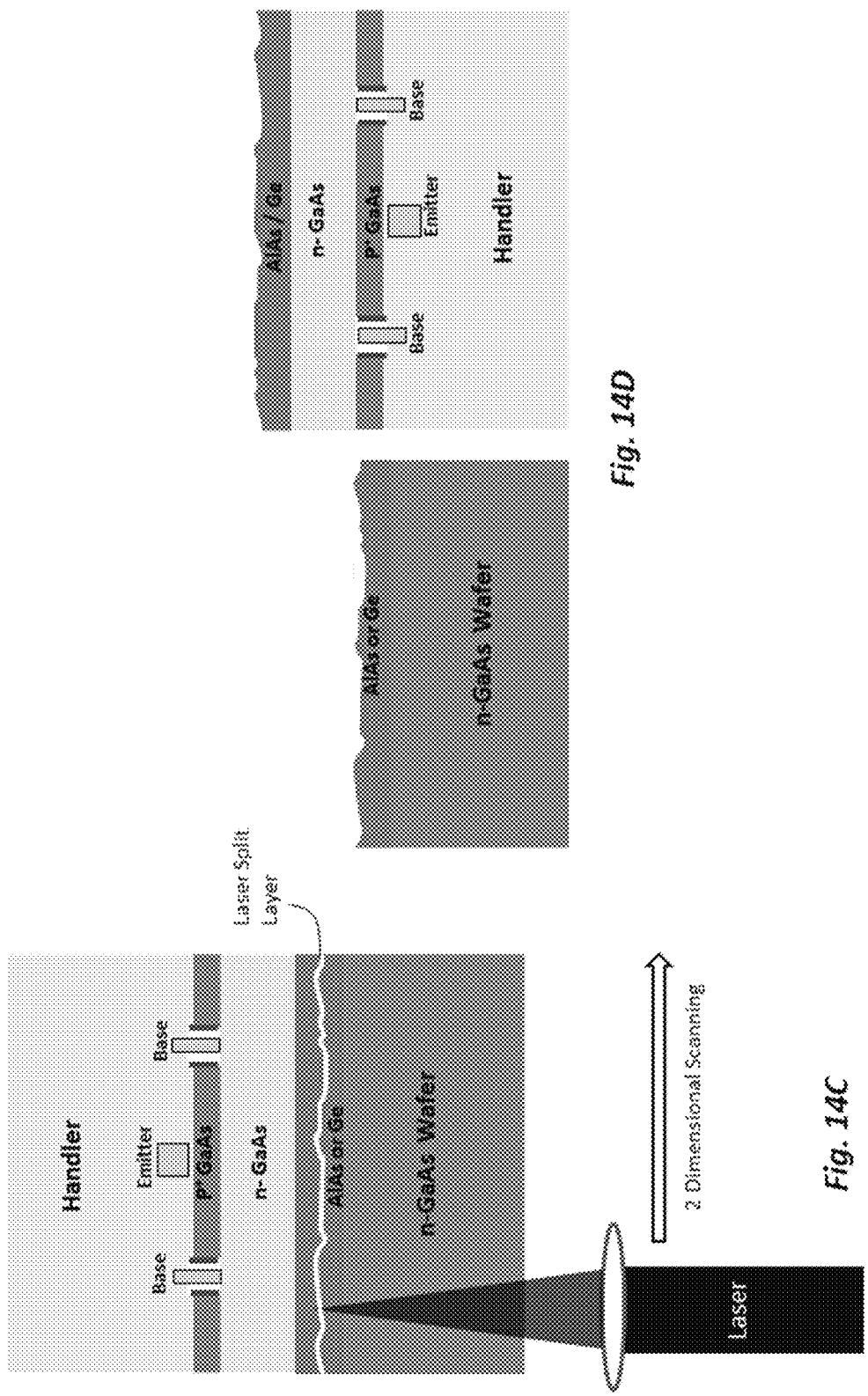

FIGS. 14A through 14F are cross-sectional diagrams depicting the formation of a single junction GaAs device layer solar cell transferred onto a plastic sheet handler. In the embodiment shown in FIGS. 14A through 14F, the metal contacts are formed over a top surface of an epitaxial PN single junction over GaAs host/donor wafer with an intervening lattice matched layer of AlAs or Ge, as shown in FIG. 14A. The active device layers (p+ GaAs and n− GaAs) may be a few micrometers in thickness, for example 1 to 5 microns, sufficient to absorb sun light and generate carriers to reach the electrodes, due to photon recycling phenomena, radiative recombination. After forming the contact vias from the surface and through a p-type GaAs top layer to the surface of a n− GaAs bottom layer, the sidewalls of the via hole may be passivated with insulators such as SiN or Si-oxide and base and emitter metal electrodes are deposited and patterned in isolated fingers, as shown in FIG. 14B. A handler is bonded with the top of the finger electrodes, for example by using adhesives, and laser splitting is carried out from the bottom side of a host wafer of GaAs by scanning the laser beam spot over the wafer back surface, as shown in FIG. 14C. The laser beam is permeable through the wafer and is focused within the intervening layer of AlAs or Ge. The strain field is created at the focal points leading to micro cavities and/or small cracks connected along the laser beam scanning direction. As a result, the cracks propagate in plane bi-directionally over the entire wafer, as in shown by the laser split layer in FIG. 14C. The crack propagation separates the connected pair into the two parts: the active epitaxial single junction layers backed with the metal electrodes supported by the handler sheet/wafer and the starting donor wafer of GaAs as shown in FIG. 14D. Both the n− GaAs device surface and the n− GaAs donor wafer surface are covered and protected by a sacrificial layer of AlAs or Ge, with the separated structures shown in FIG. 14D. The over-layer (residue of the sacrificial layer of of AlAs or Ge) may be selectively etched, for example, using a chemical solution or dry etching with gas phase XeF2, removing the AlAs or Ge selectively from the GaAs layer surfaces. In some instances very high etch selectivity reaching about $10^6$ times faster etching rate for the AlAs layer by HF chemical etching can be achieved.

In some instances for etch-based separation (such as non-laser splitting methods), the lateral etching rate may reach up 9 mm/hour which is still too slow for wafers which are at least several inches in diameter to etch off the Ge intervening/sacrificial layer sandwiched with the bonding pair of Si/GaAs/Ge/GaAs for etch separation initiation. However, based on the methods of this disclosed herein, selective etching of Ge is vertically applied after separating the bonded pair by laser splitting, in order to complete the device layer on handler transfer and reuse the starting host/donor wafer for another device layer formation, for example by another epitaxial growth.

Figure 14F:
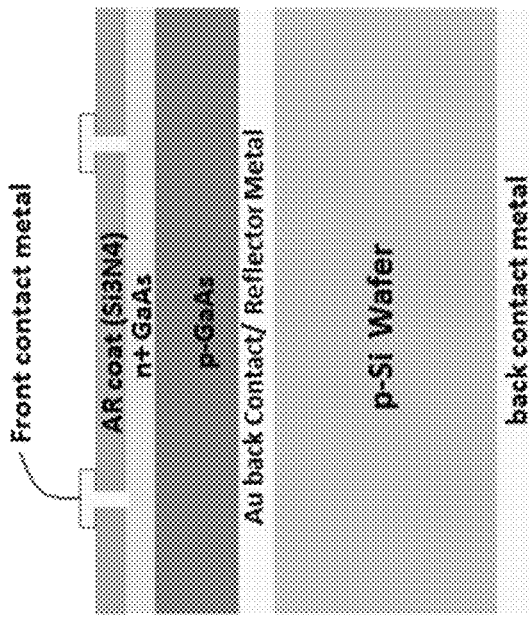
Figure 14E:
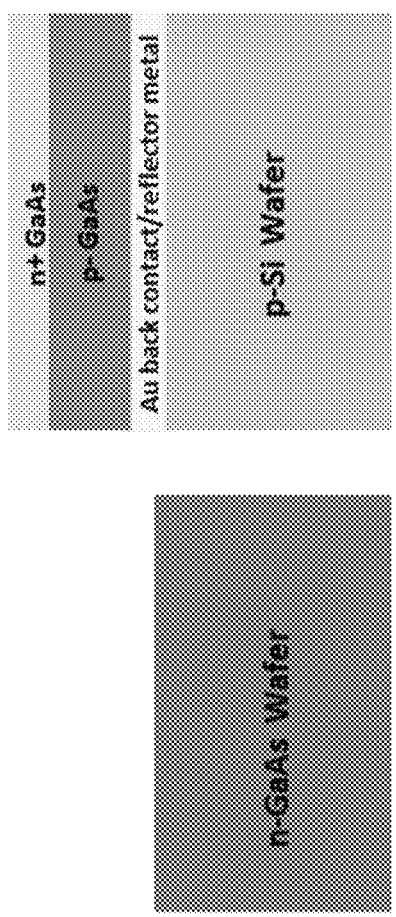

Further, gas phase selective etching may have the following advantages; $XeF_2$ spontaneously etches Ge at room temperature primarily through the following reaction: $Ge(s)+2XeF_2(g)->2Xe(g)+ GeF_4(g)$. Both the etchant, $XeF_2$, and reaction products, Xe and $GeF_4$, are gas phase at room temperature thus negligible to zero etch residue remains and the reaction by-products are mobile. $XeF_2$ etching may be carried out using a conventional $XeF_2$ etcher. The source chamber is supplied by a $XeF_2$ solid source through spontaneous room temperature sublimation process. This highly selective etching of the Ge protective but rough surface creates a smooth surface of n-type GaAs layer with uniform thickness as formed and desired during epitaxial growth. Starting GaAs wafer surface is also smoothed for another device layer fabrication, for example by epitaxial growth of single junction cells, as shown in FIG. 14E.

The backside cell surface may then be roughened by chemical solutions or laser micro abrasion to create a texturing structure for capturing and trapping more light. Blanket doping $n^+$ layer may be applied for a front surface field layer with shallow depth. Subsequent passivation, for example using SiNx, on the cell surface may be performed to reduce the surface recombination velocity. The handler/backplane may then be drilled to form via holes to connect with the outer electrodes to the bus lines for base and emitter finger electrodes, as shown in FIG. 14F. The cells are then ready for test and sort for assembly and module packaging.

The wafers thickness may be maintained after multiple reuses in part due to the highly selective etching of sacrificial layer. The wafers may be reused multiple times to produce multiple cells from the same donor wafer until the donor wafer surface and/or its compositional ratio is too degraded to process reliably (for instance, less As content by sublimation with repeated heating during the epitaxial growth and its related surface self-roughening.) Depending on the thickness of the original donor wafer and the thickness of laser-splitlayers, the number of reuse cycles may be chosen to be in the range of 1 up to tens of (for instance, up to 100) reuse cycles.

The following two embodiments are cross-sectional diagrams depicting the formation of a single hetero junction cell over Ge donor wafer (FIG. 15) and a triple a hetero junction cell over GaAs donor wafer (FIG. 16), in both of which the cells may be transferred to Si or dissimilar handle wafers. Ge wafers may be selected in a larger wafer size, for example having a diameter of 200 mm, and hetero and triple junction cells are designed to absorb a wider solar spectrum with energy band engineering by each layer—in some instances boosting cell efficiency with more carrier generation.

Figure 15B:
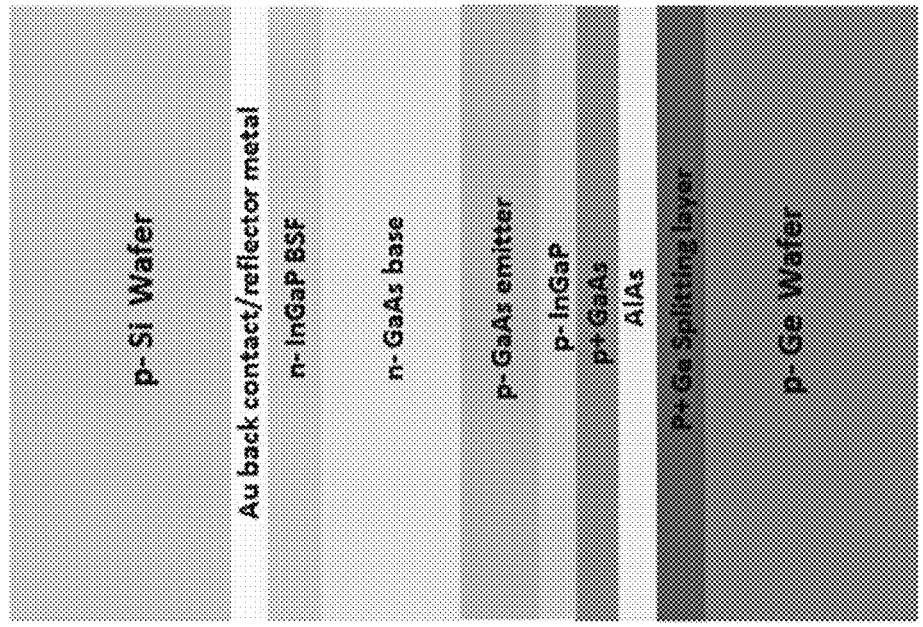
FIGS. 15A through 15F are cross-sectional diagrams depicting the formation of a single hetero junction InGaP/GaAs device layer solar cell.
Figure 15A:
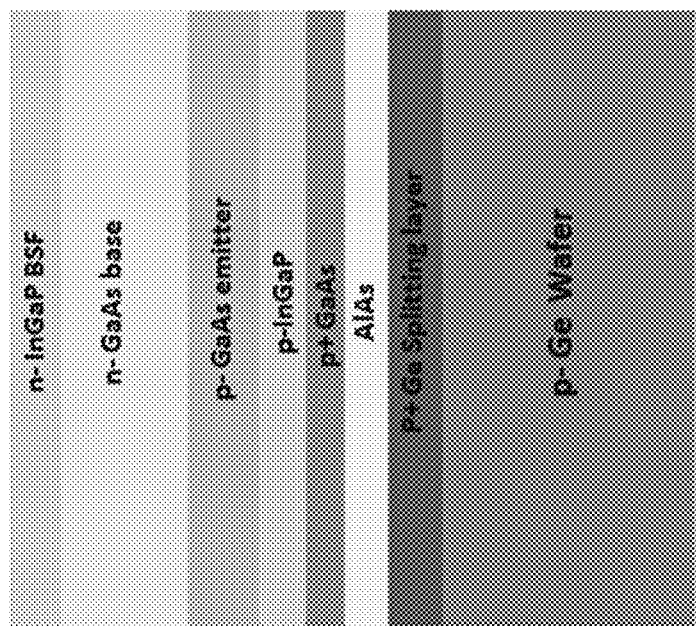
Figures 15C, 15D:
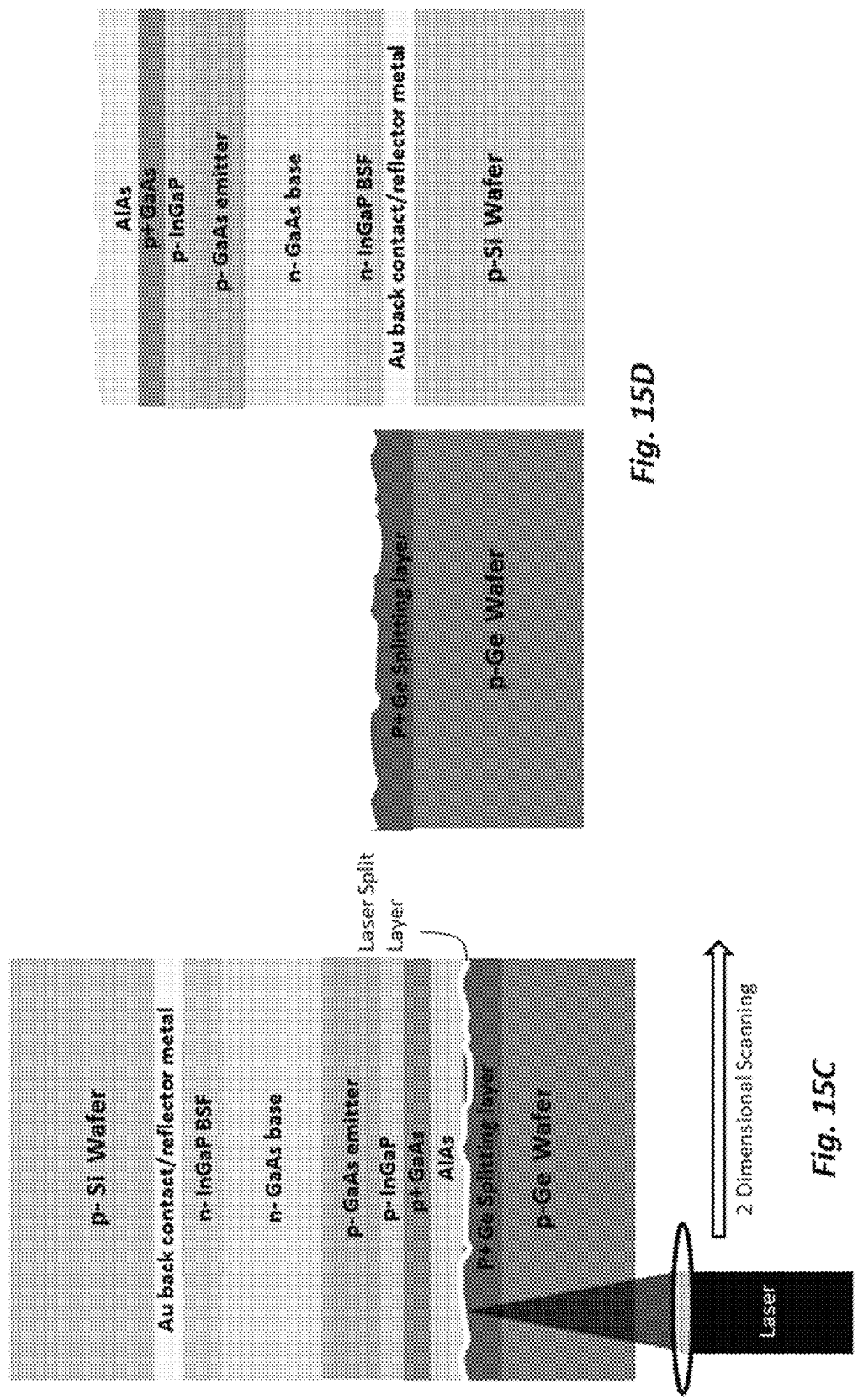

FIGS. 15A through 15F are cross-sectional diagrams depicting the formation of a single hetero junction InGaP/GaAs device layer solar cell transferred onto an Si wafer handler. As shown in FIG. 15A, p typed Ge wafer (for example having a 200 mm diameter) is doped by diffusion in solid-state, ion implantation followed by regrowth and activation annealing, or epitaxial deposition of p+ Ge layer to form sacrificial P+ Ge splitting layer. The highly doped layer provides free carriers to absorb the laser light travelling permeably through p− Ge laser irradiated from backside of the Ge wafers. A protective layer of AlAs is deposited on the sacrificial P+ Ge splitting layer to protect the upper active cell layers during the laser splitting process. The AlAs residue may be selectively etched from GaAs layers using a high selectivity etch process. Then p+ GaAs, p− InGaP, p+ GaAs emitter, n− GaAs base and n− InGaP back surface field (BSF) layer are epitaxially grown by MOCVD. After Au or Al backside reflective metal are deposited, p-Si wafer is bonded, for example without adhesive by carefully cleaning Si surface to strengthen the bonding configuration, as shown in FIG. 15B. Bonding may be observed and monitored by bonding wave propagation through IR camera. As shown in FIG. 15C, laser beam is irradiated through lens to focus at highly doped layer of Ge (P+ GE) from the backside of the Ge substrate and scanned over and across (two dimensional/bi-directional scanning) the wafer. The laser beam is permeable in Ge substrate and absorbed at focusing point by nonlinear absorption in small space and time of the laser pulse. This abnormal absorption is assisted with free carrier absorption in the highly doped layer and creates abrupt localized increase in temperature due to increased absorption coefficient, resulting in breaking covalent bonds in Ge crystalline phase, leaving some amorphous phase, dislocation arrays, or micro cavities due to sublimation of Ge atoms. In addition to these peculiar phenomena, a strong stress field is formed around the inhomogeneous sites in bulk which initiates crack formation and its subsequent two dimensional propagation, substantially parallel to the wafer surfaces. This phenomenon may be accelerated with triggers outside the connected pair by mechanical forces, vibrational motion, or simply annealing or cooling to induce thermal shock. These splitting processes separate the two substances: a Ge wafer covered by a highly doped layer with rough surface due to linked cracks and a single hetero junction compound semiconductor cell structure over a Si wafer as shown in FIG. 15C. The top of the cell layer of p+ GaAs is protected with the AlAs sacrificial layer, as shown in FIG. 15D. Both the splitting and sacrificial layers of p+ Ge and AlAs protect the Ge substrate surface and cell active layers, respectively, from laser irradiation optical damage and from crack propagation mechanical damage. The remaining/residue P+ Ge splitting (also called sacrificial) layer over the Ge wafer may be polished off by CMP or annealed in hydrogen to enhance the surficial diffusion rate to flatten the surface macro roughness. The smooth flat donor wafer surface may be reused multiple times for device layer formation, for example by epitaxial growth, until the process or device manufacturing yield cannot be maintained.

Figure 15F:
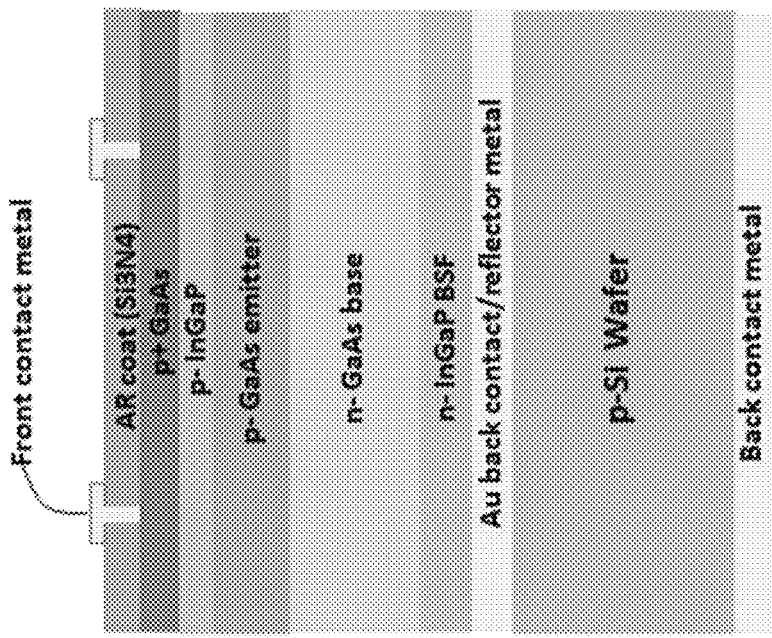
Figure 15E:
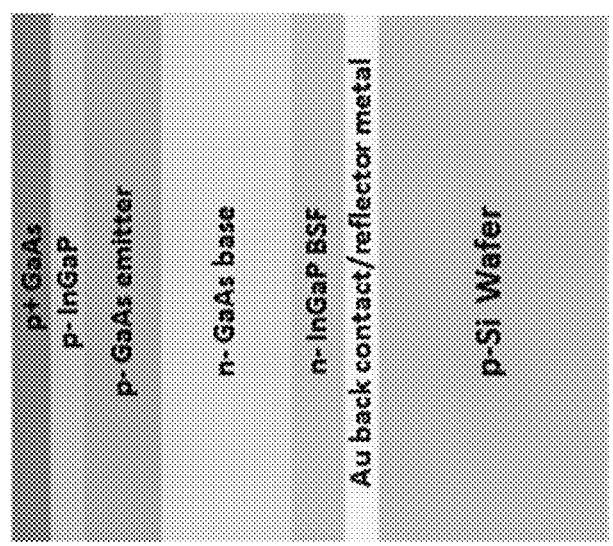

The top layer of AlAs on the cell junction may then be selectively etched off using diluted HF, as shown in the structure of FIG. 15E. The selectivity in etching rate may be as high as $10^5$ such that the active layer surface quality is not compromised and the thickness and doping characteristics are not degraded. SiN may then be deposited on the top layer as an anti-reflection layer as well as passivation for reducing surface recombination velocity. Top and bottom electrodes are formed, as shown in FIG. 15F. Si wafers are currently the most commonly and commercially available semiconductor wafers in quality as well as in quantities and size. For use as handler wafers, lower cost non-prime monitor wafers from the semiconductor industry or solar grade wafers may be used. However, a plastic or metal substrate handler in place of a Si wafer, could further reduce the cost of the complete solar cells since the effective thickness for absorbing sun ray in a compound semiconductor solar cell is approximately one tenth thinner than a Si solar cell. Further, Ge is has a cost much higher than that of Si wafer, and its cost is approximately equivalent to GaAs, however, Ge wafer size (typically available in 8 inch diameter wafers) is typically larger than GaAs wafer. Cost reduction based on the starting donor wafer material, such as Si or compound semiconductor solar cells, as well as the handle material are only one of many considerations in device layer and solar cell fabrication.

Alternatively, a triple hetero junction cell can further increase efficiency, reaching over 30-40%. In addition to this higher efficiency cell scheme, the starting GaAs host/donor wafer may be reused multiple times for cell manufacturing thus reducing the amortized starting wafer cost per solar cell. FIGS. 16A through 16E are cross-sectional diagrams depicting the formation of a triple junction InGaP/GaAs/InGaAs device layer solar cell transferred onto a Si wafer handler. Multiple epitaxial layers are grown by MOCVD (metal organic chemical vapor epitaxy) on a GaAs (100) substrate (donor wafer). Firstly Ge or AlAs splitting and protective layer is epitaxially grown on the substrate and then the top $Ga_{0.5}In_{0.5}P$ junction doped with Se for contact and emitter is grown. After a subsequent growth of tunnel junction of $Al_{0.3}Ga_{0.7}As:C$ and GaAs:Se for series connection, middle GaAs lattice-matched junction is formed with doping Se and Zn for emitter and base. These layers may be grown before any lattice-mismatched layers to prevent threading dislocations that originate during mismatched growth and to prevent degradation of performance. Thus, the top two junctions, which produce most of the power, are grown with high crystal perfection for optimal solar cell performance.

Figure 16A:
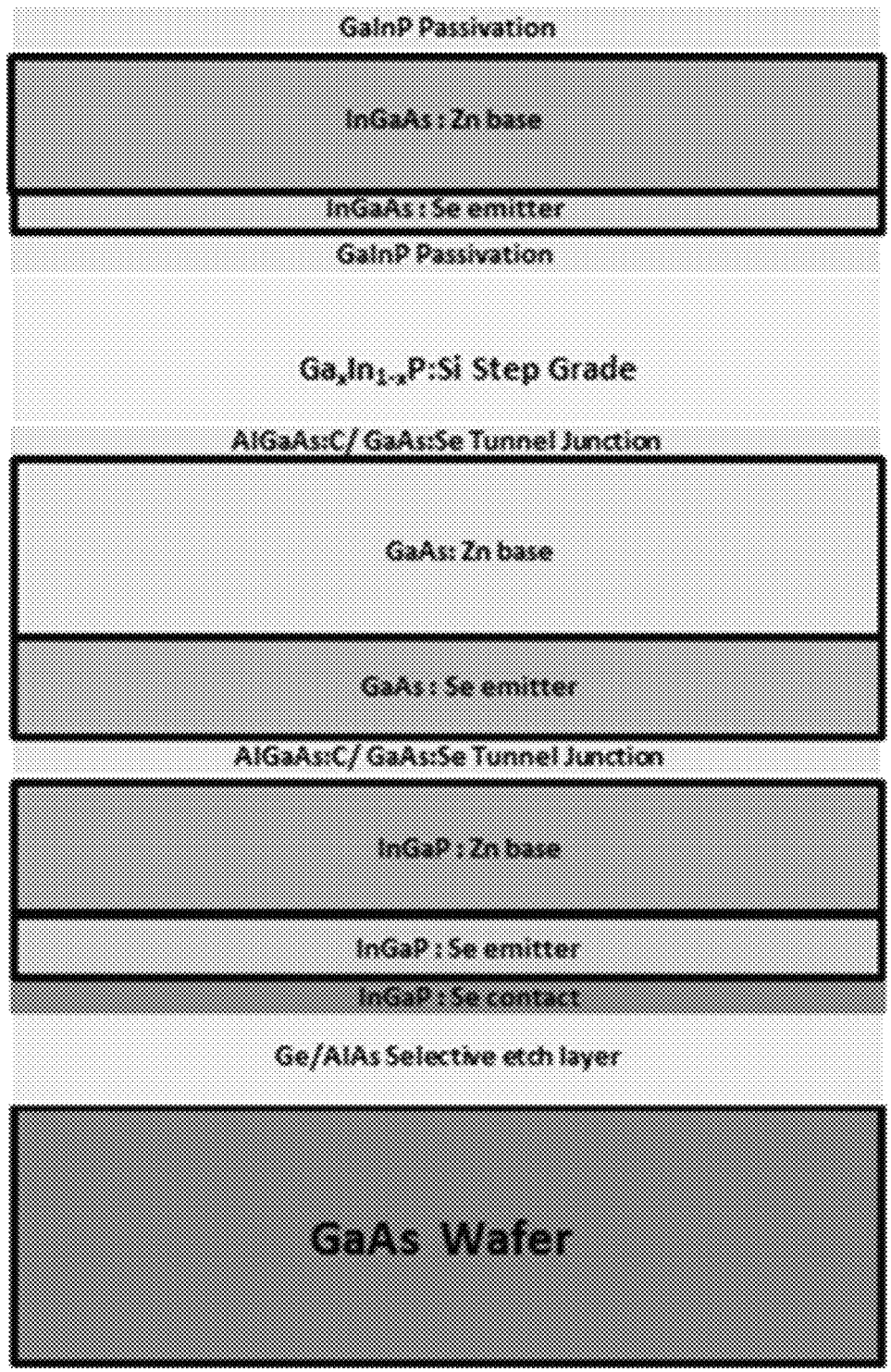
FIGS. 16A through 16E are cross-sectional diagrams depicting the formation of a triple junction InGaP/GaAs/InGaAs device layer solar cell.
Figure 16B:
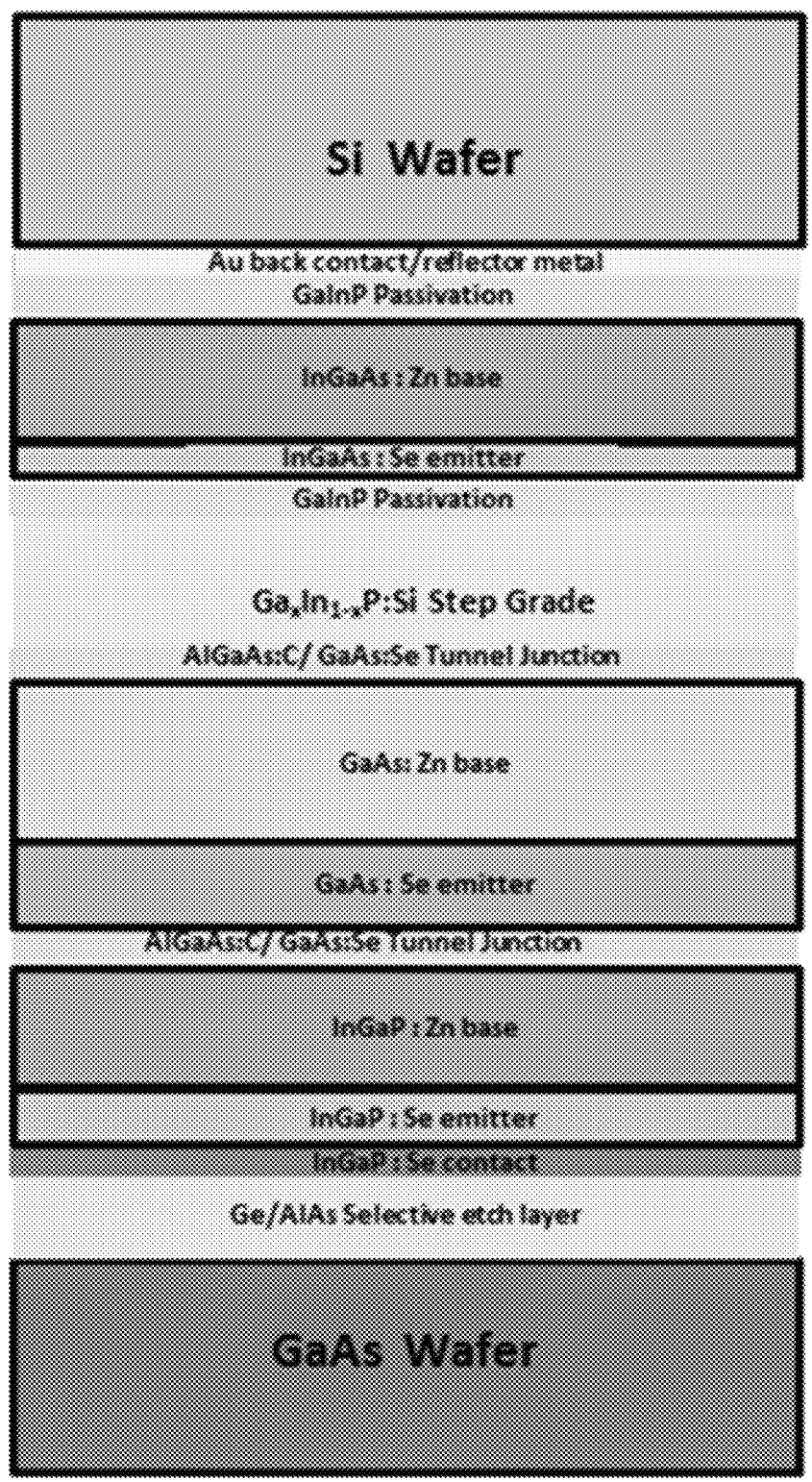
Figure 16C:
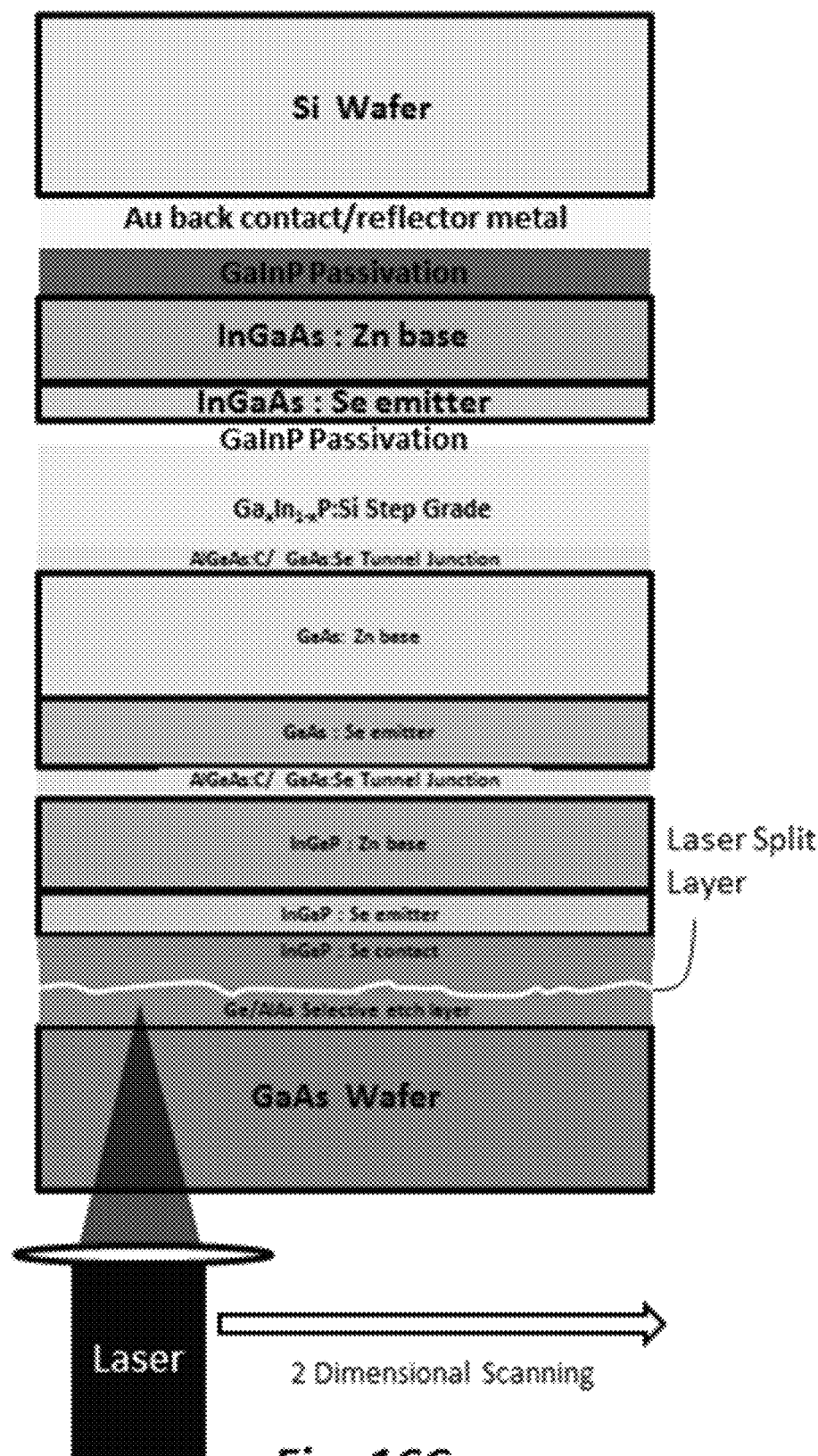
Figure 16D:
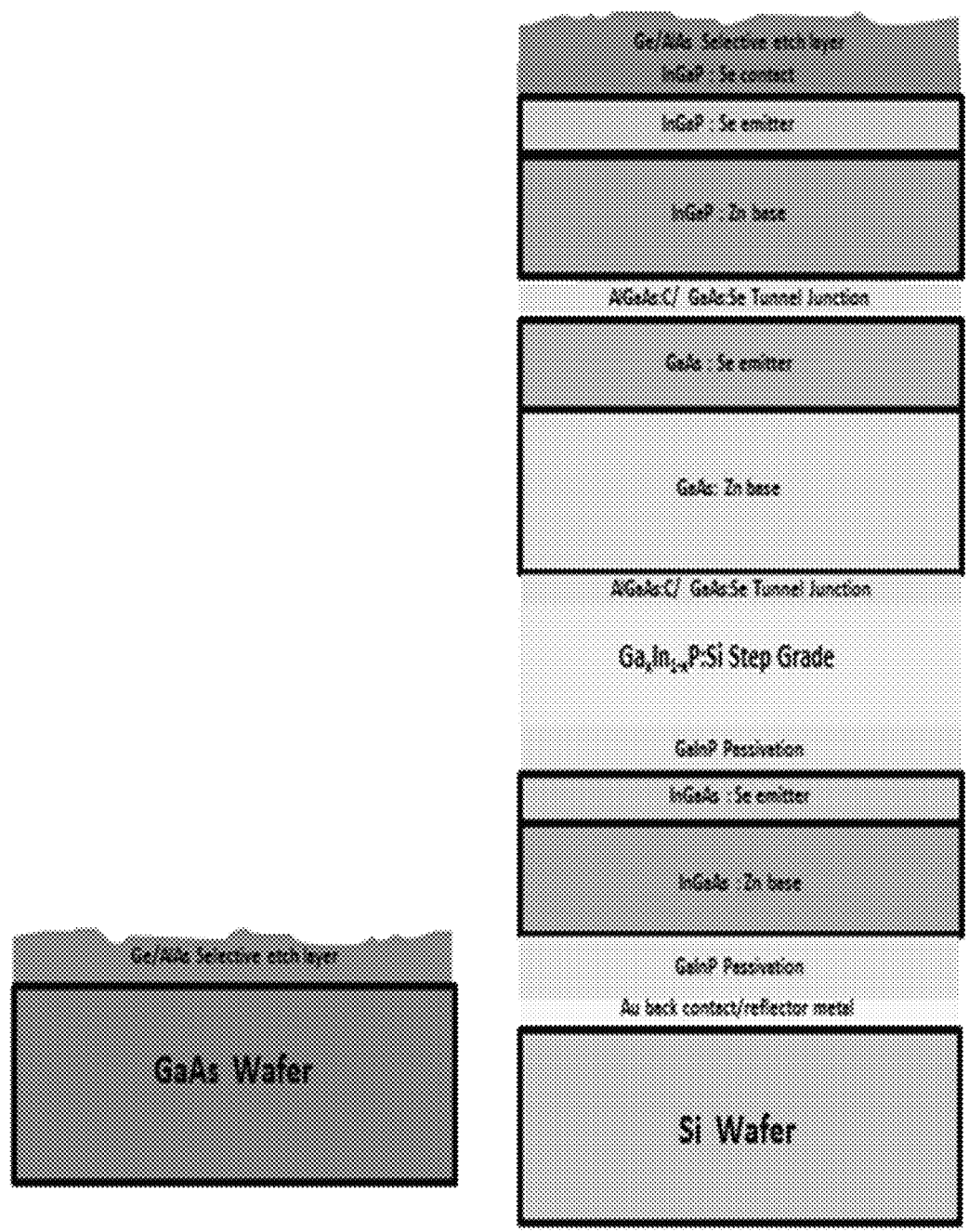

After inserting another tunnel junction of $Al_{0.3}Ga_{0.7}As$:C and GaAs:Se, in order to minimize the dislocations in the bottom junction, a step graded $Ga_xIn_{1-x}$ P:Si layer, which is transparent to the light intended for the bottom junction, is grown. The composition of the $Ga_xIn_{1-x}$ P was step graded from $Ga_{0.51}In_{0.49}$P, with a nominal lattice constant $a_0$=5.66 Å equal to that of GaAs, to $Ga_{0.22}In_{0.78}$P $a_0$=5.78 Å using eight 0.25 um-thick intermediate compositions of $Ga_xIn_{1-x}$ P. After the growth of 1.0 um of $Ga_{0.22}In_{0.78}$P, the composition is then dropped back to $Ga_{0.25}In_{0.75}$P, $a_0$=5.76 Å which is lattice matched to the $In_{0.3}Ga_{0.7}$As active junction. This $Ga_{0.25}In_{0.75}$P composition is used as the passivating window and back-surface field layers, shown in the structure of FIG. 16A. After MOCVD epitaxial growth of the inverted compound semiconductor cell structure, gold is electroplated onto the exposed "back" surface of the inverted structure. The triple hetero junctions are then bonded to a structural "handle," of silicon wafers with no adhesive or glass plate with a low viscosity epoxy, shown in FIG. 16B. Any flat material of semiconductor, metal, or insulating glass may be used as a handle—handle material may be chosen to optimize cost, heat management, and weight considerations. As previously described, a permeable laser beam is focused at the splitting layer (sacrificial Ge/AlAs selective etch layer) from the back side and across the GaAs wafer, shown in FIG. 16C. Micro cavities or dislocation arrays are created by the abnormal absorption and are accompanied by a surrounding strong stress field. Triggered by intrinsic and/or extrinsic mechanical, thermal, or optical strains, the micro cavities and dislocation arrays may grow and connect with each other, resulting in formation and propagation of cracks in a two dimensional plain. The connected pair of substrates are separated with stress induced cracks that are connected horizontally within the Ge splitting/sacrificial layer, as shown in FIG. 16D.

Residual Ge splitting layer may be selectively etched off by XeF2/GeF4 by a XeF2 etcher at a partial pressure of 0.8 Torr Room Temperature gives Ge 40 um/min eatch rate that is $10^6$:1 compared to GaAs. The same level selectivity may be obtained for AlAs with HF solution. The GaAs donor wafer may then be reused for the next cycles of epitaxial growth producing more device layers and cells until the quality of GaAs crystallographic and physical morphology degrades due to selective desorption of As (or until the donor wafer gets too thin for good mechanical yield during device processing). Wafer reuse substantially contributes to process cost savings by amortizing the starting material cost (which is rather expensive for wafers from GaAs or Ge) over multiple reuse cycles. Further, both residual splitting layers over GaAs substrate and the triple junctions over Si may protect the crucial surface layers from laser induced optical and physical damages.

Figure 16E:
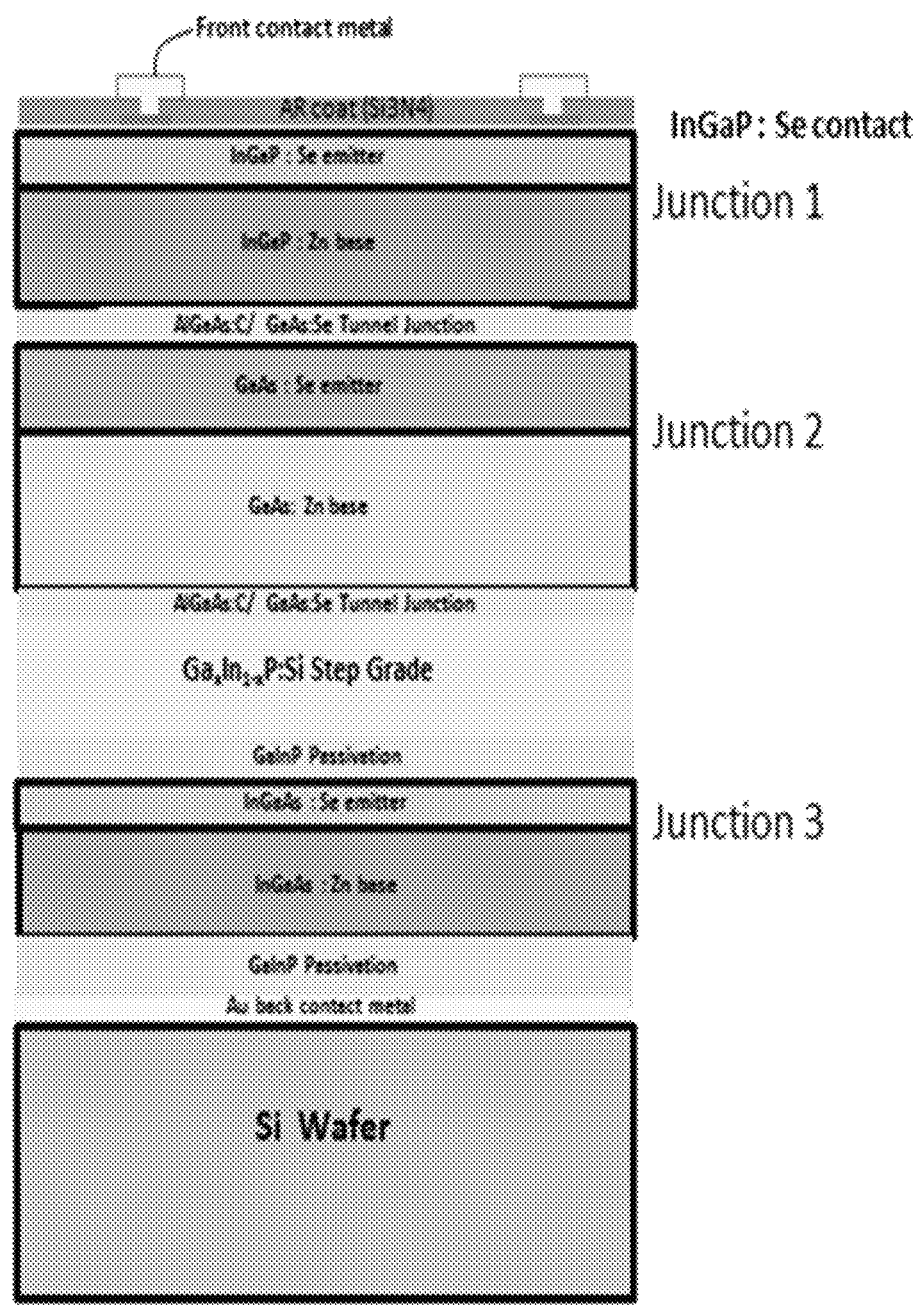

After selective removal of the residual splitting layer over the top junction of the cell (Junction 1 as shown in FIG. 16E), front gold grids and mesa isolation are processed using standard photolithography processing techniques. An optimal grid design may be chosen for each measurement condition. Finally, a MgF2/ZnS antireflective coating is deposited by thermal evaporation, as shown in FIG. 16E.

The triple junctions of InGaP (Junction 1), GaAs (Junction 2), and InGaAs (Junction 3) provide three absorption band from short to long wave length in sun light (approximately 400-700 nm, 700-900 nm, and 900-1200 nm, respectively) which provide efficient absorption of sunlight and can increase cell efficiency to 30-40% under one sun.

Laser processing tools. The laser processing tools for forming laser-split/separated layers as described herein minimize vertical thickness of the damaged splitting layer to reduce kerf-loss in the wafers and increase throughput by minimizing laser scanning time per wafer (in other words by using rapid scanning on one or multiple wafers). Laser processing innovations for increasing throughput and reducing damaged splitting layer thickness include, for example: using multiple laser beams per a wafer; high speed scanning and high speed stage movement; multiple wafers on a tray/stage undergoing laser irradiation (batch processing); parallel wafer processing using multiple processing stations; high repletion rate for laser pulsing; larger period between the laser shots in solid; adjusting the cleaving orientation for wafers; polarizing laser beam in plane using beam shape modification to facilitate crack widening parallel to the wafer surface. Further, tools utilizing wafer movement and/or beam movement are provided.

Splitting kerf loss may be determined by the crack length perpendicular to the wafer surface and the split surface micro roughness—in other words, to reduce kerf loss restrict perpendicular crack length to the splitting/sacrificial layer and limit surface roughness to the splitting/sacrificial layer. Further, the overall fluctuation/wavering of the splitting plane may also affect kerf loss after splitting. These factors may be determined by the location and material of the splitting sites embedded in the wafer. Additionally, the laser focal position should be accurately controlled and laser beam quality and shape are modified by polarization to facilitate an inhomogeneous/anisotropic cracking plane parallel to the wafer surface. And in some instances, a cleaving plane parallel to the wafer-surface-crystallographic orientation may be selected.

Real time laser feedback measurement and control may be used to maintain the distance laser distance (and cracking plane depth) with high accuracy from the device surface to the focused sites, for example by monitoring the backside of the wafers by reflection with an additional probing light source simultaneously irradiating with the transparent-wavelength pulsed laser. And while semiconductor wafers are well controlled in size, thickness, and surface finishing, the device surface is often not perfectly planar due to three dimensional topography structure as well as roughness and thickness variations in the back plane and/or the handler. Thus, backside feedback control from the backside of the wafer may be used to control the splitting layer thickness and manage splitting site locations.

FIG. 17 is a diagram showing an embodiment of a laser splitting tool and substrate setting in accordance with the disclosed subject matter. As described previously the bonded/connected pair comprises four parts: a host or donor wafer, a splitting layer (and selective etching layer), a device layer, and a handler. The host/donor wafer may be a relatively thick single crystalline round shaped (or other geometrical shapes such as square or pseudo-square) wafers as shown in wafer and scan area top view of FIG. 17B. The hander may be square or pseudo square shaped for ease in integration into common rectangular photovoltaic cell modules. However, the donor wafer and handler may comprise any number of shapes. Prior to splitting the device layer from the host wafer, the device layer is pre-cut by laser scriber with ordinal surficial abrasion mode or internal cracking mode using a permeable laser focusing technique from the device layer along the edges of the handler to define the peripheral shape of the device layer, shown as peripheral trench in FIG. 17A. Then the connected (bonded) pair is set on the wafer holder with frontside (devices) up, and may be held in place by gravitational forces, and the laser beams from beneath the host wafer (from the backside of the host wafer) through which the laser is focused to a point under the device layer. The edge of the back surface of the host/donor wafer may be partially held by fingers/substrate holders, shown as substrate holders in FIG. 17B. The parts around the wafer may be shadowed by the fingers during laser scanning from the back side, however, these shadowed portions may be etched off together with the splitting and selective etching layer after separating the device layer with the handler from the host wafer. The laser beam is scanned in one dimension and the bonded pair or the laser adjusted to scan the wafer in a perpendicular direction resulting in full scanning under the active device layer area. This tool design provides a high degree of focus control for the split device layer as the donor semiconductor wafer thickness is often more uniform than the upper device layers (and in some instances includes metallization), the adhesive layer between the device layer and the host handler, and the handling substrate. Further, this tool design may be suitable for low cost and high throughput manufacturing as the stage/tray may travel at high speeds and a large number of donor wafers may be placed on the stage upon which stationary or scanning multiple laser beams are incident for high throughput.

Figure 18:
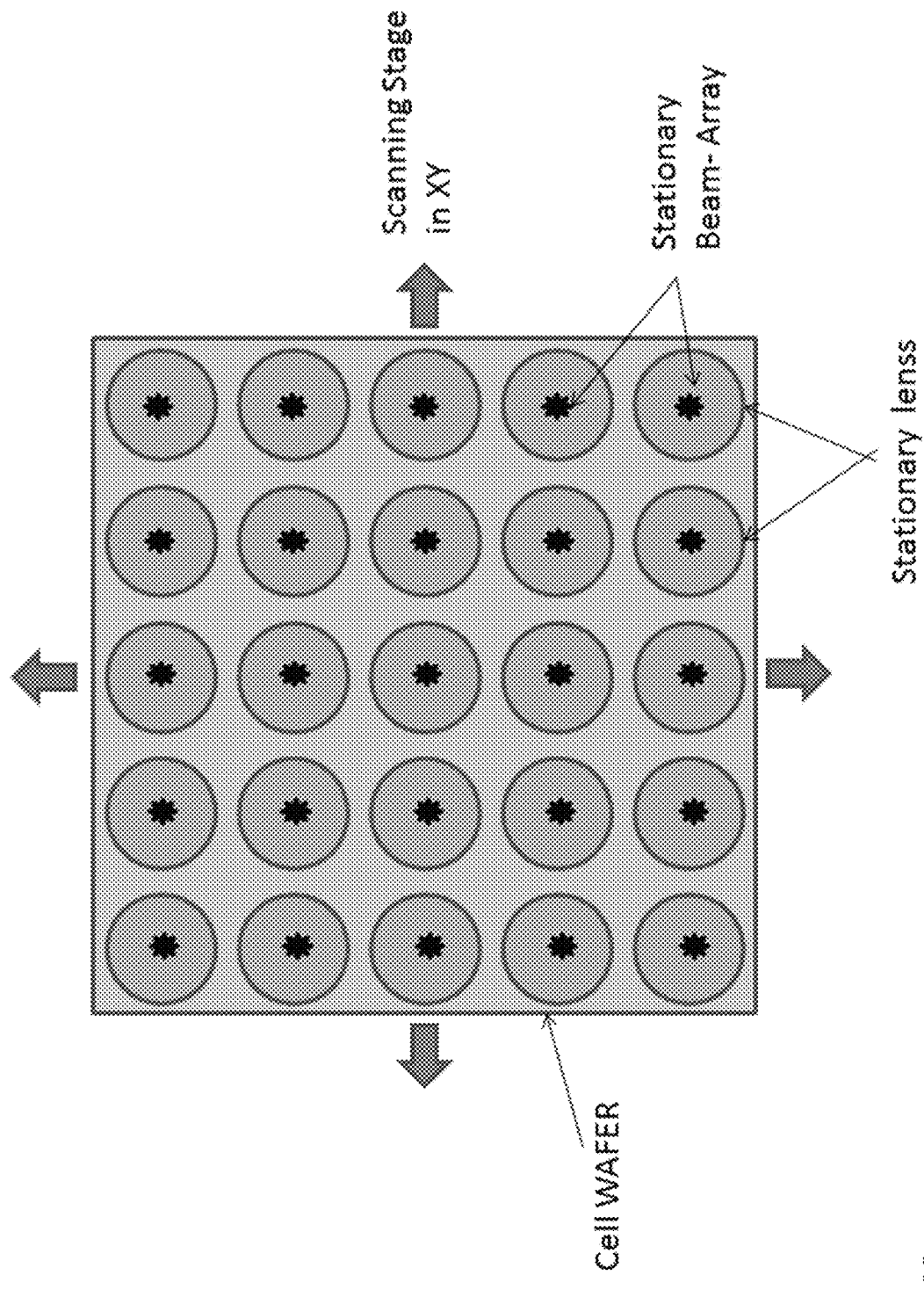
FIG. 18 is a top view of a wafer showing internal laser processing.

Additionally, one or a multiple number of laser beams may be branched to form an increased number of laser beams for high-throughput processing, using a high powered laser(s), which are guided by optical mirror or lends systems or optical fibers or other beam splitting optics over the back surface of the host wafer or a plurality of host wafers, as shown in FIG. 18. FIG. 18 is a top view of a wafer showing internal laser processing using scanning laser beams at internal wafer focus points. Such a laser beam array may allow for full coverage of the active device area by moving each beam in two dimensions with smaller scanning length than optical unit usage of mirror scanner and through smaller canning distances joining scan areas from multiple beams. Either the wafer or the laser beam array may be scanned or mechanically moved. The wafer may be scanned in two dimensions to fully cover the wafer area with stationary multiple laser beams and vice versa or a combination of wafer movement and stationary/moving beams.

Figure 19:
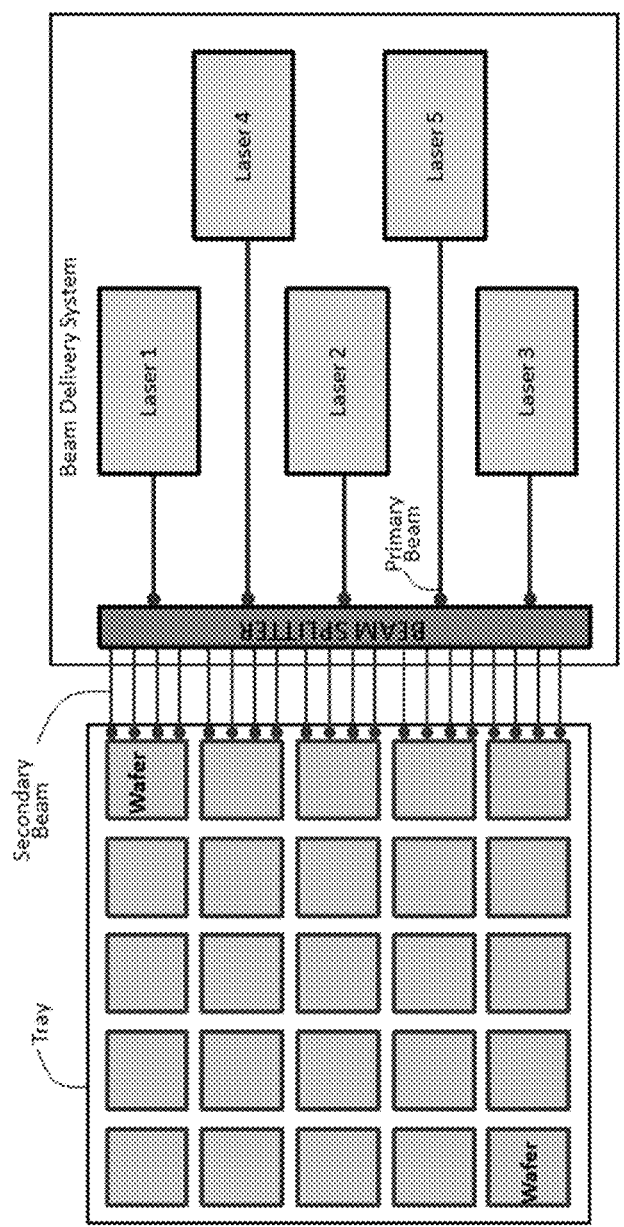
FIG. 19 is a diagram of a laser processing tool.

The laser processing tool shown in FIG. 19 uses multiple laser beams to form a laser splitting layer on a plurality of donor wafers. Multiple laser beams are formed by separating a main beam from the laser into multiple numbers of beams with an optical beam splitter or optical fibers. A high speed travelling stage or tray holding multiple wafers may be used to shorten the time for scanning per wafer and batch processing with multiple wafers per a stage. The laser beam may be scanned in the lens field of view or it may be stationary. Stationary beams using stage movement only may eliminate beam acceleration and de-acceleration time at turning points in the edge of the wafers—thus providing high throughput laser splitting while maintaining high quality of separation.

Figure 20:
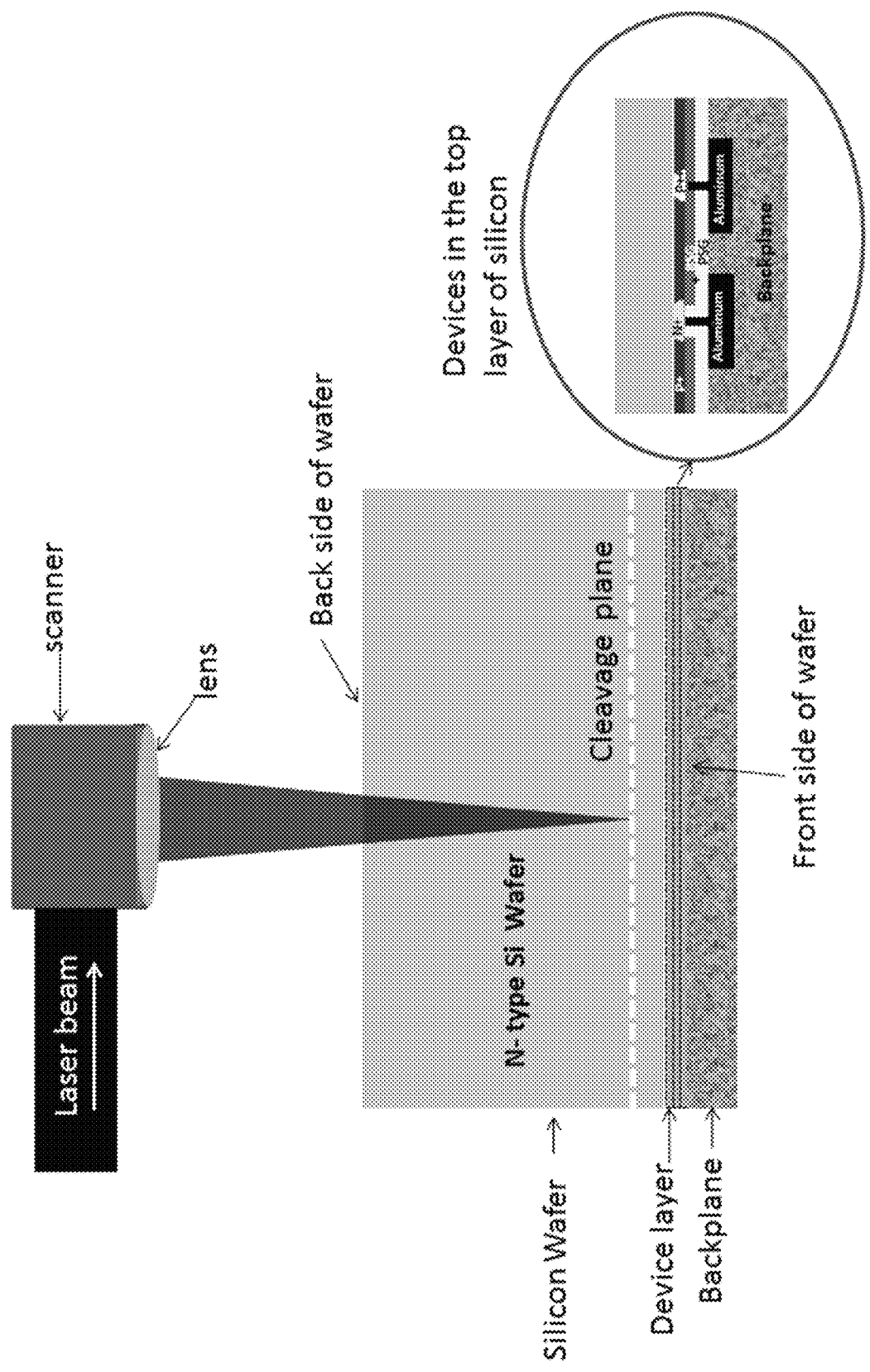
FIG. 20 is diagram showing laser irradiation from the top of the wafer assembly.

FIG. 20 is diagram showing laser irradiation from the top of the wafer assembly and the backside of the wafer assembly (shown as a back contact solar cell) facing up (in other words, FIG. 20 shows backside laser irradiation but the laser and corresponding wafer assembly have been flipped so the laser scanner is positioned above the wafer assembly). As described earlier, after the devices and circuits are formed on the front side of the wafer, the wafer surface is covered and attached to a handling substrate. As shown in FIG. 20, the assembly is placed upside down on the chuck and the laser beam is incident on the back surface of the wafer that is facing the laser from the top and is focused into the wafer at a desired depth away from the device region—in other words laser irradiating from the top down through the back surface of the wafer. It should be clear that the laser and wafer assembly may be positioned in any alignment for backside laser irradiation (laser positioned above, below, or horizontally to the wafer assembly while facing the wafer backside).

For low cost and high throughput considerations, the laser beam may be scanned over the desired surface area as fast as possible while maintaining high quality laser splitting. In one embodiment, laser beam scanning may be performed using a galvanometer scanner. The scanners use lens with the largest possible field of view (FOV) to cover the maximum possible scan area. Since the lens FOV depends on its focal length, it may be advantageous to have a lens with a long focal length. On the other hand, to create a spot of high power density of localized irradiation inside the silicon may require the laser beam to be focused down to a spot as small as about one to three microns. The laser spot size at focus is related to the lens focal length (f) and the incoming beam size (L) at a certain wavelength ($\lambda$) according to spot size=$M^2 \lambda f/\pi L$, where $M^2$ is a well-known quality factor for the laser beam. Hence, to have a lens with a large focal length that focuses down to a one to three micron sized spot, very large incoming beam sizes are required. The limit in the aperture of the lens to accommodate the beam size limits the focal length and hence the FOV while obtaining a very small focus spot such as one micron size. The higher the beam size (or beam diameter) acceptable for the lens, the higher the focal length and the FOV. Thus, the FOV is limited by the aperture of the lens. Generally, lens cost increases and quality of optical lenses decrease as the aperture size is increased.

In one embodiment to minimize the number of scanners/lenses, lenses with aperture size as large as approximately 25 to 35 mm size able to cover an area 26 mm×26 mm on the wafer using galvanometer scanners are used. However, in a tool configuration where the wafer is stationary during scan, a large number of scanner/lens systems, for example twelve, may be required to cover the 156 mm×156 mm area using x- and y-direction scans, for example for a solar cell layer transfer. Thus, in one embodiment the wafer may be moved in x- and y-directions under stationary scanner/lens systems that scan the area in two directions (two dimensionally or bi-directionally) x- and y-direction during the scan. Further, the wafer may be moved in one direction (for example the x-direction) while laser scanning is performed in the other direction (for example y-direction). As a result, in some instances only six scanners may be needed to cover the full area of the 156 mm×156 mm wafer. Further, each scanner may have only one mirror for scanning to preserve the maximum aperture size. As can be seen, various combinations of lens parameters, the area covered, and the number of scanners (that is, the laser beams), and the wafer and scanner movements may be selected to provide the best throughput for lowest cost.

In some instances, multiple laser beams may be used for each wafer. For multiple batch wafer processing a large numbers of laser beams may be required. This can be achieved by using a powerful laser so a primary laser beam may be split into several secondary beams (as shown in FIG. 19). However, cost increases as more optics components are used to subdivide the primary beam. And as the power of the laser determines how many times the primary beam can be subdivided, additional lasers may be used and the primary beams again split into several secondary beams to obtain the required number of laser beams for the production tool. The exact configuration of the beam delivery system may depend on the relative cost of the laser as compared to the cost of optical set up for dividing the primary laser beams. FIG. 19 shows a scanning system set up where multiple wafers are processed at a time using multiple laser beams obtained using several lasers each having its primary laser beam divided into several secondary beams. The numbers of lasers and number of beam subdivisions, for a given tool configuration and the number of wafers being processes at a time may be configured for lowest processing and capital cost.

Figure 21:
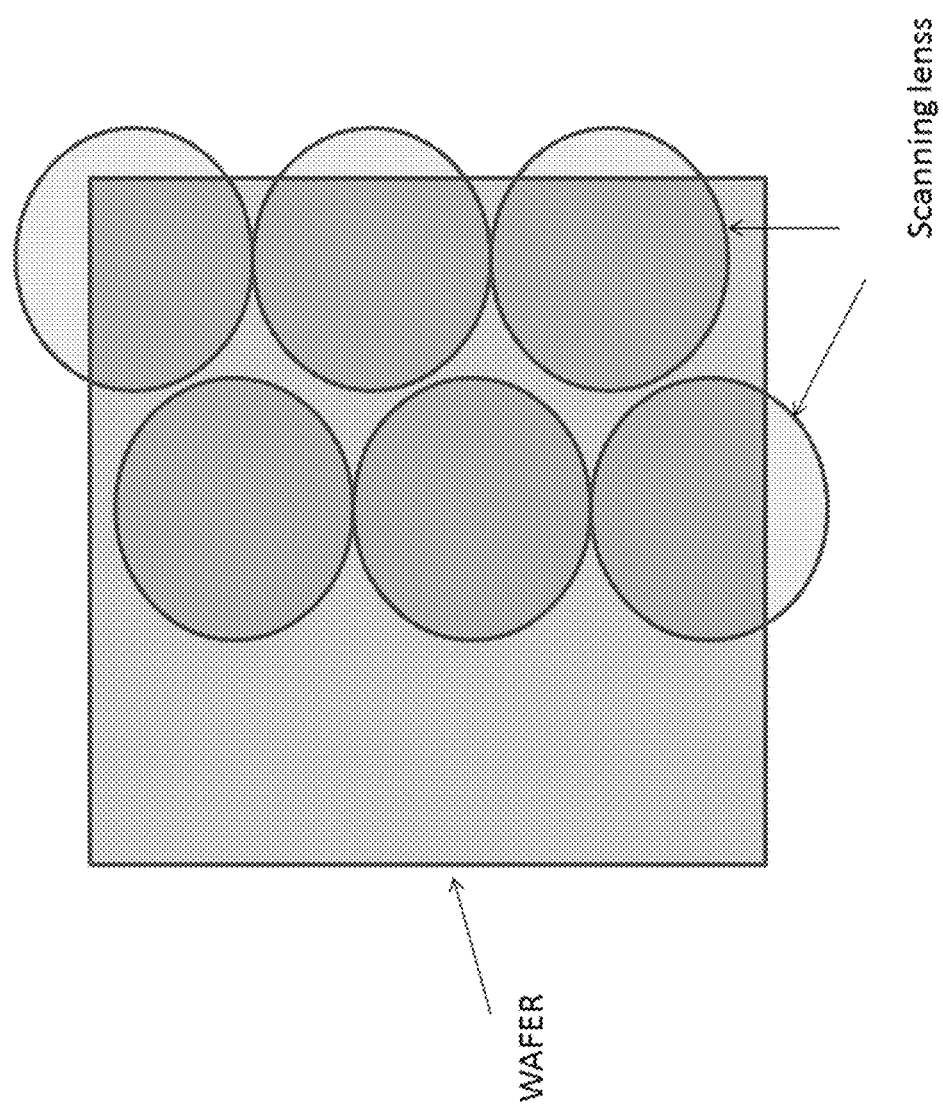
FIG. 21 is a top view of a wafer showing staggered scanner placement.
Figure 22:
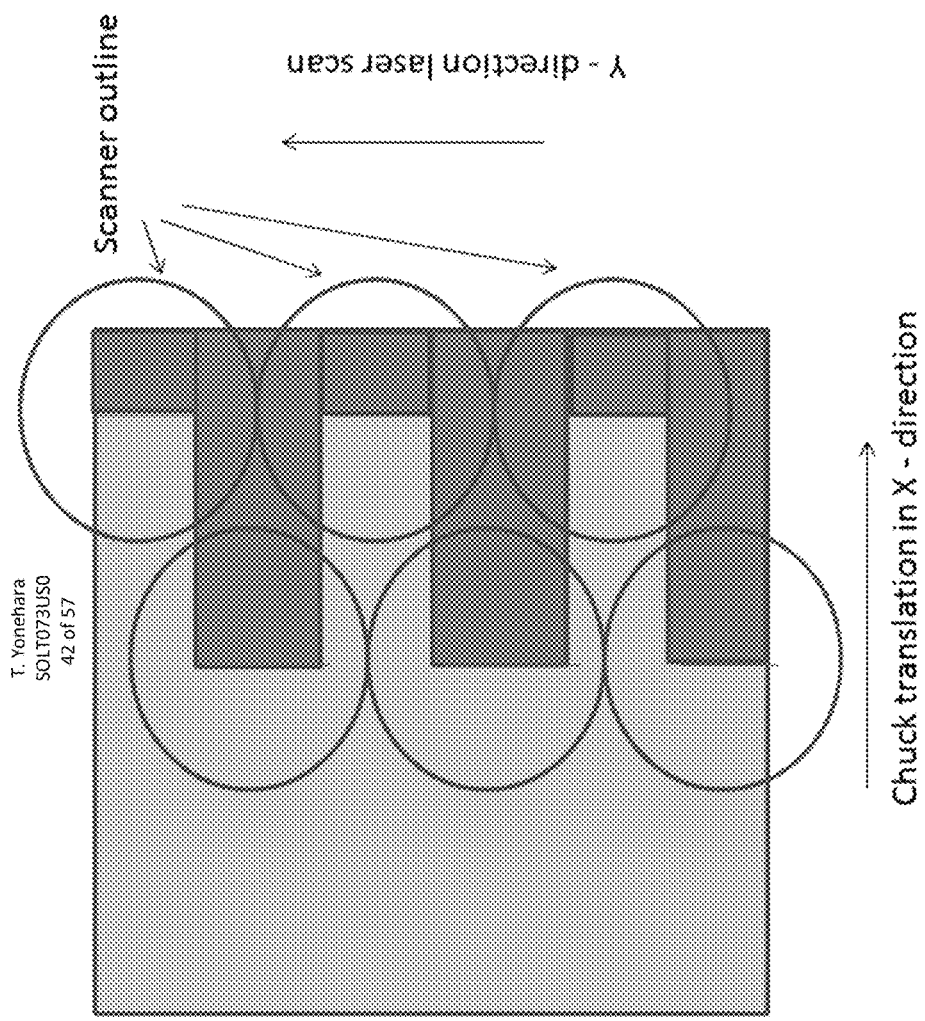
FIG. 22 is a top view of a wafer showing laser scanning spots and lines.

The absorption of the laser energy and hence the area of the ionized or melted region (or buried spots with microcracks) in silicon requires a high energy density that is related to the size of the laser spot. In order to avoid non-uniform cracking across the cleavage plane, the laser spot size should be tightly controlled. In one embodiment, provided that the cost is acceptable, telecentric lens assemblies are used that provide a fixed focus and spot size across the whole scan area keeping the laser beam incident normally on the wafer surface over the full scan area. To obtain telecentricity, the lens assemblies may be larger than the lens size and the FOV. Hence, the placement of the scanner/lens systems need to be considered and optimized. In one embodiment, the scanner placement is staggered to cover the whole wafer, as shown in FIG. 21 (a top view of a wafer showing staggered scanner placement). FIG. 22 (a top view of a wafer showing laser scanning spots and lines, only the lens outline is shown for clarity) shows the full area coverage as the silicon substrate on the chuck is moved across the laser scan. A single scanner mirror may be used to move the laser spot in y-direction while the wafer moves in x-direction to so that the whole surface of the wafer is covered by the laser scan.

The quality of laser microcracking is related to minimizing the vertical thickness of the splitting layer to reduce the kerf-loss in the wafers. Additionally, the microcracks should be formed and restricted to the desired plane as much as possible so that the separation is planar. Furthermore, good control of laser power available at the microcracking location may keep the extent of microcracking uniform as the laser is scanned across the wafer surface.

To obtain thin device layers (or thin cleaved semiconductor layers with controlled thicknesses, in some embodiments in the controlled-layer-thickness range of submicron up to about 100 microns) with a relatively constant or uniform thickness, the focus depth of the spot may need to follow the height variation of the substrate. Also, in production the same donor substrate or template may be processed and cleaved repeatedly to obtain the maximum number of cleaved wafers or thin semiconductor layers possible from the same starting substrate to lower the overall cost per cleaved wafer (by reusing the same wafer to cleave and transfer multiple material layers). A higher number of donor wafer or template reuse may mitigate cleaved semiconductor layer cost. Hence, the focus position of laser beam may be adjusted to any change in height of the substrate and the height variation across the desired field. Thus, irradiation from the back side of the wafers may be effective to obtain a higher yield because the front surface may be already processed to have metal electrodes and may be covered with a handler, resulting in limited transparency for the laser as well as a non-flat surface that is not ideally suited as a level plane to place the laser focused spot at the constant depth inside silicon wafers. In case of the laser irradiating from the wafer backside, the height variation of the front of the wafer surface does not affect the height variation of the back surface exposed to the laser.

In one embodiment, a tool design incorporates a height detection sensor system that scans the full surface of the wafer before it is moved under the scanner to measure any height variation across the field as a result of the thickness variation in the handler/backplane or as a result of the device processing of the front side or generated during the substrate/template reuse. A line beam from a low power laser (a separate laser for measurement and surface mapping) may be generated and used to scan the whole wafer so that the height measurement is continuously obtained and monitored using a triangulation method. The height measurement may be fed to controlling software that adjusts the z-direction movement of the scanner/lens system for focus variation during the laser splitting process. Alternately, for severe variations in the wafer surface height an optical assembly that varies the focus of the scanning lens by changing the distance between its optical components in the beam path may be used.

To generate ionized or melted regions (spots with microcracks) of constant/uniform size/area and depth, it may be advantageous to monitor and control the laser beam power tightly. However, the laser power absorption in silicon is susceptible to surface roughness. Thus, in one embodiment, the reflectivity and roughness of the wafer surface is mapped. To map the wafer surface, a laser with wavelength in the visible range is used to illuminate the sample surface. The reflected and scattered light are measured and analyzed to calculate and map wafer reflectivity and roughness of the surface in real time which is provided to the laser pump power controller to vary the laser power output during the laser splitting process.

Figure 23:
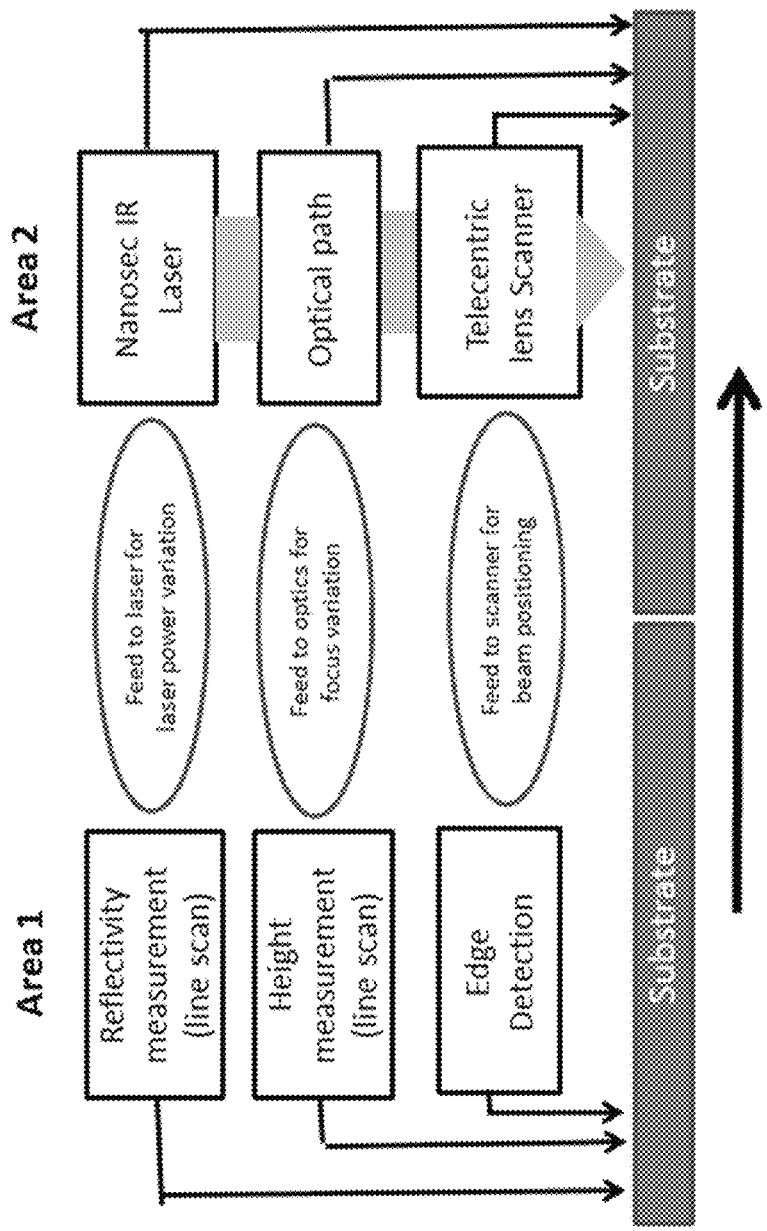
FIG. 23 is a diagram showing a side view of a real time laser processing feedback loop in a high throughput wafer processing tool.
Figure 24:
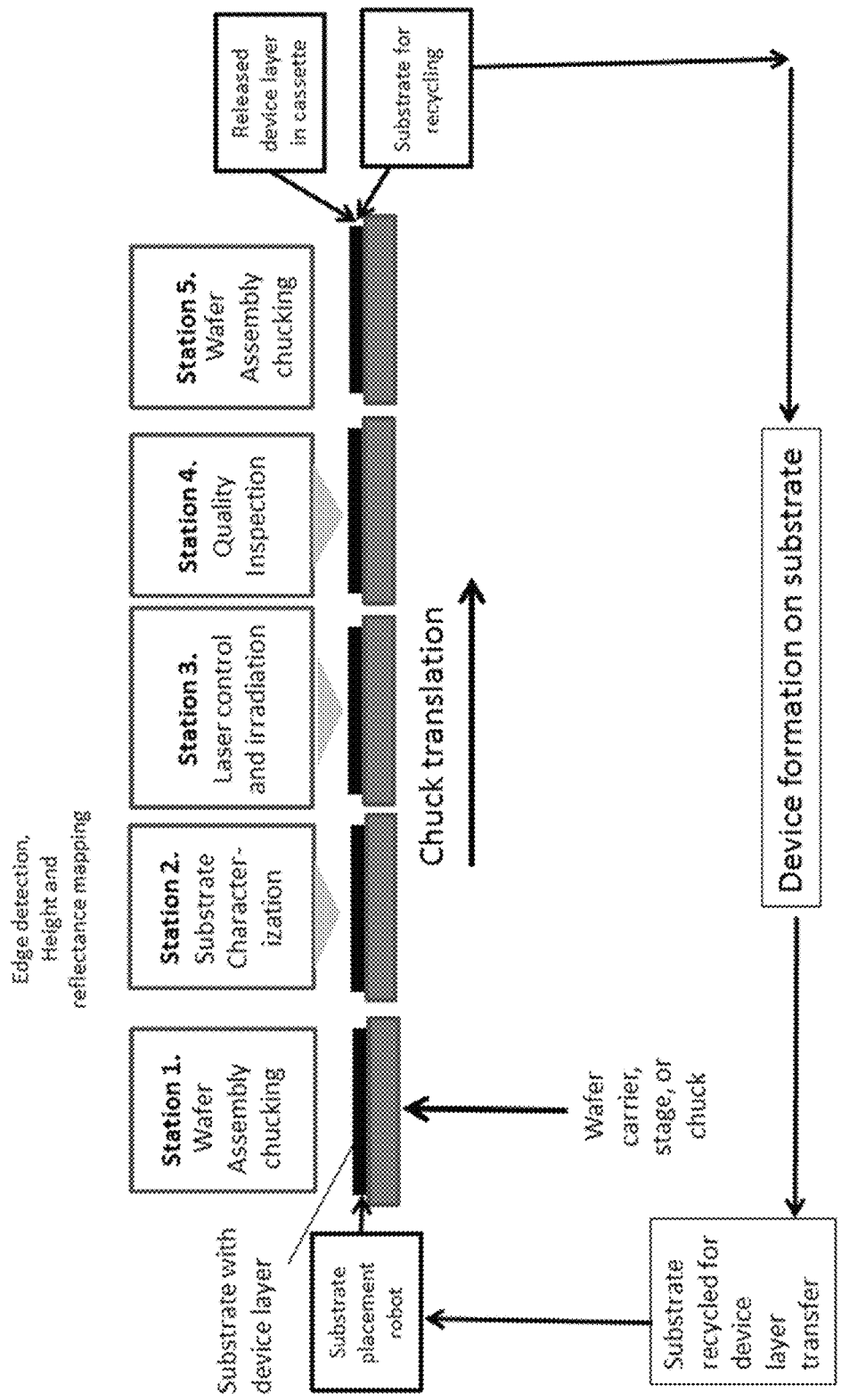
FIG. 24 is a diagram showing a side view of a real time laser processing feedback loop in a high throughput wafer processing tool.

FIG. 23 is a diagram showing a side view of a real time laser processing feedback loop in a high throughput wafer processing tool as a substrate moves from area 1 where the wafer surface is mapped to area 2 where laser splitting occurs for the formation of a uniform cleavage plane across large splitting areas. As indicated, the wafer edge is detected and fed to the scanner control to properly place and start the laser beam on the substrate surface. Additionally, the height and, if required, the reflectivity information is also fed forward for use during laser radiation. FIG. 24 is a diagram showing a side view of a real time laser processing feedback loop in a high throughput wafer processing tool as a substrate moves through various stations including laser processing stations 2, 3, and 4. Various measurements may be made on the incoming wafer in a separate station (station 2) before laser irradiation (station 3). These measurements may be made while the previous wafer is undergoing laser scan to minimize the effect on the throughput of the laser characterization apparatus. Additionally, a quality check after laser scan may be made in a subsequent station (station 4) without affecting tool throughput. For high dimensional control, the wafer may be vacuum chucked on a flat stage or a chuck that has precise translation in the x direction.

Figure 25:
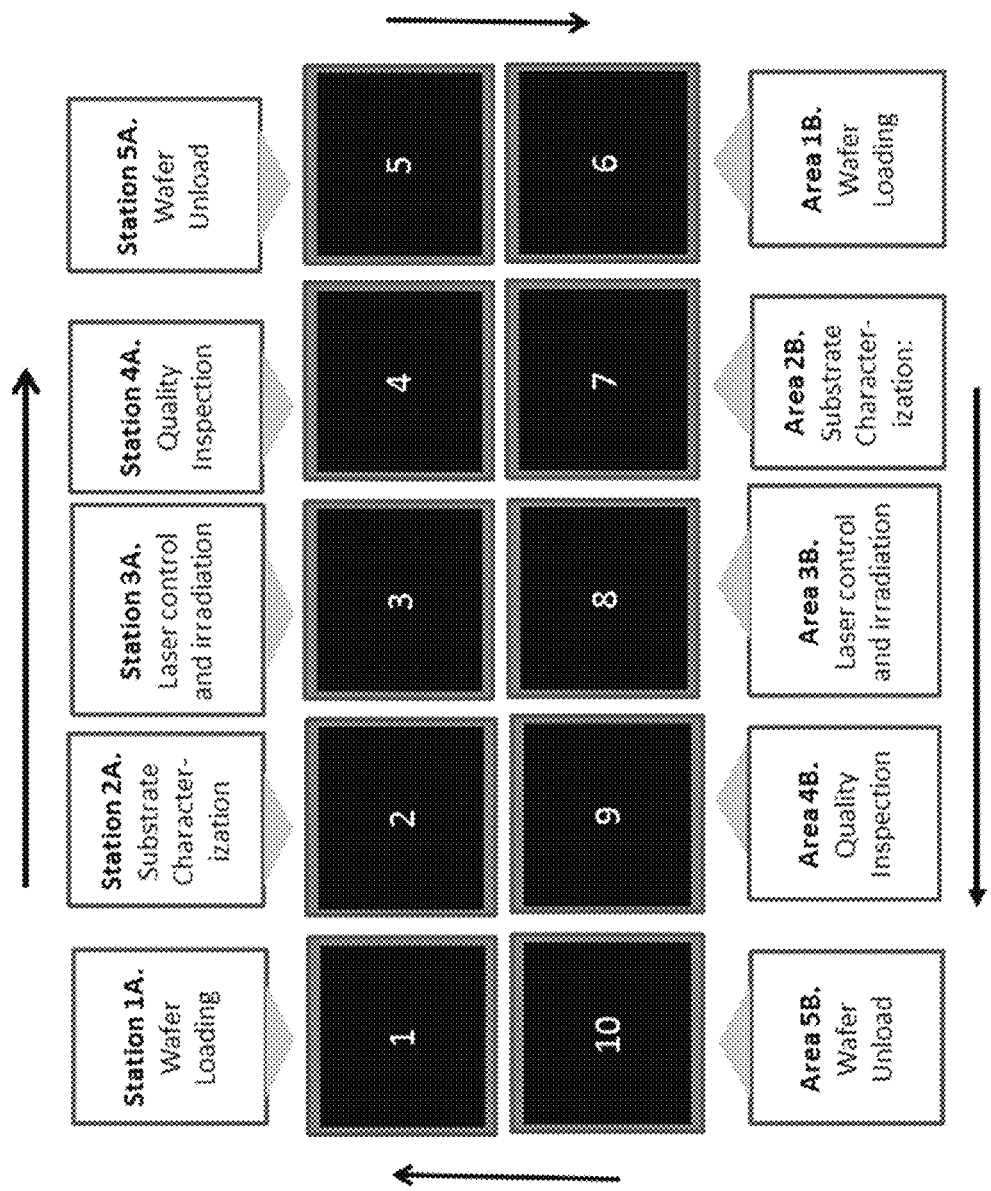
FIGS. 25, 26, and 27 are diagrams showing a top view of wafer processing flow through a high throughput tool.
Figure 26:
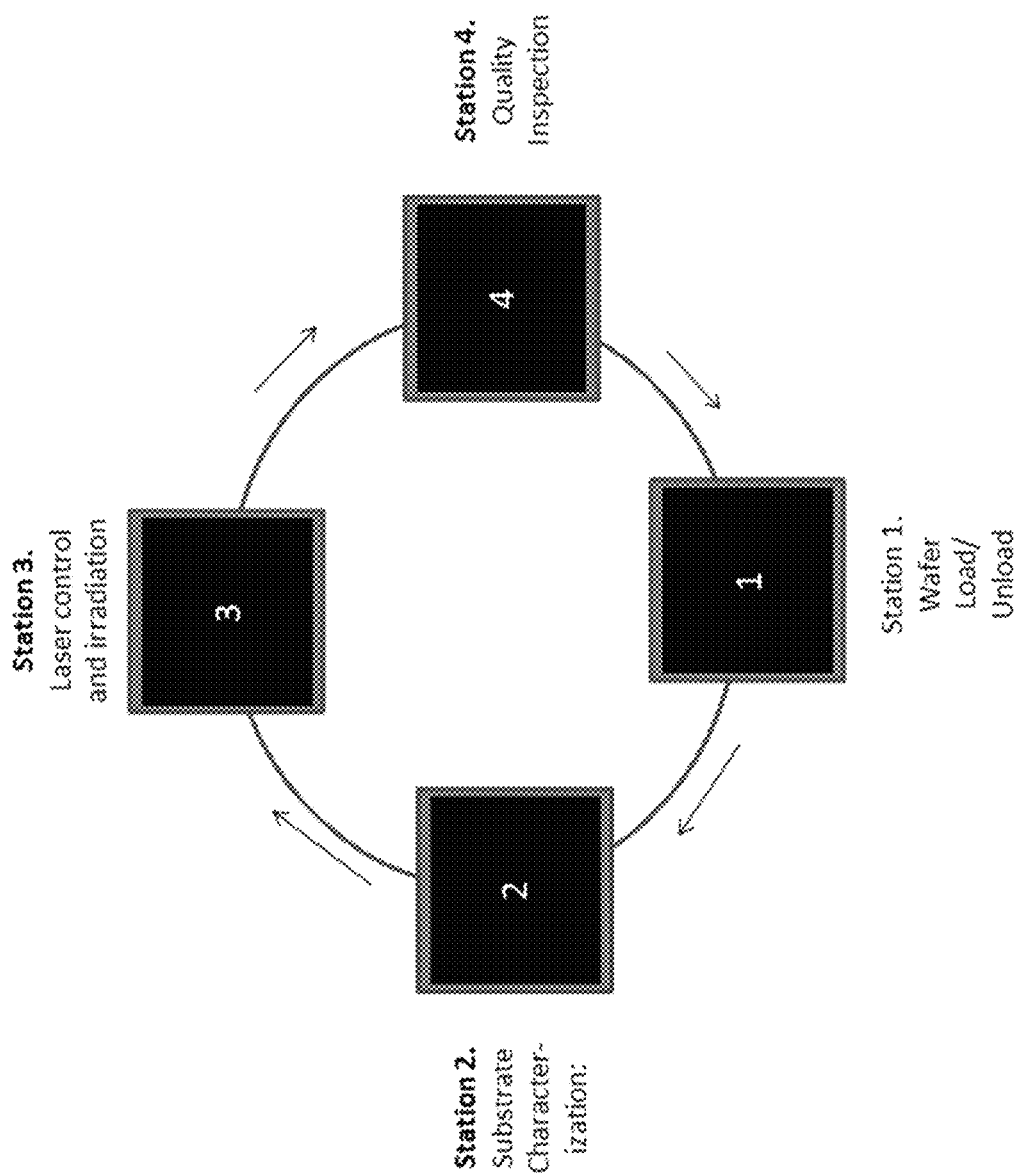

FIG. 25 is a diagram showing a top view of wafer processing flow through a high throughput tool showing the movement of wafer carriers, stages, or chucks. As much as twice as many wafers may be processed as the chucks move through steps 1 to 10, with wafer load and unload as shown. The proximity of laser scan stations facilitates the laser and optical set up. The alternative tool configuration shown in the top view of FIG. 26 also allows for continuous wafer processing. FIGS. 25 and 26 highlight the concept of wafer movement so that pre-measurements may be made without affecting the splitting throughput by using multiple stations for simultaneous wafer processing with no delay for other processing steps such as wafer load and unload and pre-measurements and quality check.

Figure 27:
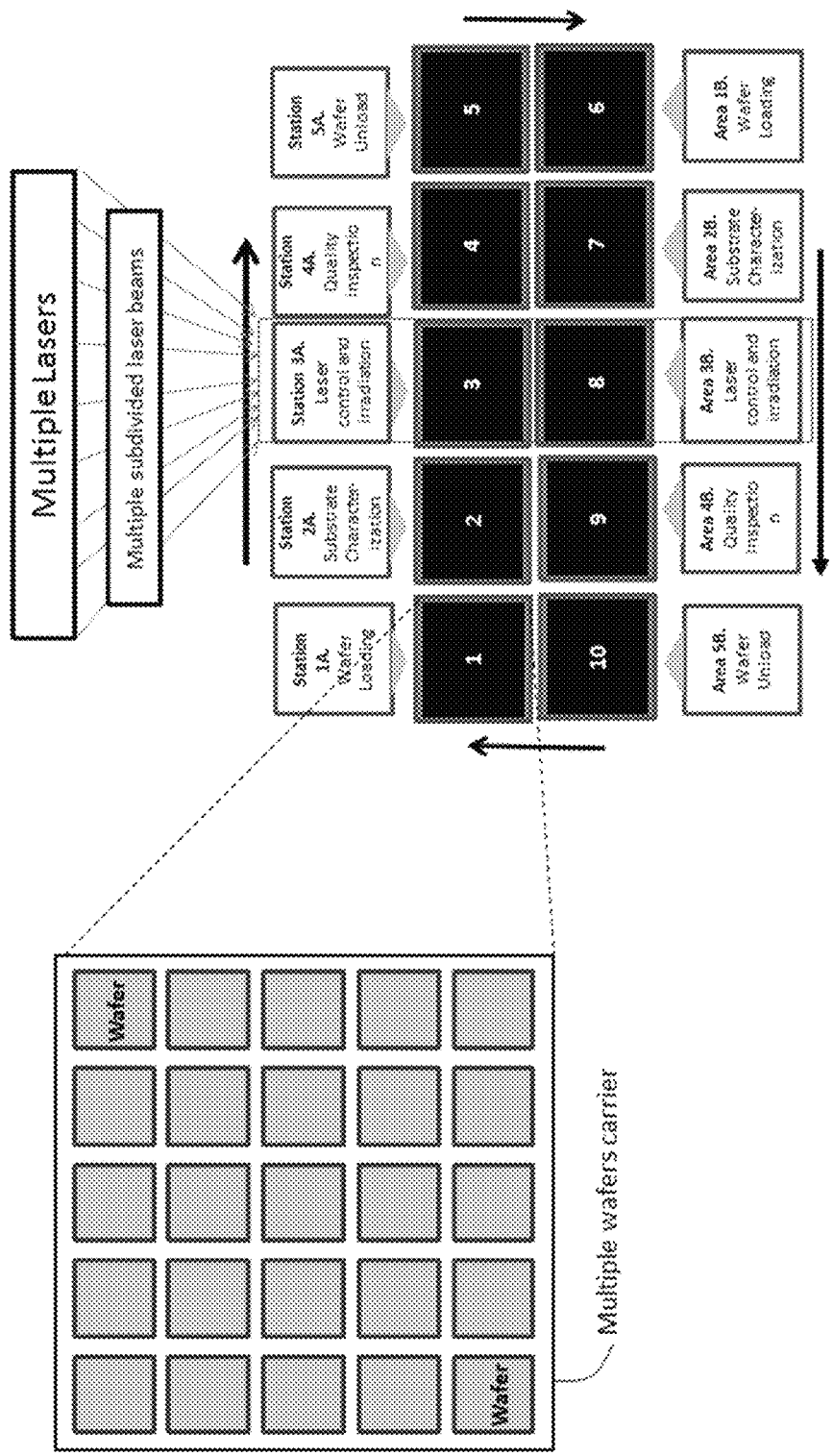

It should be noted that each of the wafer carrier, stage, or chucks shown in the previous Figures may carry multiple wafers that are processed using multiple beams generated by several lasers for batch processing, as shown in FIG. 27. The number of wafers in the carrier, the number of lasers, and the subdivision of primary beams into secondary laser beams may be configured to obtain an optimal throughput and lowest cost per wafer. Further increasing the period for microcracks as shown in FIG. 18 and described herein, may also significantly increase throughput.

The disclosed subject matter provides laser splitting methods applicable to various device layers for use in optical devices, integrated circuits, imagers, and SOI wafers.

GaN LEDS. Blue and other light emitting diodes have been fabricated commonly over GaN and related compound semiconductor active layers that are epitaxially grown over sapphire substrates. A sapphire wafer may comprise a single crystalline insulating material of ceramic, for example Al2O3, and is considered a difficult material for which to modify shape mechanically. In the LED industry, approximately 1 millimeter thick and 2 to 6 inch diameter sapphire wafers are commonly used as the starting substrates on whic GaN is grown at high temperature with MOCVD (Metal Organic Chemical Vapor Deposition). In such cases, a relatively thick substrate may be required to suppress wafer warpage after epitaxial and blanket deposition. PN junctions in the active layer and corresponding contacts may be formed by depositing Ni, Au, Ti and Al after mesa-etching the active (Al, In) GaN junction layers. After the device processing, the thick sapphire substrate may be mechanically thinned down for packaging and often resulting in costly wafer waste.

Figure 28A:
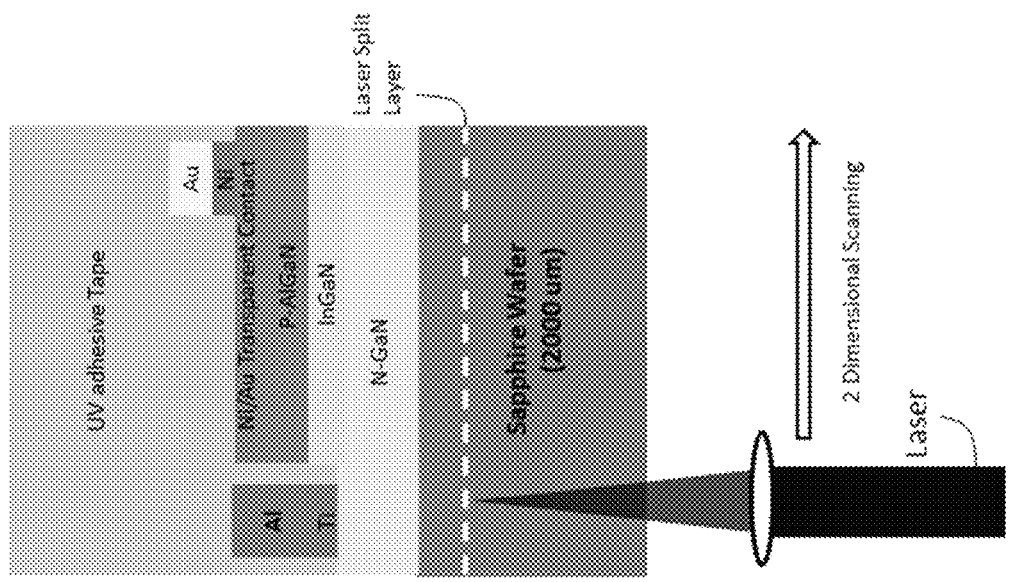

FIGS. 28A through 28C are cross-sectional diagrams depicting the formation of a GaN/Sapphire LED device layer. As shown in FIG. 28A, the starting sapphire wafer (for example 2 millimeter thick) may be used to conventionally grow epitaxial layers of GaN buffer/protection layer, InGaN, and AlGaN. Wafer-warpage may be suppressed by the thick substrate with high mechanical strength. Electrode-metals are deposited after mesa-etching the active layers, as shown in FIG. 28A. The entire device wafer may then be covered by UV adhesive tape and the permeable laser is irradiated from the backside of the wafer, for example focusing at the 250-300 um beneath the device layers. The wave length and other irradiation conditions may be similar to the embodiments described for Si and the period may be aproximately 10 micrometer between the laser spots. The micro-cracks connect with each other to form a laser splitting layer. Because sapphire material is transparent to the visible lights, wave lengths shorter than 1060 nm may also be used. After separating the LED chips (for example with a thickness of 250 micro-meters) from the thin sapphire sheet, the dicing line may also be scribed by the same permeable laser along the street lines from either the wafer frontside or backside. In some instances, laser dicing may be considered superior to abrasion-type laser dicing and conventional diamond mechanical blade dicing as abrasion and mechanical dicing often scatter debris over the LED chips that hinders light extraction because of shadowing. The LED chips may then be mounted on a package to form a final product, as shown in FIG. 28C. The remaining thick sapphire wafer, shown in FIG. 28B, may be reclaimed by surface polishing and reused for the additional epitaxial growth until the wafer thickness reaches conventional thickness of the wafer (for example 1 millimeter).

Si SiPs. System in Package, SiP, is the large scale integration for a system by integrating the individual Si IC chips by bonding, stacking, and interconnecting with metal wires. The system is typically composed of logic chips and memory chips. Each chip may be fabricated using modern Si planar technology on a relatively thick (for example 760 um) Si wafers which are then thinned down by grinding from the backside of the wafer, in some instances after completing in front processing. Back-grinding processing then thins the processed wafer down to several tens of micrometers which may be diced into chips. CMOS (Complementary Metal Oxide Semiconductor) ICs are built at the surface Si area and the rest of the Si wafer is supports the device layer in processing. Often, the kerf-loss of Si from crystal growth to ingot to the end of the packaged device is substantially large—and a large amount of Si material is wasted by mechanical sawing.

Figure 29B:
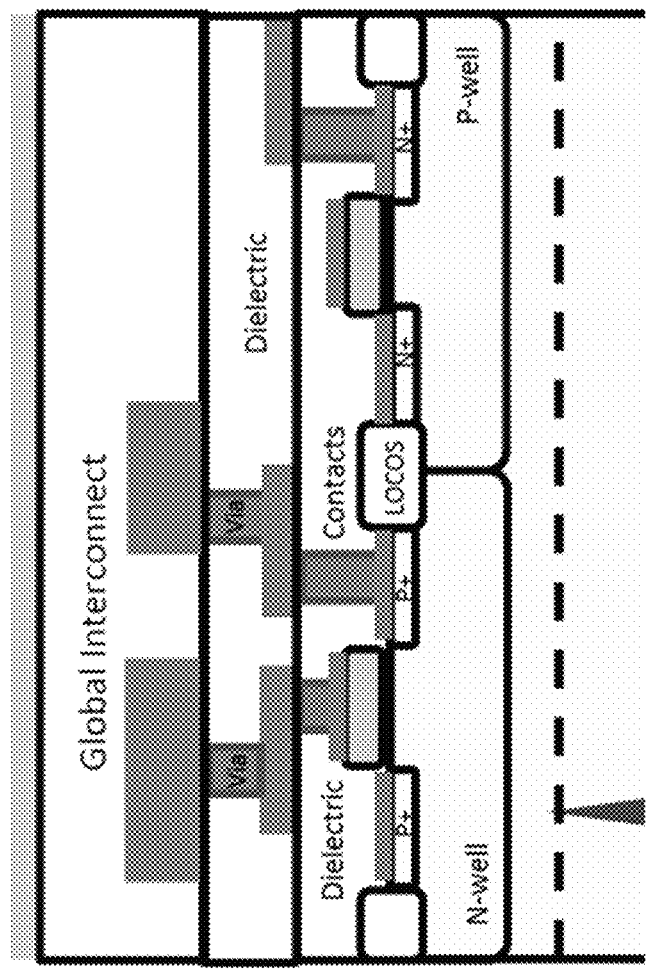
FIGS. 29A through 29D are cross-sectional diagrams depicting the formation of a thin Si IC stacked chip.
Figure 29A:
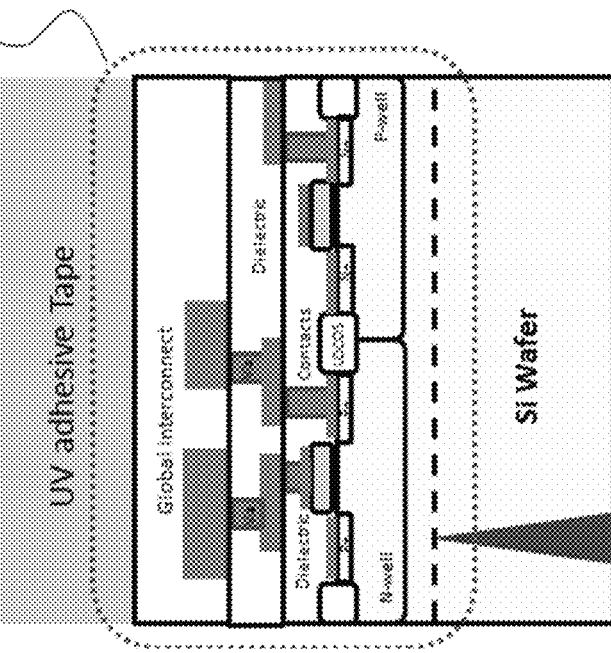
Figure 29D:
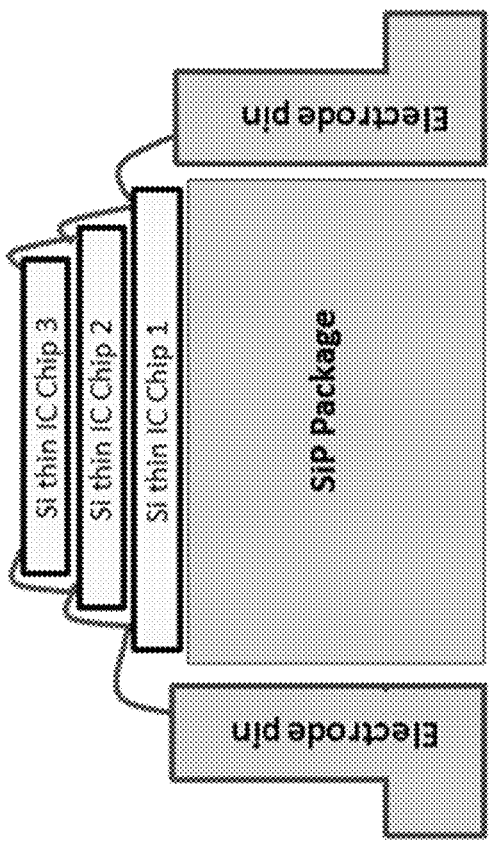
Figure 29C:
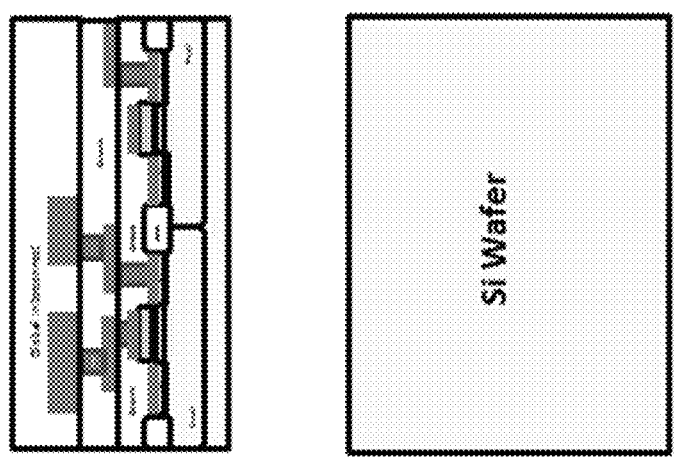

Laser splitting may be used in the formation of Si IC chips by replacing the wet back-grinding process with dry and simpler optical processing which substantially reduces Si waste. FIGS. 29A through 29D are cross-sectional diagrams depicting the formation of a thin Si IC stacked chip (such as a 3D IC or SIP) using laser splitting. As shown in FIG. 29A and the expanded view depicted in FIG. 29B, the CMOS circuit are fabricated over Si wafer using conventional IC processing, N and P wells formation, LOCOS isolation, MOS transistor formation, and multi-layered interconnection. After taping the front device layer, laser splitting is performed from the wafer backside by scanning across and over the wafer in bi-directionally. The irradiation and scanning conditions may be similar to those previously described, for example using an infra-red long wave laser. The IC device layers supported by UV adhesive tape (the tape acting as a handler substrate) are split from the starting Si wafers and are scribed into chip size, for example by dicing machines with diamond blade or with a laser. FIG. 29C shows Si Wafer and IC device layers separated along the laser splitting layer. The thin chips may then be mounted on an SIP package and wire bonded with the electrode pin in the package, as shown in FIG. 29D. Multiple thin IC chips may be fabricated from reused or virgin wafers to be stacked on the chip in package and interconnected with wire-bonding or TSV (Through Si Via) process. The split Si wafer may be reclaimed by polishing or hydrogen annealing and be reused for fabricating additional devices, or used as a monitoring wafer or feedstock for PV Si crystalline wafers. This method for CMOS IC thinning by back side laser splitting may be applicable for thinning down any type of Si device, for example to decrease the height of the package. The back-lapping and grinding process may be replaced with this dry and simple processing.

Si CMOS Sensors. Si CMOS sensors currently dominate the imaging market after CCDs. The most advanced CMOS sensor utilizes back-illumination which is dramatically increase the aperture ratio, in comparison with front side illumination, through the multiple metal interconnecting layers resulting in as much as doubling the sensors sensitivity to light in the dark. This type of Si imager is often fabricated by bonding the front side of the sensor with Si handle wafer after processing CMOS pixel and photo diode. The host Si wafers are etched back by grinding and chemical etching with etch-stops.

Figure 30B:
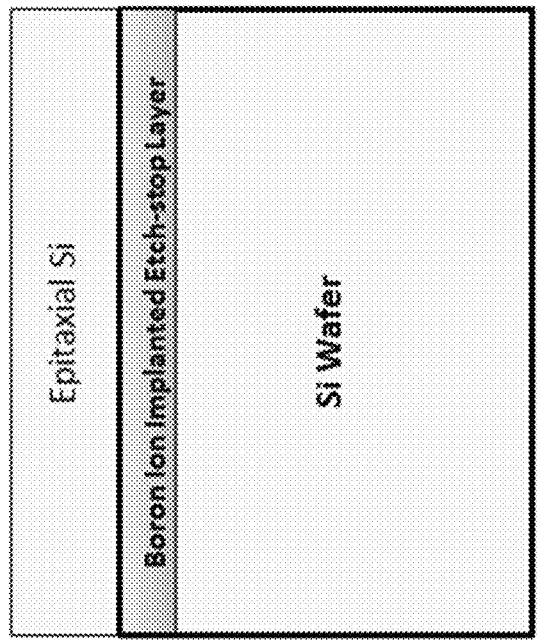
Figure 30A:
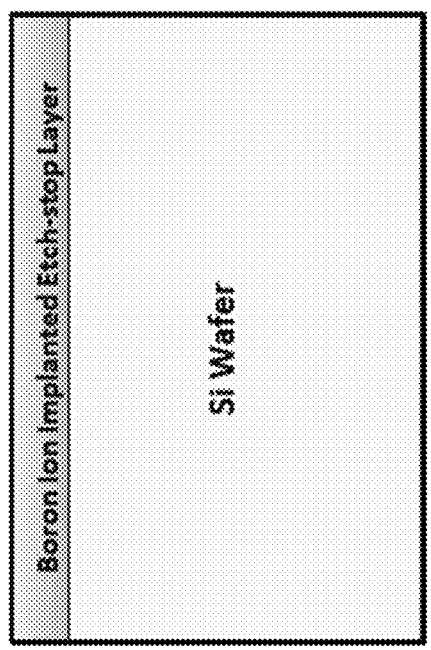

FIGS. 30A through 30E are cross-sectional diagrams depicting the formation of a back illuminated CMOS sensor using laser splitting. Si P– wafer is the starting host wafer gradient implanted with boron ions to form a P+ layer, as shown in FIG. 30A, and on which an epitaxial Si active layer is grown, as shown in FIG. 30B. The P+ layer acts as an etch-stop after bonding with the carrier wafer. CMOS pixel and photo diodes are processed in the epitaxial Si layer, as shown in FIG. 30C. Instead of back-grinding, laser splittin is applied from the back side of the host wafer after bonding the CMOS imagers with Si carrier wafer, as shown in FIG. 30D. The laser is focused below the boron implanted P+ layer in Si. After splitting the wafer, thinning down may be performed using a TMAH solution to the etch-stop of P+ layer. After AR film is coated on top of the imager, color filters are positioned to align on the pixel, and micro lenses are equipped on the optical filters to form a CMOS back illuminated snesor, as shown in FIG. 30E. The split Si host wafers may be reused for the other substrates formation (for example by epitaxial growth) after tuning/conditioning the surface, for example by hydrogen annealing which may provide atomically flat Si surface over the entire wafers in a batch furnace without any reduction of the wafer thickness.

SOI Wafers. SOI (GOI) stands for Silicon (Germanium) on Insulator wafers. SOI wafers have two categories: namely Thick SOI and Thin SOI. Thick SOI wafers have relatively thick Si layer in the micro-meter range and used mainly MEMS (Micro-Electro-Mechanical Systems) devices and High voltage ICs. Thin SOI wafers have thin Si layer in sub-micro-meter range and are used for CMOS ICs with fully depleted and partially depleted channels operated at high-speed with low energy consumption (advantages are also utilized for radiation hardness in space).

Conventional fabrication methods for Thick SOI wafers often include grinding and polishing back a bonded pair sandwiched with a thermal oxide BOX (Buried Oxide) layer, as shown in FIG. 31A1. Thin SOI wafers have been formed by the micro-pore formation under Si—SOI layer often by hydrogen ion implantation and anodizing Si (porous Si). Laser splitting provides a simpler cost effective means (zero gas, chemical, or vacuum use required) and provides for wafer reuse.

FIGS. 31A1 through 31A3 are cross-sectional diagrams depicting the formation of a thick SOI wafer using laser splitting. FIGS. 31B1 through 31B3 are cross-sectional diagrams depicting the formation of a thin SOI wafer using laser splitting. Both process flows allow for the formation of thick and thin SOI/GOI wafers. The host Si wafers are thermally oxidized and bonded with bare Si handle wafers after careful cleaning of both attachment surfaces for thick SOI application, as shown in FIG. 31A1. For Thin SOI, the host wafers are boron ion implanted to form an etching-stop layer on which Si SOI layers are grown epitaxially, as shown in FIG. 31B1. After oxidizing the surface of epitaxial Si SOI layer, the host wafers are bonded with the handle wafers. Both bonded pairs are annealed in high temperature to fasten the bonding interface between the BOX and Si handlers. Laser splitting is applied both for bonded pairs, as shown in FIGS. 31A21 and 31B2. Focal points are set at 10-20 micrometer deep beneath BOX layers for Thick SOI and 1-5 micrometer deep below the epitaxial Thin SOI layers. After separating the wafers, both SOI layer and host wafer surfaces may be annealed in H2 for surface smoothing and reconditioning resulting in thick SOI wafers and reusable Si host wafers, as shown in FIG. 31A3.

For Thin SOI wafers, after etching off the residual Si split from the host wafer with the etch-stop P+ implanted layer, SOI wafers may be annealed in H2 to decrease boron content in epitaxial SOI layer as well as smooth and recondition the wafer surface. The split host wafers may also be annealed in batch in an H2 furnace and reused multiple times. The epitaxial SOI layer may have a sub-micron thick, for example 10 nm-1 um, and is free from COP defects (Crystal Originated Particles.) For thin GOI wafer formation, Ge single crystal wafer is replaced with Si wafers as a host wafer and epitaxial Ge is replaced with epitaxial Si layers, as shown in FIG. 31B3. Thermal oxidation on Ge is often not stable, thus CVD silicon oxide layer is replaced for GOI formation while an Si handle wafer may also be used for GOI formation.

In operation, the disclosed laser splitting technique is used to manufacture an all back contact, back junction solar with a thin silicon absorber layer. P and N junctions may be formed and passivated and connected with a thin layer of metal (metal 1). The laser splitting technique may be used to separate a thin layer of silicon containing these components and transfer to a handling substrate such as a prepreg. This may be followed by drilling vias in the prepreg and the deposition of another layer of metal (metal 2) and patterning to complete the solar cell. Device layers may be used in the manufacture of other devices such as light emitting diodes made from a host of substrates such as GaN, GaAlN, InGaN, GaAs, InP, GaAlAs, etc., or CMOS imagers, or CMOS circuits, or power devices, or silicon on insulator (SOI), or germanium on insulator (GOI) devices.

Various laser system configurations for multiple wafer processing using multiple laser beams sub divided from primary beams from several laser are presented. The laser system have stations that carry multiple wafers. The laser systems may also facilitate real time measurement of wafer surface height, roughness, and reflectivity measurement for control of the scanner and the laser power to obtain high quality layer separation.

It is to be noted that it is not necessary that the defects created by the laser beam at focus overlap as methods that allow placement of these defects at large distances and subsequent connection are also presented. These schemes include increasing the crack size by moving the wafer under a cold spray, for example, from the liquid nitrogen container; by applying mechanical vibrational forces; inserting wedges, and shear stress for the bonded substrates; by applying thermal annealing, water jet, chemical jet, and gas jet in conjunction with laser beam.

It will be apparent to those skilled in the art that various modifications and variations may be made in the above disclosure and aspects of the disclosure without departing from the scope or intent of the disclosure. Other embodiments of the disclosure will be apparent to those skilled in the art from consideration of the specification and practice of the disclosure disclosed herein. It is intended that the specification and examples be considered as exemplary only. Accordingly, the scope of the present disclosure should be limited only by the attached claims.

What is claimed is:

1. A method to split and separate a layer of desired thickness of crystalline semiconductor material containing optical, photovoltaic, electronic, microelectro-mechanical system (MEMS), or optoelectronic devices, from a thicker donor wafer, comprising:
    using laser irradiation on a side opposite to one containing the devices, the laser irradiation using a focused laser beam scanned across the donor wafer and forming a two-dimensional separation layer of micro-crack spots; and
    using a fluid spray to facilitate releasing the crystalline semiconductor material along the separation layer.
2. The method of claim 1, wherein the fluid spray comprises a liquid nitrogen spray.

3. The method of claim 1, wherein the fluid spray comprises a dry ice spray.

4. The method of claim 1, wherein the fluid spray comprises a hot air spray.

5. The method of claim 1, wherein the fluid spray is applied to an edge of the crystalline semiconductor material and generally aligned with the separation layer.

6. The method of claim 1, wherein the fluid spray is applied on the side opposite to the one containing the devices.

7. The method of claim 1, wherein the crystalline semiconductor material is silicon.

8. The method of claim 7, wherein the crystalline silicon is monocrystalline silicon.

9. The method of claim 8, wherein the two-dimensional separation layer of micro-crack spots is formed in a crystallographic plane of the monocrystalline silicon.

10. The method of claim 1, further comprising the step of forming a splitting layer having a higher laser irradiation absorption selectivity as compared to a crystalline semiconductor material in the donor wafer, the splitting layer formed under the devices.

11. The method of claim 10, wherein the splitting layer has a higher doping as compared to the crystalline semiconductor material.

12. The method of claim 1, further comprising a step of attaching a support handler to a device side of the donor wafer prior to the release of said crystalline semiconductor material.

13. The method of claim 1, further comprising a step of attaching a support handler to the donor wafer on a side opposite the devices prior to the release of said crystalline semiconductor material.

14. The method of claim 13, further comprising a step of vibrating the support handler.

15. The method of claim 1, wherein the devices are photovoltaic devices.

* * * * *